(12) United States Patent
Kutz et al.

(10) Patent No.: US 9,143,134 B1
(45) Date of Patent: Sep. 22, 2015

(54) COMBINED ANALOG ARCHITECTURE AND FUNCTIONALITY IN A MIXED-SIGNAL ARRAY

(71) Applicant: Cypress Semiconductor Corporation, San Jose, CA (US)

(72) Inventors: Harold M. Kutz, Edmonds, WA (US); Timothy J. Williams, Bellevue, WA (US); Bert S. Sullam, Bellevue, WA (US); Warren S. Snyder, Snohomish, WA (US); James H. Shutt, Seattle, WA (US); Bruce E. Byrkett, Preston, WA (US); Monte Mar, Issaquah, WA (US); Eashwar Thiagarajan, Bothell, WA (US); Nathan Kohagen, Redmond, WA (US); David G. Wright, Woodinville, CA (US); Mark E. Hastings, Mukilteo, WA (US); Dennis Raymond Seguine, Temecula, CA (US)

(73) Assignee: CYPRESS SEMICONDUCTOR CORPORATION, San Jose, CA (US)

( * ) Notice: Subject to any disclaimer, the term of this patent is extended or adjusted under 35 U.S.C. 154(b) by 0 days.

(21) Appl. No.: 13/916,386

(22) Filed: Jun. 12, 2013

Related U.S. Application Data

(63) Continuation of application No. 12/774,680, filed on May 5, 2010, now Pat. No. 8,487,655.

(60) Provisional application No. 61/175,586, filed on May 5, 2009.

(51) Int. Cl.
*H03K 19/0175* (2006.01)
*H03K 19/094* (2006.01)
*H03K 19/173* (2006.01)

(52) U.S. Cl.
CPC .................................. *H03K 19/173* (2013.01)

(58) Field of Classification Search
None
See application file for complete search history.

(56) References Cited

U.S. PATENT DOCUMENTS

| | | | |
|---|---|---|---|
| 4,543,707 A | 10/1985 | Ito et al. | |
| 5,598,408 A | 1/1997 | Nickolls et al. | |
| 5,604,450 A | 2/1997 | Borkar et al. | |
| 5,877,633 A | 3/1999 | Ng et al. | |
| 5,966,047 A | 10/1999 | Anderson et al. | |
| 6,072,334 A | 6/2000 | Chang | |
| 6,157,426 A | 12/2000 | Gu | |
| 6,424,175 B1 | 7/2002 | Vangal et al. | |
| 6,445,030 B1 | 9/2002 | Wu et al. | |
| 6,460,172 B1 | 10/2002 | Insenser Farre et al. | |
| 6,461,899 B1 | 10/2002 | Kitakado et al. | |
| 6,477,606 B1 * | 11/2002 | Kawamura et al. | 710/305 |
| 6,583,652 B1 | 6/2003 | Klein et al. | |
| 6,709,928 B1 | 3/2004 | Jenne et al. | |
| 6,724,220 B1 | 4/2004 | Snyder et al. | |
| 6,791,356 B2 | 9/2004 | Haycock et al. | |
| 6,818,558 B1 | 11/2004 | Rathor et al. | |
| 6,862,642 B1 * | 3/2005 | Packer et al. | 710/300 |

(Continued)

OTHER PUBLICATIONS

U.S. Appl. No. 12/773,801 "Debug Through Power Down," Amsby Richardson Jr. et al., filed May 4, 2010; 120 pages.

(Continued)

*Primary Examiner* — Crystal L Hammond

(57) ABSTRACT

A system and apparatus are described for providing greater flexibility and performance in a mixed-signal array through improved and highly configurable routing, control elements and signal processing capabilities.

20 Claims, 36 Drawing Sheets

(56) References Cited

U.S. PATENT DOCUMENTS

| | | |
|---|---|---|
| 6,895,530 B2 | 5/2005 | Moyer et al. |
| 6,958,511 B1 | 10/2005 | Halliyal et al. |
| 6,971,004 B1 | 11/2005 | Pleis et al. |
| 6,972,597 B2 | 12/2005 | Kim |
| 6,996,796 B2 | 2/2006 | Sanchez et al. |
| 7,133,945 B2 | 11/2006 | Lau |
| 7,266,632 B2 | 9/2007 | Dao et al. |
| 7,287,112 B1 | 10/2007 | Pleis et al. |
| 7,299,307 B1 | 11/2007 | Early et al. |
| 7,308,608 B1 | 12/2007 | Pleis et al. |
| 7,340,693 B2 | 3/2008 | Martin et al. |
| 7,360,005 B2 | 4/2008 | Lin |
| 7,417,459 B2 * | 8/2008 | Wilson et al. .............. 326/82 |
| 7,450,423 B2 | 11/2008 | Lai et al. |
| 7,552,415 B2 | 6/2009 | Sanchez et al. |
| 7,603,578 B2 | 10/2009 | Balasubramanian et al. |
| 7,609,178 B2 | 10/2009 | Son et al. |
| 7,613,943 B2 | 11/2009 | Bakker et al. |
| 7,737,724 B2 * | 6/2010 | Snyder et al. .............. 326/41 |
| 8,026,739 B2 | 9/2011 | Sullam et al. |
| 8,179,161 B1 | 5/2012 | Williams et al. |
| 2002/0154878 A1 | 10/2002 | Akwani et al. |
| 2003/0067919 A1 | 4/2003 | Qiao et al. |
| 2003/0123307 A1 | 7/2003 | Lee et al. |
| 2004/0113655 A1 * | 6/2004 | Curd et al. ................. 326/40 |
| 2005/0066077 A1 * | 3/2005 | Shibata et al. .............. 710/33 |
| 2006/0066351 A1 | 3/2006 | Lau |
| 2006/0261401 A1 | 11/2006 | Bhattacharyya |
| 2007/0214389 A1 | 9/2007 | Severson et al. |
| 2008/0258203 A1 | 10/2008 | Happ et al. |
| 2008/0258760 A1 | 10/2008 | Sullam et al. |

OTHER PUBLICATIONS

U.S. Appl. No. 12/774,680 "Combined Analog Architecture and Functionality in a Mixed-Signal Array," Kutz et al., filed May 5, 2010; 121 pages.

U.S. Appl. No. 13/427,264 "Programmable Input/Output Circuit," Timothy J. Williams, filed Mar. 22, 2012; 40 pages.

U.S. Appl. No. 61/175,364 "Debug Through Power Down," Amsby Richardson Jr et al., filed May 4, 2009; 10 pages.

U.S. Appl. No. 61/175,589 "Programmable Analog/Mixed Signal Architecture on a Chip, with Multiple (Programmable) Sources of Control and Multiple Means of Analog and Digital Routing, to Support Various Signal Processing Application Requirements," Harold Kutz et al., filed May 5, 2009; 4 pages.

U.S. Appl. No. 61/175,856 "Configurable Reset Polarity Method", filed May 6, 2009; 10 pages.

Application No. PCT/US10/34152 "Dynamically Reconfigurable Analog Routing Circuits and Methods for System on a Chip," filed May 8, 2010; 37 pages.

David C. Walter, "Verification of Analog and Mixed-Signal Circuits using Symbolic Methods," A Dissertation Submitted to the Faculty of The University of Utah, Aug. 2007; 134 pages.

Kundert et al., "Design of Mixed-Signal Systems on Chip," IEEE Transactions on CAD, vol. 19, No. 12, Dec. 2000, pp. 1561-1572; 12 pages.

USPTO Final Rejection for U.S. Appl No. 12/753,657 dated Sep. 22, 2011; 9 pages.

USPTO Final Rejection for U.S. Appl. No. 12/773,801 dated Jan. 23, 2013; 12 pages.

USPTO Final Rejection for U.S. Appl. No. 12/774,680 dated Aug. 3, 2011; 11 pages.

USPTO Non-Final Rejection for U.S. Appl. No. 12/753,657 dated Mar. 18, 2011; 7 pages.

USPTO Non-Final Rejection for U.S Appl. No. 12/773,801 dated Jun. 22, 2012; 11 pages.

USPTO Non-Final Rejection for U.S. Appl No. 12/774,680 dated Feb. 18, 2011; 8 pages.

USPTO Non-Final Rejection for U.S. Appl. No. 12/774,680 dated Jul. 10, 2012; 11 pages.

USPTO Non-Final Rejection for U.S. Appl. No. 12/774,680 dated Dec. 22, 2011; 11 pages.

USPTO Notice of Allowance for U.S. Appl. No. 12/496,579 dated Nov. 8, 2012; 7 pages.

USPTO Notice of Allowance for U.S. Appl. No. 12/496,579 dated Dec. 28, 2012; 5 pages.

USPTO Notice of Allowance for U.S. Appl. No. 12/753,657 dated Mar. 30, 2012; 8 pages.

USPTO Notice of Allowance for U.S. Appl. No. 12/753,657 dated Nov. 23, 2011; 8 pages.

USPTO Notice of Allowance for U.S. Appl. No. 12/774,680 dated Jan. 31, 2013; 7 pages.

USPTO Notice of Allowance for U.S. Appl. No. 12/774,680 dated May 28, 2013; 8 pages.

USPTO Notice of Allowance for U.S. Appl. No. 12/774,680 dated Oct. 22, 2012; 7 pages.

USPTO Notice of Allowance for U.S. Appl. No. 12/774,680 dated Dec. 21, 2012; 7 pages.

USPTO Requirement for Restriction for U.S. Appl. No. 12/753,657 dated Feb. 2, 2011; 5 pages.

* cited by examiner

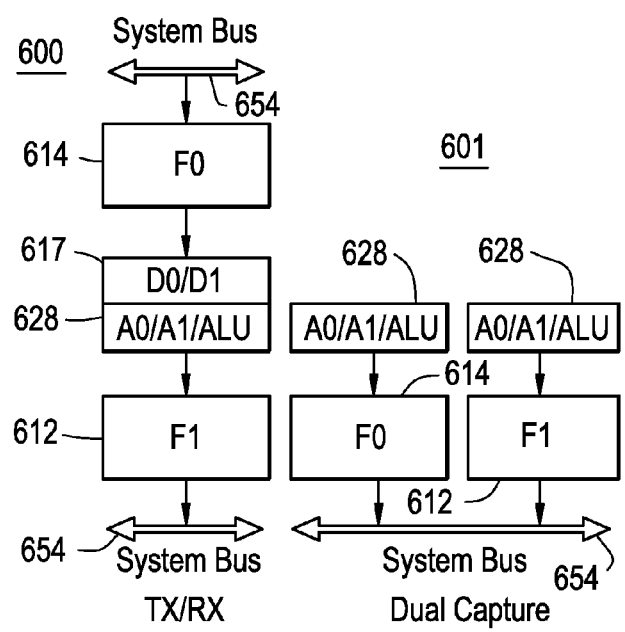
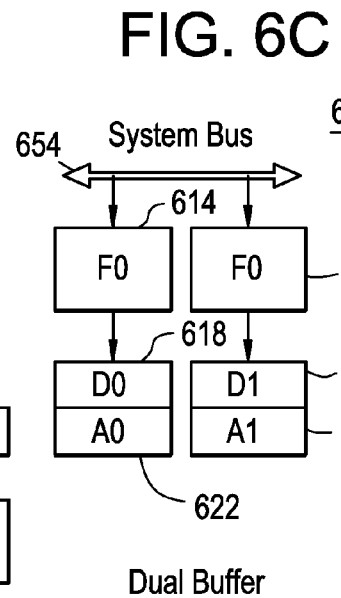
FIG. 6A, FIG. 6B, FIG. 6C
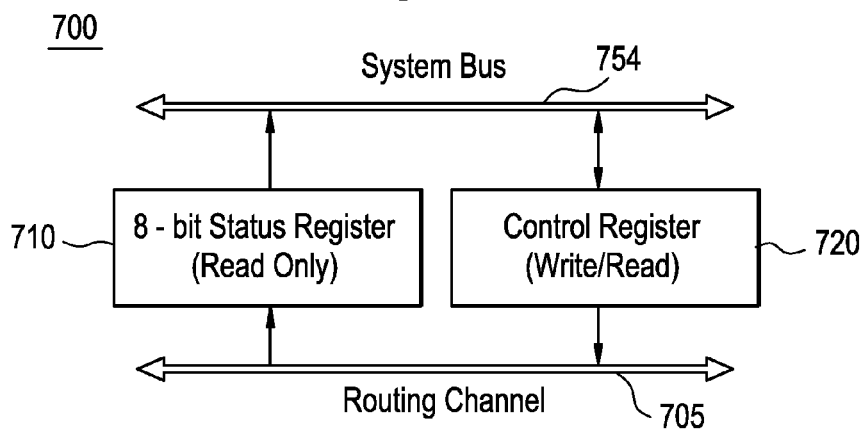
FIG. 7

Interrupt and DMA Processing in IDMUX

0. High Impedance Analog

1. High Impedance Digital

2. Resistive Pull Up

3. Resistive Pull down

4. Open Drain Drives Low

5. Open Drain Drives High

6. Strong Drive

7. Resistive Pull Up and Down

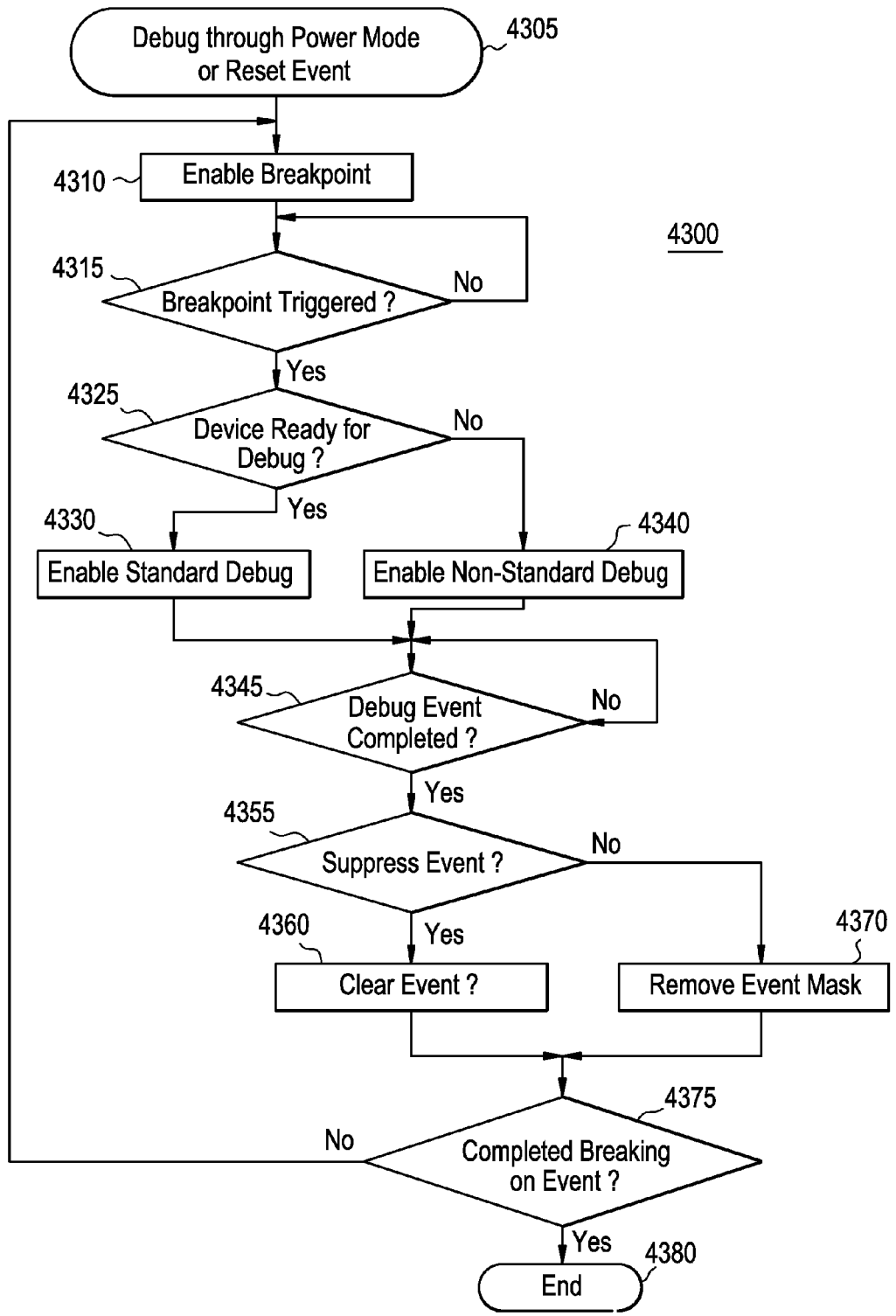

COMBINED ANALOG ARCHITECTURE AND FUNCTIONALITY IN A MIXED-SIGNAL ARRAY

RELATED APPLICATIONS

This application is a continuation of U.S. application Ser. No. 12/774,680 filed May 5, 2010, which claims the benefit of U.S. Provisional Patent Application No. 61/175,586 filed May 5, 2009.

TECHNICAL FIELD

The present disclosure relates generally to microcontrollers and particularly to microcontrollers as part of a mixed-signal array.

BACKGROUND

Microcontrollers may have embedded processors, memories and special function analog and digital circuits. Typical analog circuits found in prior art microcontrollers include Continuous Time (CT) amplifiers having preset functions with given functional parameters. For instance, a CT analog amplifier might be configured as a fixed function circuit, such as a voltage amplifier, in which certain parameters, such as gain or bandwidth might be altered by programming.

Switched Capacitor (SC) analog circuits are also frequently incorporated into microcontroller designs. SC analog circuits in prior art are somewhat more versatile than CT analog circuits in that it might be possible to alter both the circuit function as well as the parameters of the circuit function by programming. However, both CT and SC analog circuits found in current microcontrollers generally require programming before utilization, and neither can be dynamically programmed (programmed "on-the-fly"). In the conventional art, general purpose digital circuits are frequently included in a microcontroller implementation. Such digital circuits are pre-programmed to realize certain digital functions such as logical operations, arithmetical functions, counting, etc. These digital circuits are generally in the form of a Programmed Logic Array (PLA) or FPGA. Furthermore, such digital circuits that require pre-programming are generally not dynamically programmable (programmable "on-the-fly"). The main difficulty here is in the generality of such a digital circuit, which requires an excessive amount of digital logic, which in turn occupies a large area on a semiconductor chip as well as an increased cost of manufacturing.

Several other design considerations related to microcontroller utilization either go unaddressed, or require separate functionalities to enable them. For instance, existing designs do not offer a programmable analog circuit array with both CT analog circuits and SC analog circuits on the same semiconductor chip with a programmable array of digital circuits. As a result, realization of a function requiring complex communication between analog circuits and digital circuits often requires the use of multiple semiconductor chips. Further, existing microcontroller realizations generally require pre-programming and cannot be dynamically programmed.

BRIEF DESCRIPTION OF THE DRAWINGS

Embodiments are illustrated by way of example and are not intended to be limited by the figures of the accompanying drawings, in which like references indicate similar elements and in which:

FIG. 6A illustrates a FIFO configured for a transmit/receive (TXRX) function according to an embodiment;

FIG. 6B illustrates a FIFO configured dual capture function according to an embodiment;

FIG. 6C illustrates a FIFO configured for dual buffer function according to an embodiment;

FIG. 7 illustrates a UDB status and control module according to an embodiment;

FIG. 43 illustrates one embodiment of a method for debugging a device according to an embodiment.

DETAILED DESCRIPTION

Figure 1:
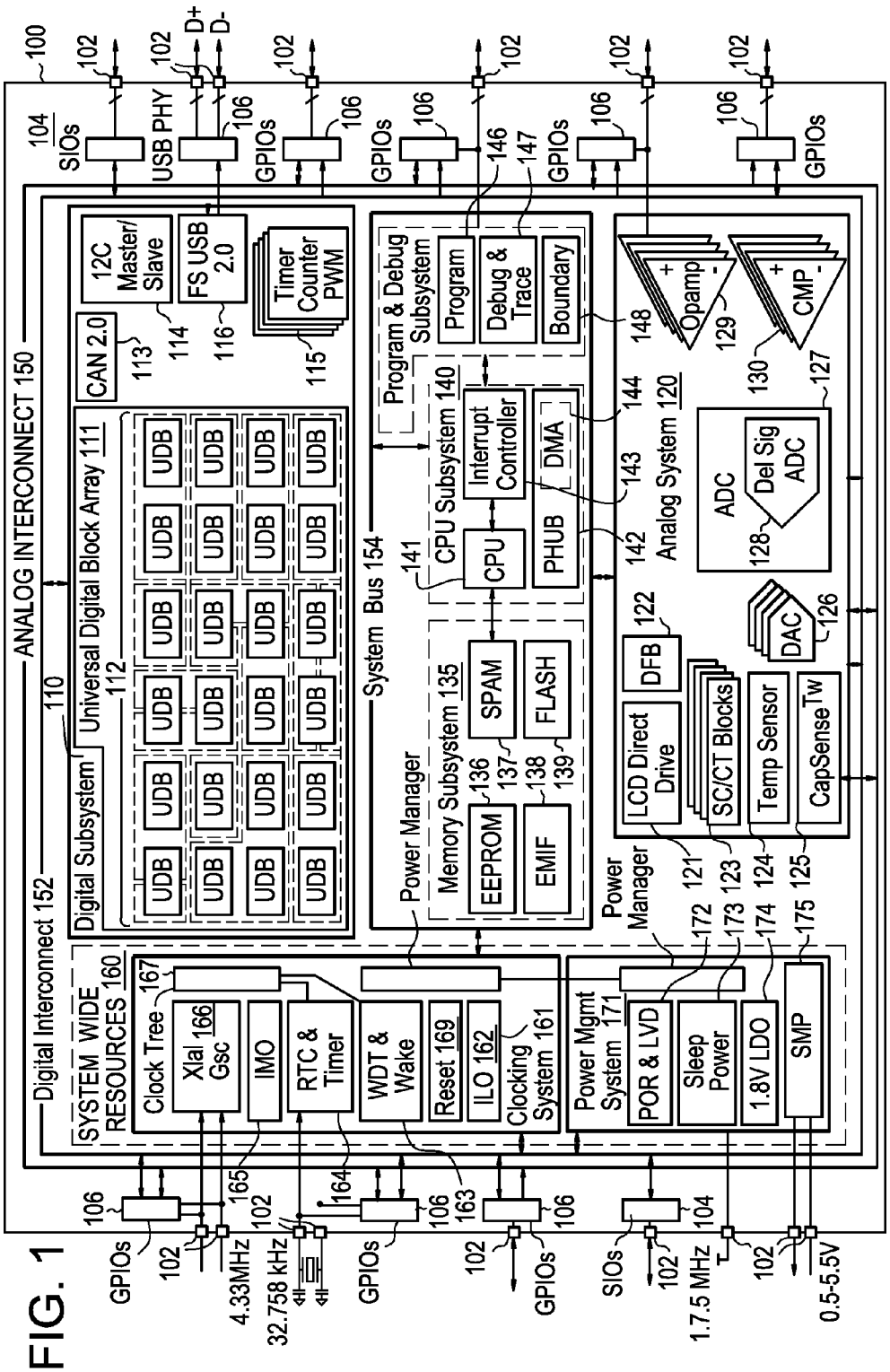
FIG. 1 illustrates a core architecture of a Programmable System-on-Chip (PSoC®) according to an embodiment.

FIG. 1 illustrates an embodiment of a core architecture 100 of a Programmable System-on-Chip (PSoC®), such as that used in the PSoC® family of products offered by Cypress Semiconductor Corporation (San Jose, Calif.). In one embodiment, the core architecture includes a digital subsystem 110. The digital subsystem 110 includes a universal digital block array 111, comprising a plurality of universal digital blocks (UDBs) 112, a CAN 2.0 interface controller (CAN 2.0) 113, an I²C Master and Slave controller (I²C M/S) 114, a plurality of multifunction digital blocks (MDBs) 115 and a full-speed USB 2.0 interface controller (FSUSB 2.0) 116. MDBs 115 may be configured to perform common digital functions such as timers, counters and pulse-width modulators (PWMs). Digital subsystem 110 may also include communication peripherals such as Ethernet, high-speed USB, USB host, PCI Express, IEE1394 serial bus interface, SD card reader and others (not shown) The elements of digital system 110 may be coupled to digital interconnect 152 and/or to the system bus 154.

The core architecture may also include an analog subsystem 120. The analog subsystem may include an LCD direct drive block 121, a digital filter block (DFB) 122, a plurality of switched-capacitor/continuous time mixed-function analog (SC/CT) blocks 123, a temperature sensor block 124, a capacitive sensing (CapSense™) block 125, a plurality of digital-to-analog converters 126, an analog-to-digital converter (ADC) 127 including a delta-sigma ADC 128, a plurality of operational amplifiers (opamps) 129 and a plurality of comparators (CMP) 130. Analog subsystem 120 may include successive approximation registers (SARs), programmable gain amplifiers (PGAs) and other analog peripherals (not shown). The elements of analog subsystem 120 may be coupled to analog interconnect 150 and/or the system bus 154. CapSense™ block 125 may be coupled to the analog interconnect 150 separate from other elements of analog subsystem 120.

The core architecture 100 may also include memory subsystem 135, CPU subsystem 140 and programming and debug subsystem 145. Memory subsystem 135 may include an EEPROM block 136, synchronous random access memory (SRAM) 137, an external memory interface (EMIF) block 138, and flash memory (FLASH) 139. Memory subsystem 135 may also include a memory cache or memory accelerator (not shown). CPU subsystem 140 may include a CPU 141, an interrupt controller 142 and a bus bridge controller (DMA/PHUB) 143, which may include a direct memory access (DMA) controller 144. The program and debug subsystem 145 may include a programming block 146, and debug and trace block 147 and a boundary scan block 148. The program and debug subsystem may be coupled to the CPU subsystem. The CPU subsystem and the memory system may be coupled to system bus 154. The memory subsystem 135 may be coupled to the CPU subsystem 140 through the system bus 154. In one embodiment, FLASH 139 may be coupled to the CPU 141 directly.

The core architecture 100 may also include system-wide resources 160. System-wide resources may include a clocking subsystem 161 and power management subsystem 171. Clocking subsystem 161 may include an internal low-speed oscillator block (ILO) 162, a watch-dog timer (WDT) and wake-up controller block 163, a real-time clock (RTC)/timer block 164, an internal main oscillator block (IMO) 165, a crystal oscillator block (Xtal Osc) 166, a clock tree 167, power manager 168 and reset block 169. In one embodiment the RTC/timer block 164 and the ILO 162 may be coupled to the WDT and wake-up controller block 163. In another embodiment, clock tree 167 may be coupled to Xtal Osc block 166 and IMO 165. Power management system 171 may include power-on-reset (POR) and low-voltage-detect (LVD) block 172, a sleep power block 173, a 1.8V internal regulator (LDO) 174, a switched mode power supply (e.g, switch-mode pump, SMP) 175 and power manager 178. The switched made power supply may implement a boost circuit, a bust circuit or both. Power manager 178 may be coupled to power manager 168 of the clocking subsystem 161. In one embodiment, system-wide resources 160 may be coupled to system bus 154.

The core architecture 100 may also include a plurality of pins 102. Pins 102 may be used to connect elements of core architecture 100 to off-chip elements or route signals into, out of on-chip elements or to different pins of the device. Core architecture 100 may also include a plurality of special input/outputs (SIOs) 104 and general purpose input/outputs (GPIOs) 106. SIOs 104 may be coupled to digital interconnect 152. GPIOs 106 may be coupled to analog interconnect 150, digital interconnect 152, RTC/timer block 164, and/or Xtal Osc block 166. Core architecture may also include USB input/outputs (USB PHY) 108, which may be coupled to FSUSB 2.0 116.

Digital Subsystem

Figure 2:
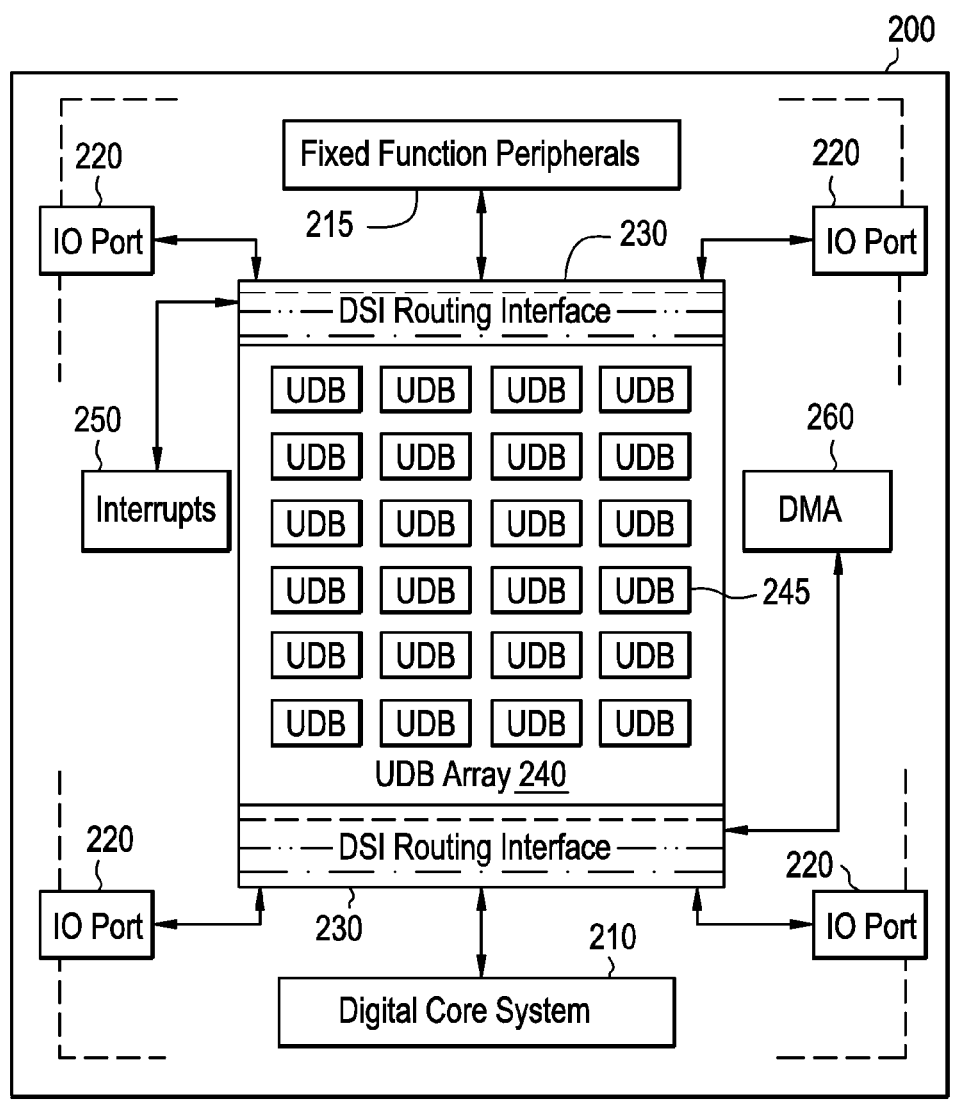
FIG. 2 illustrates a digital subsystem of the core architecture according to an embodiment.
Figure 9:
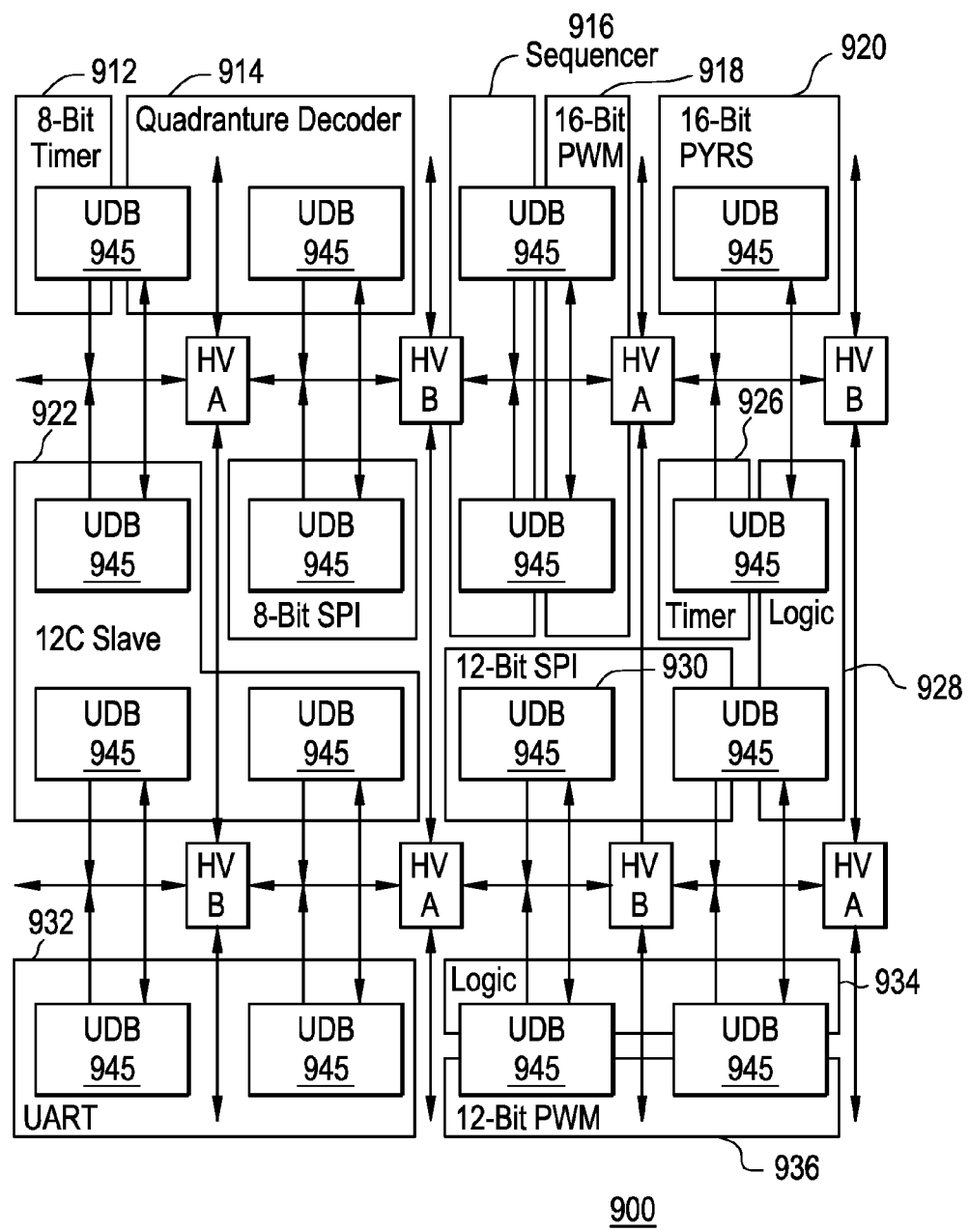
FIG. 9 illustrates a UDB array with digital functions mapped onto the array according to an embodiment.

FIG. 2 illustrates one embodiment 200 of digital subsystem 110 (FIG. 1). The digital subsystem 200 is configurable to perform digital signal processing functions including but not limited to pulse-width modulators, timers, counters, I2C communication, SPI communication, UART communication, cyclical redundancy checks, pseudo-random sequence generators, digital LCD drivers, state machines, digital multiplexors and sequencers, decimators, shift registers as well as combination of logic gates. Mixed-signal operations enabled by the digital subsystem may include but not be limited to analog-to-digital converters, digital-to-analog converters, mixers, modulators and demodulators when coupled to the elements of the analog subsystem (e.g., 120, FIG. 1). The digital system includes highly configurable universal digital blocks (e.g., UDBs, 112, FIG. 1), which may be configured to perform various digital functions alone or in combination with other UDBs. Further, UDBs may be partitioned and their resources shared to optimized mapping of digital functions onto an array of UDBs. An example of this is shown in FIG. 9 and discussed later in this specification.

Digital subsystem 200 may include a plurality of digital core system elements 210, such as clock dividers and memory, fixed function peripherals 215 and IO ports 220 coupled to a digital routing fabric (e.g., digital system interconnect—DSI) 230. DSI 230 may be coupled to UDB array 240, which may include a plurality of UDBs (245). UDBs 245, fixed function peripherals 215, IO ports 220, interrupts 250, DMA 260 and digital core system elements 210 may be coupled to the DSI 230 to implement full-featured device connectivity. DSI 230 may allow any digital function to be routed to any pin 102 (FIG. 1) or other feature to be routed when coupled through UDB array 240. In one embodiment, UDBs 145 may be a collection of uncommitted logic (PLD) and structural logic optimized to create common embedded peripherals and customized functionality that are application- or design-specific. In one embodiment UDBs 145 may be arranged in a matrix with a homogenous structure to allow flexible mapping of digital functions onto the array. The array may support extensive and flexible routing interconnects between UDBs 245 and DSI 230.

In another embodiment, UDBs may be implemented using CPLD or FPGA elements singly, together or in combination with configurable or fixe-function logic elements, memories and/or look-up tables (LUTs).

Figure 3:
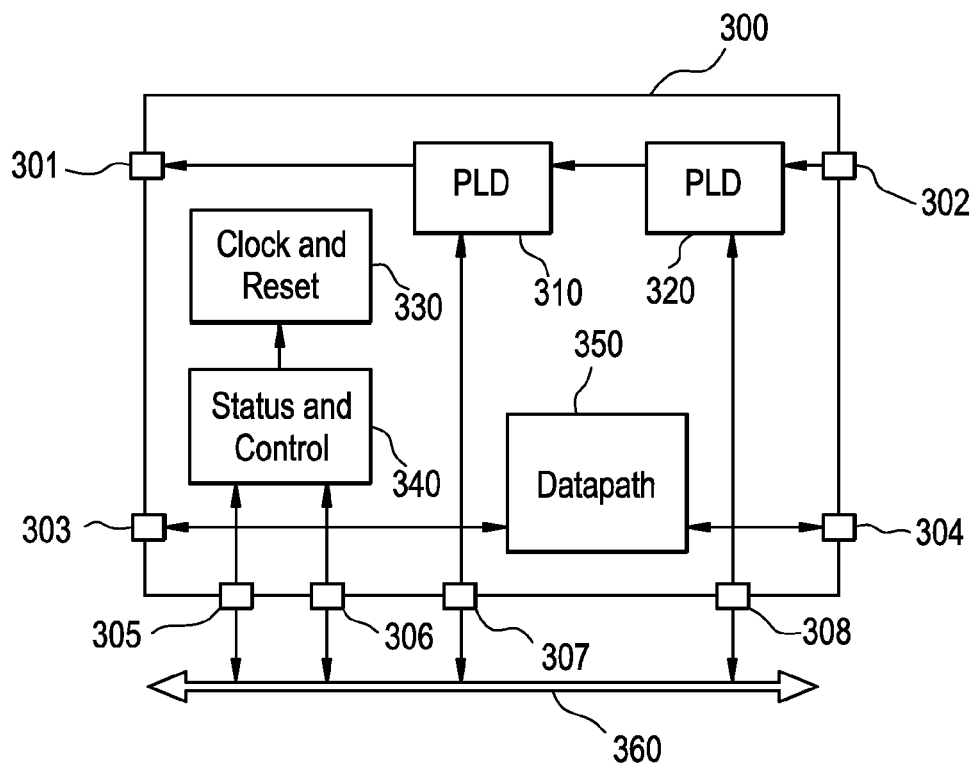
FIG. 3 illustrates a universal digital block (UDB) of the digital subsystem according to an embodiment.

FIG. 3 illustrates one embodiment of a UDB 300, for example as found in FIGS. 1 (112) and 2 (245). UDBs may be configured to perform digital functions alone or in combination with other UDBs by using a highly configurable interconnect and chaining structure which allows UDBs to share unused resources with other groups of UDBs.

UDB 300 may include a first programmable logic device (PLD) 310 coupled to PLD chaining IO 301, routing channel 360 through routing IO 307 and a second PLD 320. Second PLD 320 may be coupled to PLD chaining IO 302, first PLD 310 and routing channel 360 through routing IO 308. UDB 300 may also include a clock and reset control block 330, which may be coupled to a status and control block 340. Status and control block 340 may be coupled to routing channel 360 through routing IOs 305 and 306. UDB 300 may also include a datapath module 350 which is coupled through to datapath modules of other UDBs through datapath chaining IOs 303 and 304. PLDs 310 and 320 may take inputs from the routing channel 360 and form registered or combinational sum-of-products logic and may be used to implement state machines, state bits and combinational logic equations. In some embodiments, PLD configurations may be automatically generated from graphical primitives, where functions are mapped to the PLD the PLD is configured based on the settings of those functions. In some embodiments, datapath module 350 may be an datapath containing structured logic to implement a dynamically configurable arithmetic logic unit (ALU) and a variety of compare configurations of conditions. The datapath module 350 may also contain input/output FIFOs to serve as the parallel data interface between the CPU system 140 (FIG. 1) and the UDB 300. The status and control block 330 may be used by the UDB 300 to interact with and synchronize to the CPU (e.g., 141, FIG. 1).

Figure 4:
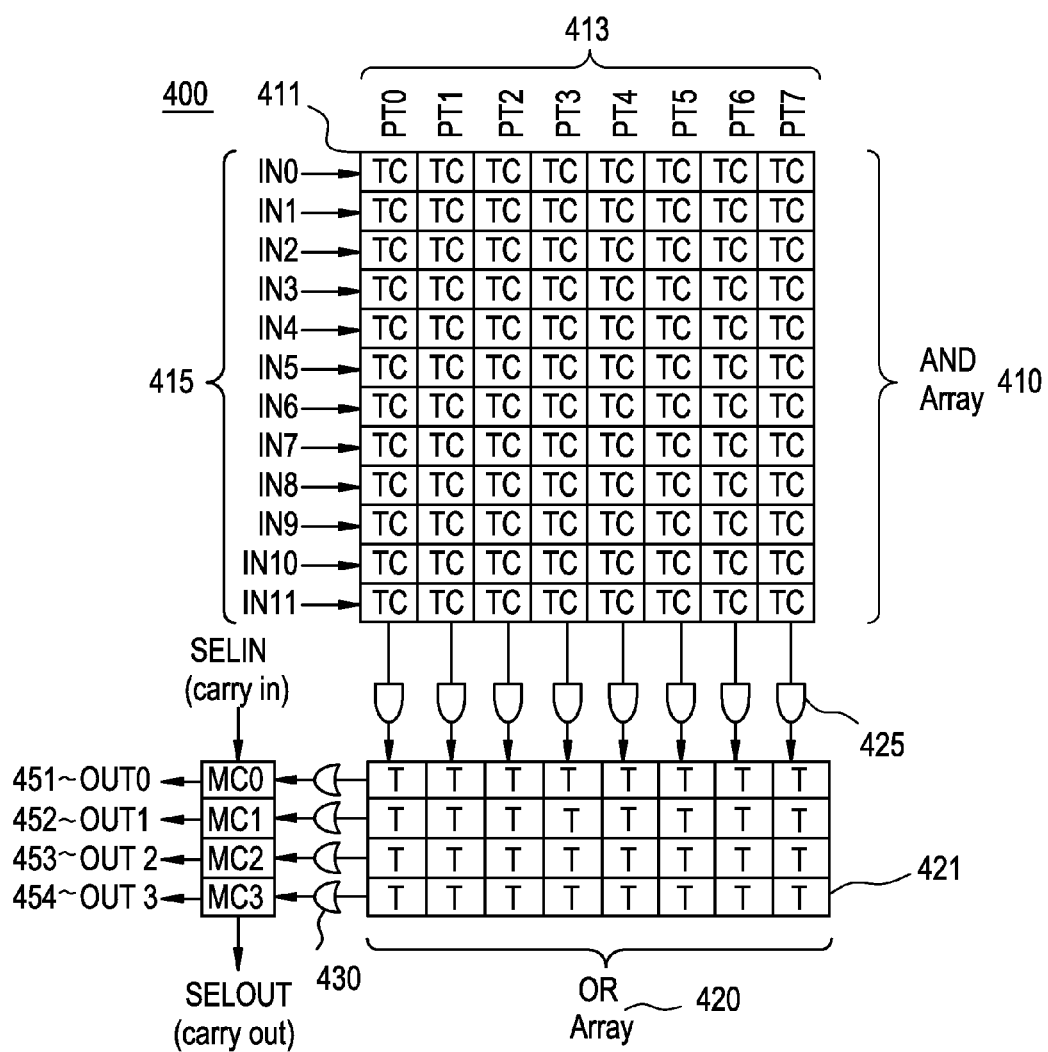
FIG. 4 illustrates a programmable logic device of a UDB according to an embodiment.

FIG. 4 illustrates one embodiment of a PLD 400 as part of a UDB (e.g., 300, FIG. 3) and linked to other UDBs and PLDs (e.g., 310 and 320, FIG. 3). The PLD of a UDB is configurable to provide generic logic such as an AND gate, an OR gate and a flip flop used for synthesizing Verilog written during development. PLD 400 may include an AND array 410 of inputs 415 and product terms 413. For each product term 411 the true (T) or complement (C) of each input 415 may be selected. In one embodiment, there may be eight product terms 413 and twelve inputs 415. In other embodiments there may be more or less than eight product terms 413 and twelve inputs 415. Product terms from the AND array 410 are ANDed through AND functions 425 to create an OR array 420 of product terms 421. The product terms 421 may be summed through OR functions 430 to create PLD outputs 451-454. The summed output of OR functions 425 may be between one and the maximum number of product terms wide. Eight product terms are shown as part of PLD 400. In one embodiment, the width of the OR gate may be constant across all outputs. In another embodiment, the width of the OR gate may be variable.

Figure 5:
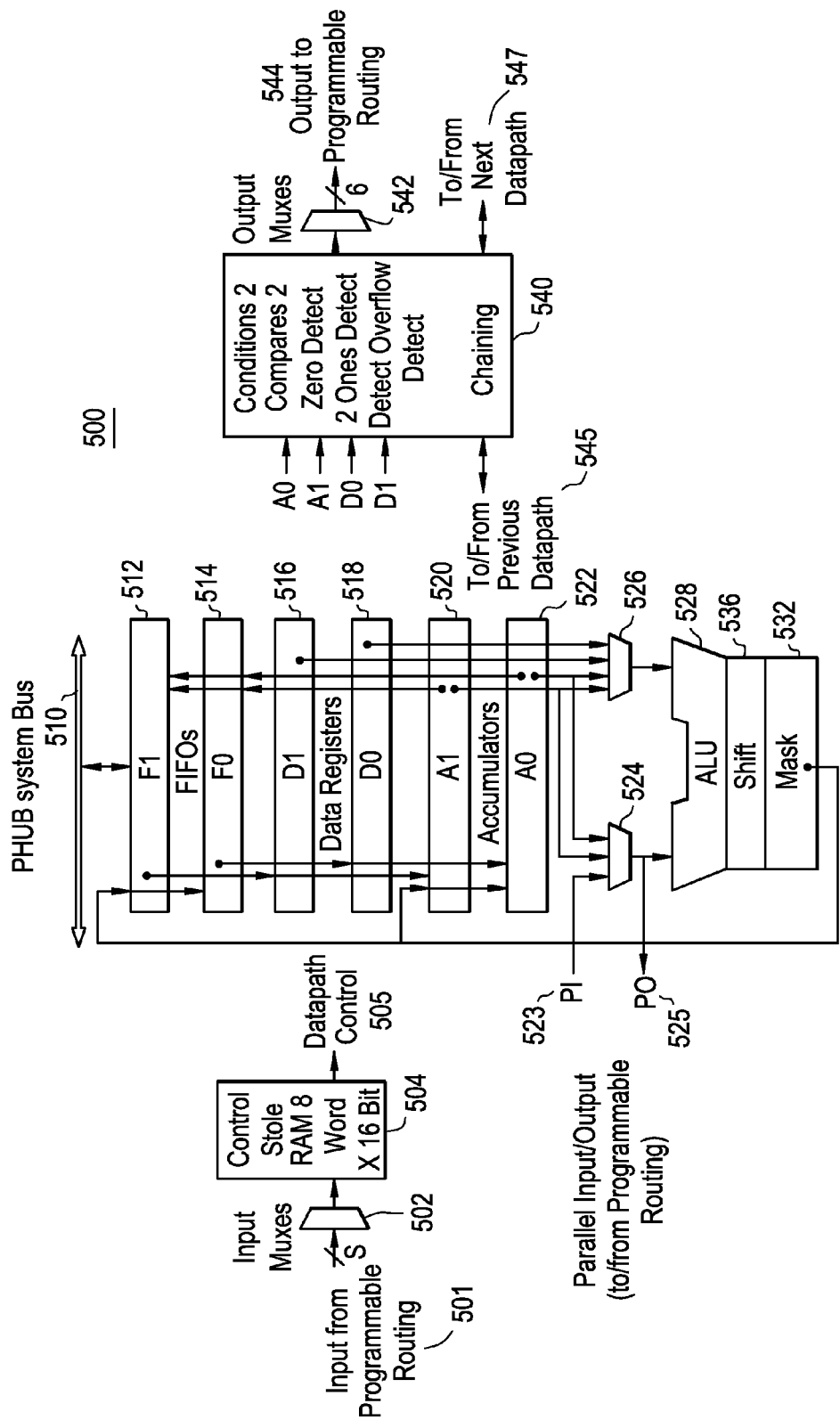
FIG. 5 illustrates a datapath module of a UDB according to an embodiment.

FIG. 5 illustrates one embodiment of a datapath module 500 implemented in a UDB (e.g., 300, FIG. 3) as well as the chaining of multiple datapaths from multiple UDBs. The datapath includes an arithmetic logic unit (e.g. ALU 528) as well blank data registers which may be configured to implement a flag when the counter is finished, or in another embodiment when a status output for when a timer reaches a threshold. The datapath allows chaining and MUXing of UDBs to created larger digital functions. For example, two UDBs may be chained together to provide higher-bit functionality. Datapath module 500 may include one or more inputs 501 from a programmable routing to one or more input multiplexors 502. Inputs 501 connect the datapath module 500 to the routing matrix and provide the configuration for the datapath operation to perform in each cycle and the serial data inputs. Inputs may be routed from other UDBs, other device peripherals, device IO pins or other system elements. The output of the input multiplexors 502 may be coupled to a control store RAM 504. In one embodiment, control store RAM 504 may be a memory array, wherein unique configurations may be stored. Control store RAM may then be coupled to datapath control 505. PHUB system bus 510 may provide read- and write-access to datapath registers F1 512, F0 514, D1 516, D0 518, A1 520, and A0 522. Datapath registers 512-522 may be combined or used individually and routed through MUXes 524 and 526. Parallel input PI 523 may also be routed from programmable routing through MUX 524. MUXes 524 and 526 may have outputs that are coupled to arithmetic logic unit (ALU) 528. Parallel output PO 525 may also be routed from the output of MUX 524 to programmable routing. ALU 528 may be coupled to shift function 530. Shift function 530 may be coupled to mask function 532. Outputs 544 to the programmable routing may be selected from the general conditions and the serial data outputs. Outputs 544 may be routed to other UDBs, device peripherals, interrupt controllers, the DMA, IO pins and other system elements. Datapaths may be chained through chaining block 540 with inputs from A0, A1, D0, D1 and data from previous datapath 545 to chaining block 540. Outputs are routed to the programmable routing 544 through a plurality of output MUXes 542 or to/from the next datapath 547.

Datapath 500 may include six primary working registers 512-522, which may be accessed by the CPU (FIG. 1) or DMA (FIG. 1) during device operation. Primary working registers 512-522 may be categorized as accumulators (A0 522 and A1 520), data registers (D0 518 and D1 516) or FIFOs (F0 514 and F1 512). In one embodiment, accumulators may be sources and sinks for ALU 528 or sources for compares. Data registers may be sources for ALU 528 as well as for compares. FIFOs may be primary interfaces to system bus 154 (FIG. 1). FIFOs may also be data sources for the data registers and accumulators. FIFOs may also capture data from accumulators from ALU 528. In one embodiment, each FIFO may be four bytes deep.

ALU 528 may be configured to perform a variety of general-purpose functions by writing to ALU control registers (not shown) or sending control signals to ALU 528. Digital functions may include Increment, Decrement, Add, Subtract, Logical AND, Logical OR, and Logical XOR. Digital functions may be reloaded into the ALU 528 and selected by writing to ALU control registers (not shown) by the CPU (e.g., 141, FIG. 1) or the DMA controller (e.g., 144, FIG. 1). Datapath 500 may also be configured to perform functions independent of ALU 528 operation. Such functions may include Shift Left, Shift Right, Nibble Swap, and Bitwise OR Mask.

Datapath module 500 may be optimized to implement embedded functions such as times, counters, integrators, PWMs, pseudo-random sequence generators (PRSs), cyclic redundancy checks (CRCs), shifters, dead band generators and other digital functions by writing to ALU control registers (not shown) with the CPU (e.g., 141, FIG. 1) or the DMA controller (e.g., 144, FIG. 1).

In one embodiment, datapath 500 may be configured to chain conditions and signals with neighboring datapaths to create higher-precision arithmetic, shift, CRC or PRS functions.

In one embodiment, ALU 528 may be shared in applications that are over sampled or do not need high clock rates. Carry and shift out data from ALU 528 may be stored in data registers and may be selected as inputs in subsequent cycles. Such a configuration may provide support for functions that require greater bit lengths that are available in a single datapath.

In one embodiment, conditions may be created by datapath module 500 which may include two compare operands. The two compares of datapath 500 may have bit masking options. Compare operands may include accumulators A0 522 and A1 520 and data registers D0 518 and D1 516 in a variety of configurations. Other conditions created by datapath module 500 may include zero detect, all ones detect and overflow. Conditions may be the primary outputs of datapath 500. The outputs of datapath 500 may be driven out to the UDB routing matrix. In one embodiment, conditional computation can use the built in chaining to neighboring UDBs to operate on wider data widths without the need to use routing resources.

In one embodiment, the most significant bit (MSB) of ALU 528 and shift function 530 may be programmatically specified to support variable-width CRC and PRS functions. In conjunction with masking function 532, the MSB of ALU 528 and shift function 530 may implement arbitrary-width timers, counters and shift blocks.

Datapath module 500 may include built-in support for single-cycle CRC computation and PRS generation of arbitrary width and arbitrary polynomial. CRC and PRS functions longer than eight bits may be implemented in conjunction with PLD logic, or built-in chaining may be used to extend the functions into neighboring UBDs.

FIFOs F0 514 and F1 512 may be four bytes deep and configured independently as an input buffer or an output buffer. In the case of an input buffer, system bus 154 (FIG. 1) may write to the FIFO and datapath module 500 may perform and internal read of the FIFO. In the case of an output buffer, datapath module 500 may perform an internal write to the FIFO and system bus 154 may read from the FIFO. FIFOs F0 514 and F1 512 may generate a status that is selectable as a datapath output and can be driven to routing. Once driven to routing, the status generated by F0 514 and F1 512 may interact with sequencers to move the device between states or to execute ordered functions, interact with interrupts to generate tasks in software or interact with the DMA to store the status to a memory location or registers without consuming CPU overhead.

FIGS. 6A-6C illustrate example FIFO configurations which may be constructed, for example, with the datapath described with respect to FIG. 5. FIG. 6A illustrates an example FIFO configuration for a transmit/receive (TXRX) function 600. System bus 654 is coupled to F0 614. F0 614 is coupled to either datapath D0 or datapath D1 in block 617 and then coupled to either accumulator A0, accumulator A1 or ALU 528 (FIG. 5) in block 628. The output of block 628 is coupled to F1 612. F1 612 is coupled to system bus 654.

FIG. 6B illustrates an example FIFO configuration for a dual capture function 601. Accumulator A0, accumulator A1 or ALU 528 (FIG. 5) in block 628 may be coupled to either F0 614 or F1 612. F0 614 and F1 612 are coupled to system bus 654.

FIG. 6C illustrates an example FIFO configuration for a dual buffer function 602. System bus 654 is coupled to F0 614. F0 614 is coupled to datapath 618 and accumulator 622. System bus 654 is also coupled to F1 612. F1 612 is coupled to datapath D1 616 and accumulator A1 620.

FIG. 7 illustrates a UDB status and control module 700 (e.g., 340, FIG. 3) according to one embodiment. The UDB status and control module 700 includes status and control registers 710, and 720, respectively, which may be accessed and set to enable, disable, configure and reconfigure the UDBs. The status and control module 700 routes data from the datapath and places that information into a status register 710. Signals from the datapath are then easily accessible by other system components without required datapath overhead.

UDB status and control module 700 includes routing channel 705. Routing channel 705 may be coupled to status register 710 and control register 720. Status register 710 and control register 720 are coupled to system bus 754. In one embodiment, the bits of control register 720, which may be written to by the system bus 754, may be used to drive into the routing matrix and provide firmware with the opportunity to control the state of UDB processing. The status register 710 may allow the state of the UDB to be read out onto the system bus 754 directly from internal routing. Status register 710 and control register 720 may have programmable connections to the routing matrix, which allows routing connections to be made depending on the requirements of the application.

Figure 8:
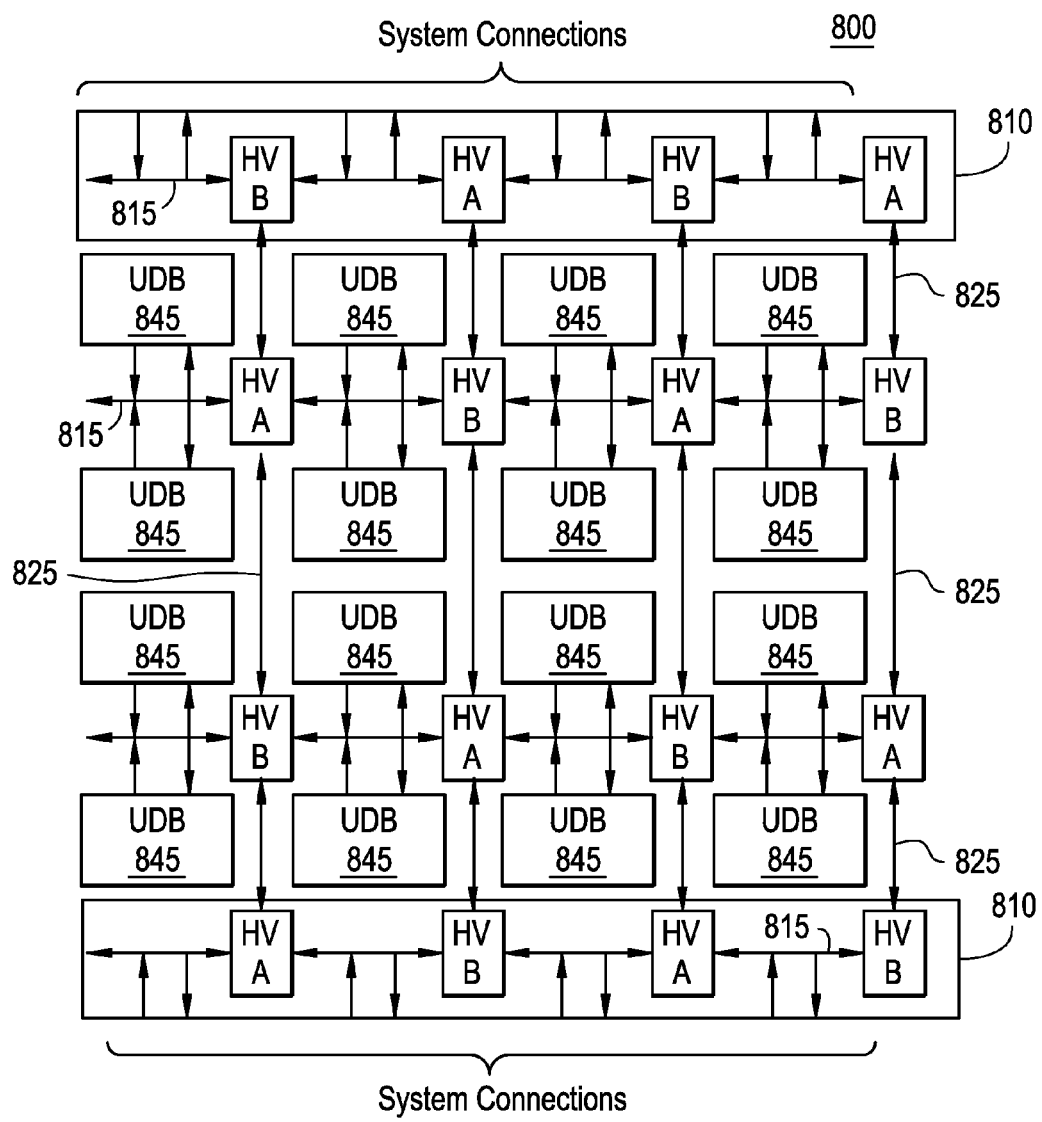
FIG. 8 illustrates a UDB array according to an embodiment.

FIG. 8 illustrates a UDB array 800 according to one embodiment. UDB array 800 includes DSI routing interfaces 805 and 810. Array 800 also includes horizontal and vertical (HV) routing channels 815 and 825. In one embodiment, HV routing channels 815 and 825 may include of 96 wires. HV routing channels 815 and 825, wire connections to UDBs 845, and the DSI interface may be highly permutable. The permutability provides efficient automatic routing, which may allow wire-by-wire segmentation along the vertical and horizontal routing channels 815 and 825 to further increase routing flexibility and capability.

FIG. 9 illustrates a UDB array 900 according to one embodiment with digital functions mapped onto the UDB array 900. Functions are implemented by configuring UDBs 945 in an array to perform digital functions. Functions that are mapped onto the UDB array 900 include a timer 912, decoder 914, sequencer 916, PWM 918, PRS 920, I2C slave 922, SPI 924, timer 926, logic 928, SPI 930, UART 932, logic 934 and PWM 936. In this embodiment, the primary programmable resources of UDBs are two PLDs, one datapath and one status/control register. These resources may be allocated independently. UDB PLDs, datapaths and status control registers may have independently selectable clocks and may be allocated to multiple unrelated functions. As an example, timer 912 uses only one datapath in a UDB 945, which allows other resources of UDB 945 to be used for other functions, such as quadrature encoder 914, which may require more PLD logic that one UDB can supply. Programmable resources in the array 900 may be homogenous, allowing functions to be mapped to arbitrary boundaries in the array. While UDB array 900 has functions mapped to it in such a way as to consume all of its UDBs, application requirements may require a different set of digital functions that may not use all digital resources. Additionally, the mapped functions of FIG. 9 are intended to be representative of one application. UDB array 900 may be configured to implement a different set of functions or the same functions in a different configuration.

Figure 10:
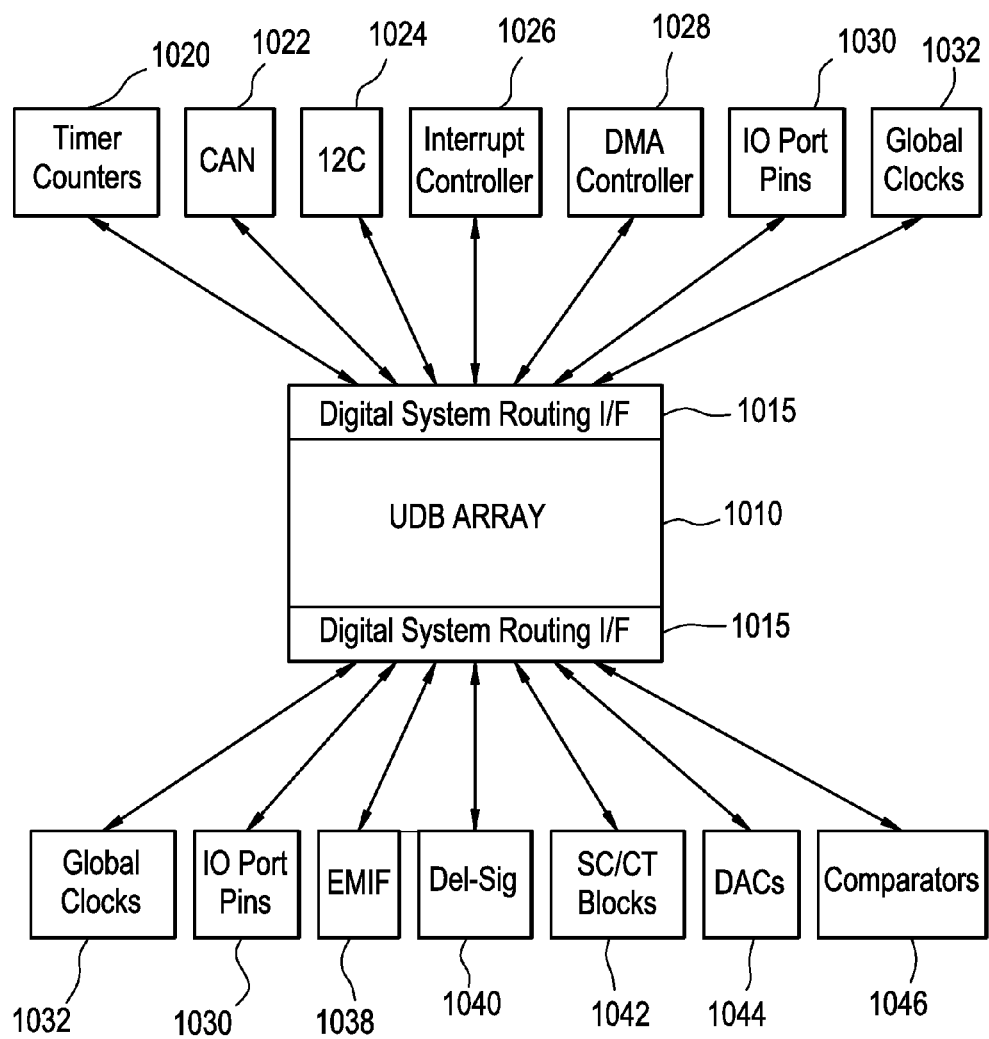
FIG. 10 illustrates a digital routing fabric in a system according to an embodiment.

FIG. 10 illustrates one embodiment of a DSI routing in an overall digital subsystem 1000. DSI 1015 may function as a continuation of the horizontal and vertical routing channels 815 and 825 (FIG. 8) at the top and bottom of an array 1010 of UDBs. The DSI may provide general purpose programmable routing between device peripherals such as UDBs (e.g., 112, FIG. 1), IOs (e.g., 104 and 106, FIG. 1), the analog subsystem (e.g., 120, FIG. 1), interrupts generated by the CPU (e.g., 141, FIG. 1), the DMA controller e.g., 144, FIG. 1) and fixed function peripherals. The DSI is used to send and receive signals to any digital resource. Signals may include inputs from IOs and peripherals, outputs from digital resources to other system elements, control signals and status queries.

In some embodiments, device peripherals that are connected by DSI 1015 may include timers and counters 1020, a CAN interface 1022, an I2C interface 1024, an interrupt controller 1026, a DMA controller 1028, IO port pins 1030, global clocks 1032, an EMIF 1038, delta-sigma ADCs 1040, SC/CT blocks 1042, DACs 1044, comparators 1046, IO ports (not shown) or any other digital core or fixed function peripheral that may use programmable routing. Signals that may use programmable routing may include:
  interrupt requests form all digital peripherals in a system,
  DMA requests from all digital peripherals in a system
  digital peripheral data signals that need flexible routing to IOs,
  digital peripheral data signals that need connection to UDBs
  connections to the interrupt and DMA controllers
  connections to IO pins, and
  connections to analog system digital signals.

Figure 11:
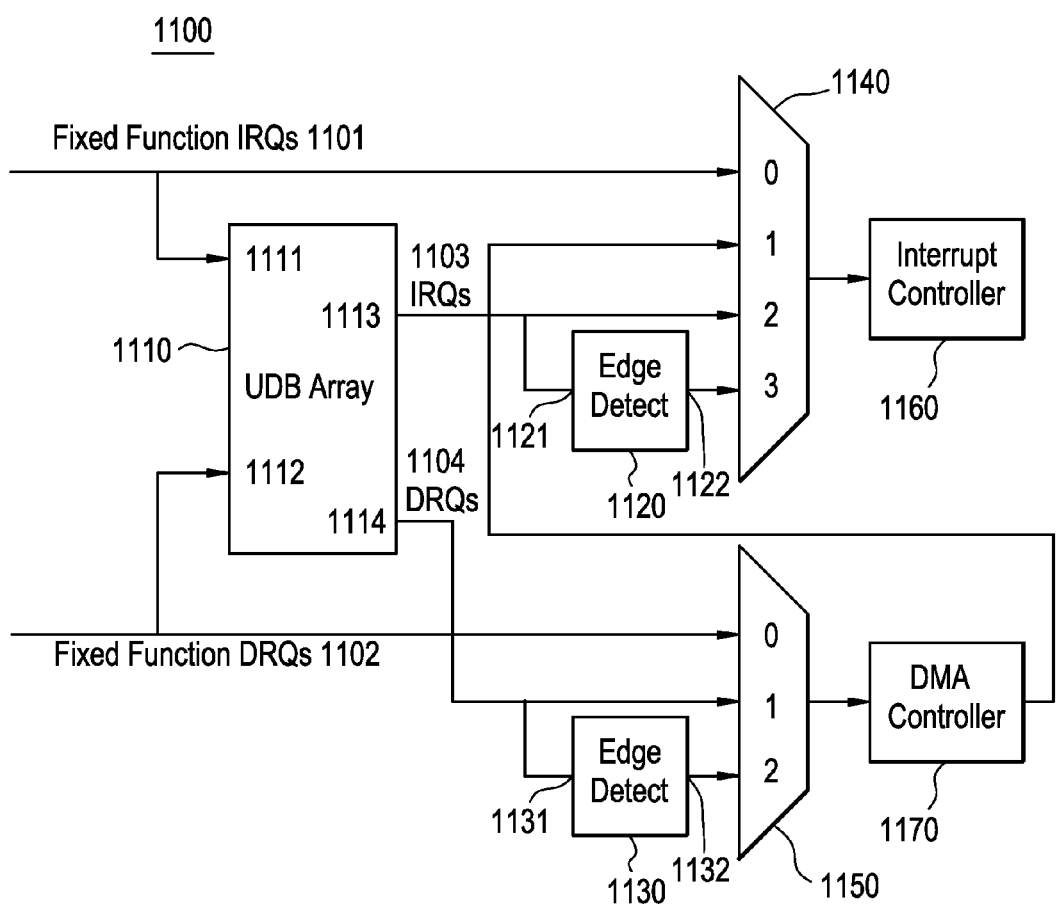
FIG. 11 illustrates an interrupt and DMA multiplexer according to an embodiment.

Interrupt and DMA routing may be made even more flexible in the DSI, which may allow for more efficient and faster routing of signals and configuration of digital subsystem components. FIG. 11 illustrates one embodiment of an interrupt and DMA controller 1100. Fixed-function interrupt request lines (IRQs) 1101 may be routed into UDB array through input 1111 and out through output 1113. Fixed-function DRQs 1102 may be routed into UDB array 1110 through input 1112 and out through output 1114. IRQs 1103 may then be routed through an edge detect 1120 through input 1121 and output 1122. DRQs 1104 may be routed through an edge detect 1130 through input 1131 and output 1132. Fixed-function DRQs, DRQs and the output of edge detect 1130 may be rouged through MUX 1150 to the input of DMA controller 1170. Fixed-function IRQs, IRQs from the UDB array 1110, the output of DMA controller 1170 and the output of edge detect 1120 may be routed through MUX 1140 to interrupt controller 1160.

Figure 12A:
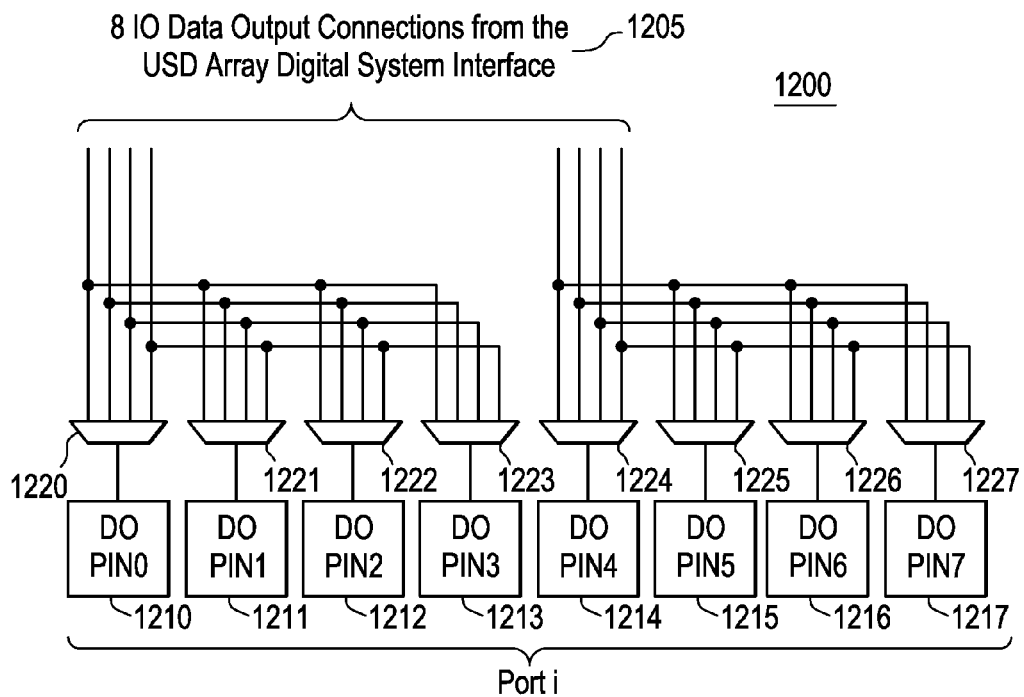
FIG. 12A illustrates an embodiment of IO pin output connectivity according to an embodiment.
Figure 12B:
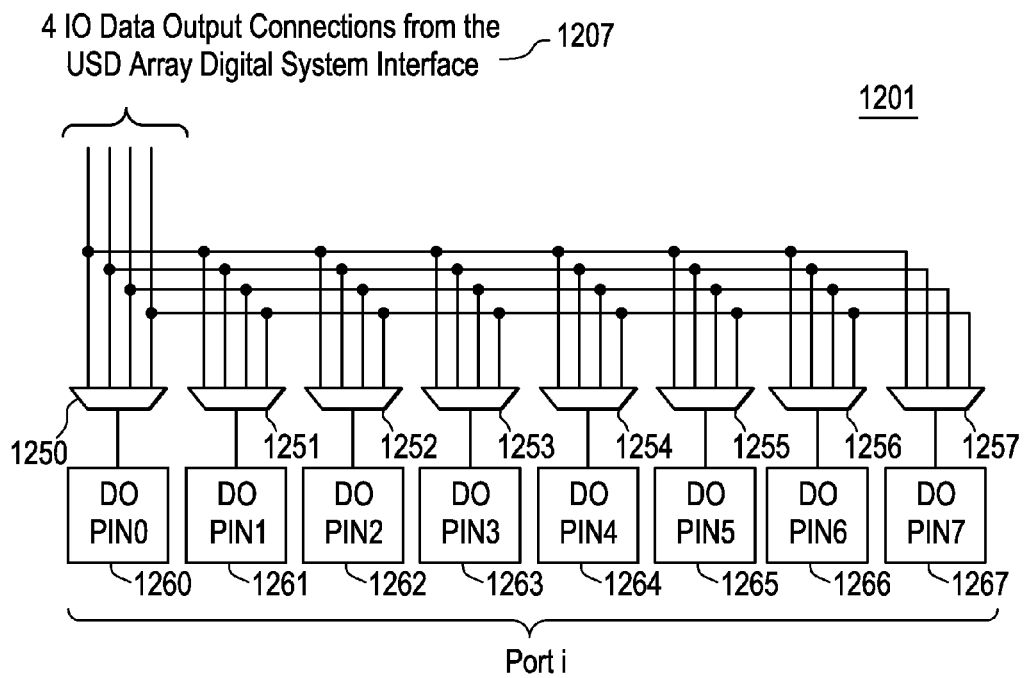
FIG. 12B illustrates an embodiment of IO pin output connectivity according to another embodiment.

FIG. 12A illustrates an embodiment of the IO pin output connectivity 1200. Eight IO data output connections from the UDB array DSI 1205 are routed to port pins 1210-1217 through MUXes 1220-1227. The first four data output connections from the UDB array DSI may be coupled to the first four port pins 1210-1213 through the first four MUXs 1220-1223. The second four data output connections from the UDB array DSI may be coupled to the second four port pins 1214-1217 through the second four MUXs 1224-1227. FIG. 12B illustrates another embodiment 1201 of IP pin output connectivity wherein four more DSI connections to an IO port to implement dynamic output enable control of pins. IO control signals connections from USB array DSI may be routed to output enable pins 1250-1257 through MUXes 1260-1267. In one embodiment, MUXes 1260-1267 may receive all DSI signals globally. In another embodiment, MUXes 1260-1267 may receive a subset of the available DSI signals or a subset of MUXes 1260-1267 may receive all DSI signals or a subset of the available DSI signals.

Figure 13:
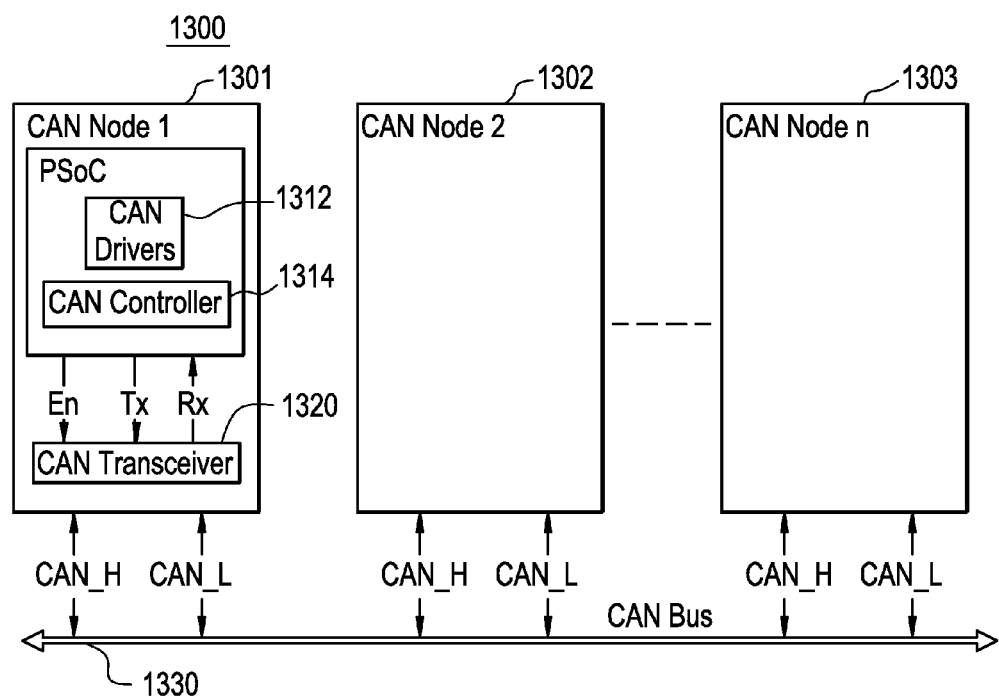
FIG. 13 illustrates a CAN bus system according to an embodiment.

FIG. 13 illustrates a controller area network (CAN) bus system 1300. A CAN bus system may be used to communicate over a CAN bus network to other devices. CAN bus system 1300 includes a plurality of CAN nodes 1301-1303. While there are three nodes shown in FIG. 13, it would be obvious to one of ordinary skill to have more or less than three CAN nodes in a CAN bus system 1300. Each CAN node includes CAN drivers 1312 and a CAN controller 1314. In one embodiment, CAN drivers 1312 and CAN controller 1314 are implemented in a PSoC™ device 1312. CAN nodes may also include a CAN transceiver 1320 coupled to the CAN drivers 1312 and CAN controller 1314 through TX/RX signals and an enable signal. CAN nodes may also be coupled to CAN bus 1330 through CAN_H and CAN_L signals. In one embodiment, CAN drivers 1312 may run on the CPU (e.g., 141, FIG. 1).

Figure 14:
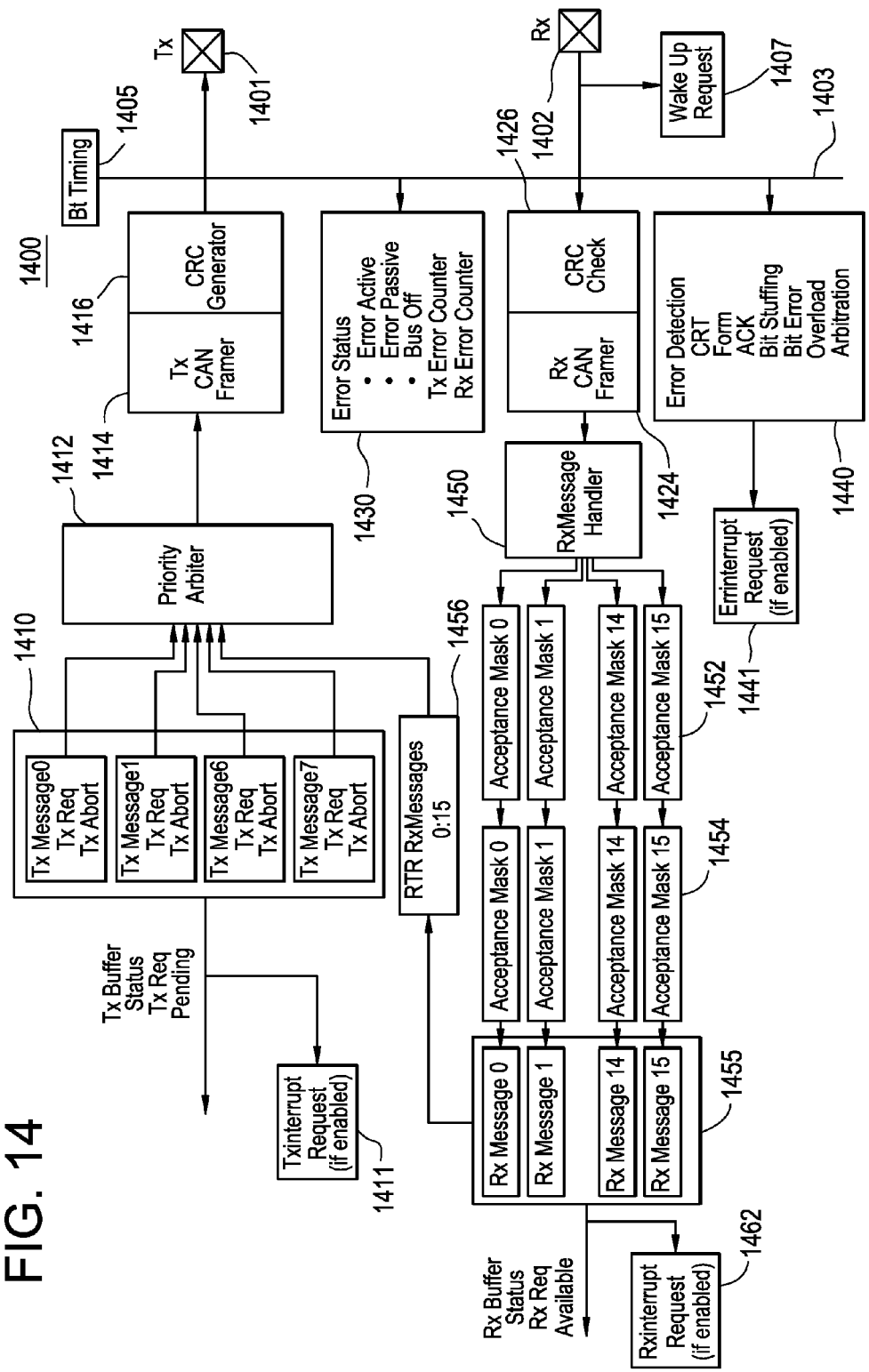
FIG. 14 illustrates a block diagram for a CAN controller according to an embodiment.

FIG. 14 illustrates a block diagram for a CAN controller 1400 from CAN bus system (FIG. 13) and the digital subsystem (e.g., 113, FIG. 2). The CAN controller may be configured to send and receive signals on a CAN bus and to configure signals received by other system elements to meet the protocol requirements of the CAN bus. CAN controller 1400 includes a TX block 1410 which contains TX message, TX request and TX abort information for each data packet to be communicated by the CAN controller. Information from the TX block is routed to the TX CAN framer 1414 and CRC generator 1416 through priority arbiter 1412. Signals are routed from CRC generator 1416 to the TX pin 1401. Signals are received by the CAN controller through RX pin 1402. Signals received at the RX pin 1402 may be routed to a WakeUp request block 1407 or the RX message handler 1450 through CRC check block 1426 and RX CAN framer 1424. RX message handler 1450 assigned mask information to data received through RX pin 1402 and routes the signal to one or more of a plurality of acceptance masks 1452. Information is routed from the plurality of acceptance masks 1452 to the acceptance codes 1454 and then to generate created massages in block 1455. Received messages in block 1456 may then be routed back to the priority arbiter 1412, generate a RX interrupt in block 1462 or be routed back in the main digital subsystem. TX interrupt requests are received from TX block 1410. Bit timing block 1405 is coupled to the output of CRC generator 1416 and CRC the input of CRC generator 1426 as well as to error status block 1430 and error detection block 1440.

The CAN bus interface may be compliant with the Bosch v 2.0B CAN-Bus specification and implemented an industry standard AMBA AHB bus and a Philips compatible PHY interface. In one embodiment, the CAN controller may operate as a slave device with configuration, control and data managed by an application processor or external DMA controller. The CAN controller may support one or more interrupts and may or may not provide a AHB DMA request signal.

Figure 15:
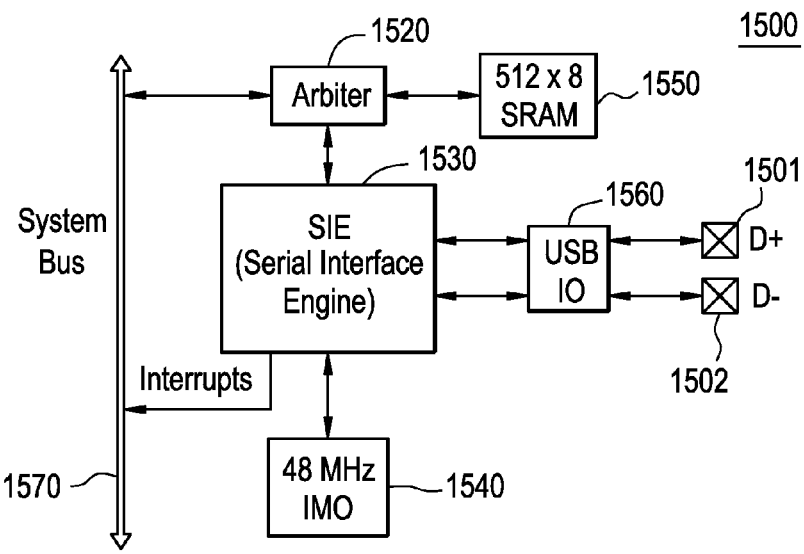
FIG. 15 illustrates a block diagram for a USB controller according to an embodiment.

The digital subsystem may include a USB communication interface, capable of supporting control interrupt, bulk and/or isochronous USB transfer types. The USB communication interface may be configured to send and receive signals to other USB devices on a bus. FIG. 15 illustrates a block diagram of the USB controller 1500 of the digital subsystem according to one embodiment. Pins 1501 and 1502 connect to D+ and D− inputs, respectively and coupled to USBIO block 1560. Signals may be routed through USBIO 1560 to serial interface engine (SIE) 1530. SIE 1530 may be coupled to arbiter 1520 and 48 MHz IMO 1540 in one embodiment. In another embodiment, arbiter 1520 and RAM (not shown) my be replaced by a request to a DMA controller (e.g., 144, FIG. 1) that enables the SIE to share memory from a memory subsystem (e.g., 135, FIG. 1). SIE may generate interrupts and communicate back to the digital subsystem through system bus 1570. Arbiter 1520 may be coupled to system bus 1570 and to SRAM 1550. In another embodiment, USBIO 1560 may be external to the device and interface to the SIE through an interface protocol such as USB 2.0 Transceiver Macrocell Interface (UTMI) or UTMI+ Low Pin Interface (ULP).

Figure 16:
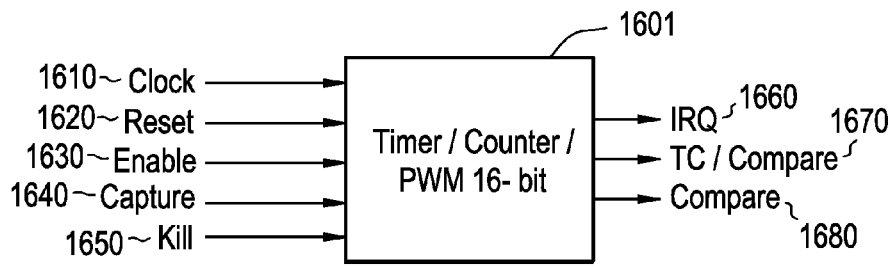
FIG. 16 illustrates a timer/counter/PWM fixed-function peripheral block in-system according to an embodiment.

The digital subsystem may include one or more multifunction digital blocks (MDBs) configurable as a timer, a counter, a PWM or other common digital functions. Multifunction digital blocks provide optimized digital resources that may be easily configured to implement common digital functions. Such dedicated peripherals may be emulated in UDBs to increase the number of such blocks in the application. However, dedicated resources that may be configured to perform basic digital functions allows more configurable resources to be configured to perform complex functions which may require more resources than a single block may provide. FIG. 16 illustrates a block diagram of the inputs and output of the MDB 1601. The MDB 1601 may select from multiple clock sources 1610 with input and output signals connected through DSI routing. DSI routing allows connection to any device pin and any internal signal accessible through the DSI. Each MDB may have a compare output 1680, terminal count output 1670 and a programmable interrupt request line (IRQ) 1660. MDB 1601 may be configured as free-running, one-shot 1620 or enable-input 1630 controlled and have timer rest and capture inputs 1640 and a kill input 1650 for control of the comparator outputs. In another embodiment, MDBs and UDBs, as shown in FIG. 3, may be configurable such that functions between MDBs and UDBs are interchangeable.

Figure 17:
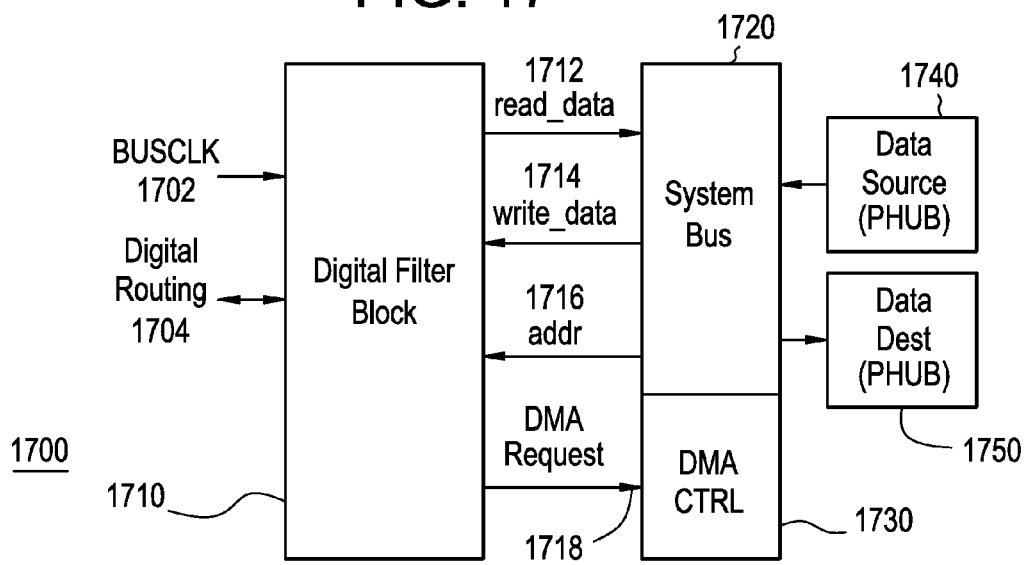
FIG. 17 illustrates a digital signal processing application block diagram according to an embodiment.

Digital subsystem may include a digital signal processing block (e.g., digital filter block—DFB). FIG. 17 illustrates a DFB application 1700 block diagram. DFB application 1700 includes a DFB 1710 with an input connection from BUS-CLK 1702 and input/output connections to and from digital routing 1704. DFB application 1700 includes system bus 1720, which sends write_data and address signals, 1714 and 1716, to the DFB 1720. DB 1710 sends read_data signals 1712 to system bus 1720. DFB 1710 also sends DMA request signals 1718 to DMA control block 1730. Data source block 1740 couples into system bus 1720. Data destination block 1750 couples from system bus 1720. DFB architecture is described in more detail in U.S. patent application Ser. No. 11/865,672 filed by Mar et al. and assigned to Cypress Semiconductor Corporation (San Jose, Calif.).

In one embodiment, a DFB may be a fixed-point, programmable limited scope DSP engine with a AHB-Lite DMA capable slave interface. Configuration, status memory test, signal and coefficient data moving into or out of the DFB may pass across the AHB interface. A DFB may support multiple streaming data channels, where programming instructions, historic data and filter coefficients and results are stored locally with new period data samples received from the AHB interface. System software may load sample and coefficient data into and out of DFB data RAMs and/or reprogram for different filter operation. Such configurations may allow for multi-channel processing or deeper filters that would be supported in local memory. The DFB may also provide a software-configurable interrupt and multiple DMA channel support. Semaphore bits may be available for software to interact with the DSP assembly program. In one embodiment, data movement may be controlled by the system DMA to be moved by hardware with limited CPU overhead. In another embodiment, data may be moved directly by the microcontroller if there are no available DMA channels, if the application requires it for program execution timing and steps.

The DFB may support multiple input and multiple output data ports, accessible through DMA or directly by the system CPU. These ports may support accesses of varied widths and have coherency protection hardware allowing them to be written or read in multiple accesses of less than full width accesses. Coherency protection may allow processing of wide data through narrow busses without corruption.

The DFB may support internal clock gating by splitting the bus block into three gated clock domains. A first clock domain may clock the DFB core and the majority of the block. A second clock domain may clock the AHB interface and a third clock domain may be a combination of the first and second clock domains as described. In one embodiment, the DFB may contain embedded register files for internal data storage and input, output storage to and from the AHB interface. Multiple clock domains may allow for different rates of clocking for different program functions. For example, a program block may have a first clocking domain for the input and a second clocking domain for the output.

The DFB may provide a multiple accumulate (MAC) operation in one clock cycle. This may enable finite impulse response (FIR), infinite impulse response (IIR) and other filters, offloading the main CPU while significantly improving execution speed of the filter operation if done by the CPU.

DFB may have multiple modes of operation. In one embodiment, the DFB may have block mode and streaming mode. Block mode may be used to set up the DFB for operation by loading data, coefficients, instructions, and finite state machine (FSM) control RAMs for operation. The DFB core may be halted and the embedded memories accessed by the AHB bus interface. Block mode may be used to enable multiple channels, multiple filters or both in a time-division multiplexed fashion. Block mode may also be used to enable filter depths larger than local DFB memory may allow. Streaming mode may be used to maximize performance and minimize system bandwidth usage by storing instruction sets and sample and coefficient data in local DMA memory. In one embodiment, only new incoming data samples, outgoing filter results and control and stat information may be transferred across the AHB bus. In streaming mode, the DFB may wait for periodic data samples, process the data, update results and notify system software through DMA or an interrupt when the filter cycle is complete and another data sample may be received.

Analog Subsystem

An analog programmable subsystem can create application specific combinations of standard analog signaling blocks and advanced analog signal processing blocks. These blocks can be interconnected to each other, to any pin on the device or to digital and system components. This interconnectivity provides a high level of design flexibility and IP security. An analog programmable system may include, but are not limited to, the following features:
- a flexible, configurable analog routing architecture including analog globals, an analog multiplexor bus (MUX bus) and analog local buses,
- a high resolution delta-sigma ADC,
- DACs capable of providing voltage or current output,
- comparators with optional connections to configurable look-up table (LUT) outputs,
- configurable switched capacitor/continuous time (SC/CT) blocks,
- opamps for internal subsystem use and connection to GPIO,
- a capacitive sensing subsystem,
- voltage or current references,
- current sources and/or sinks,
- IO ports,
- temperature sensors, and
- optical sensors.

Figure 18:
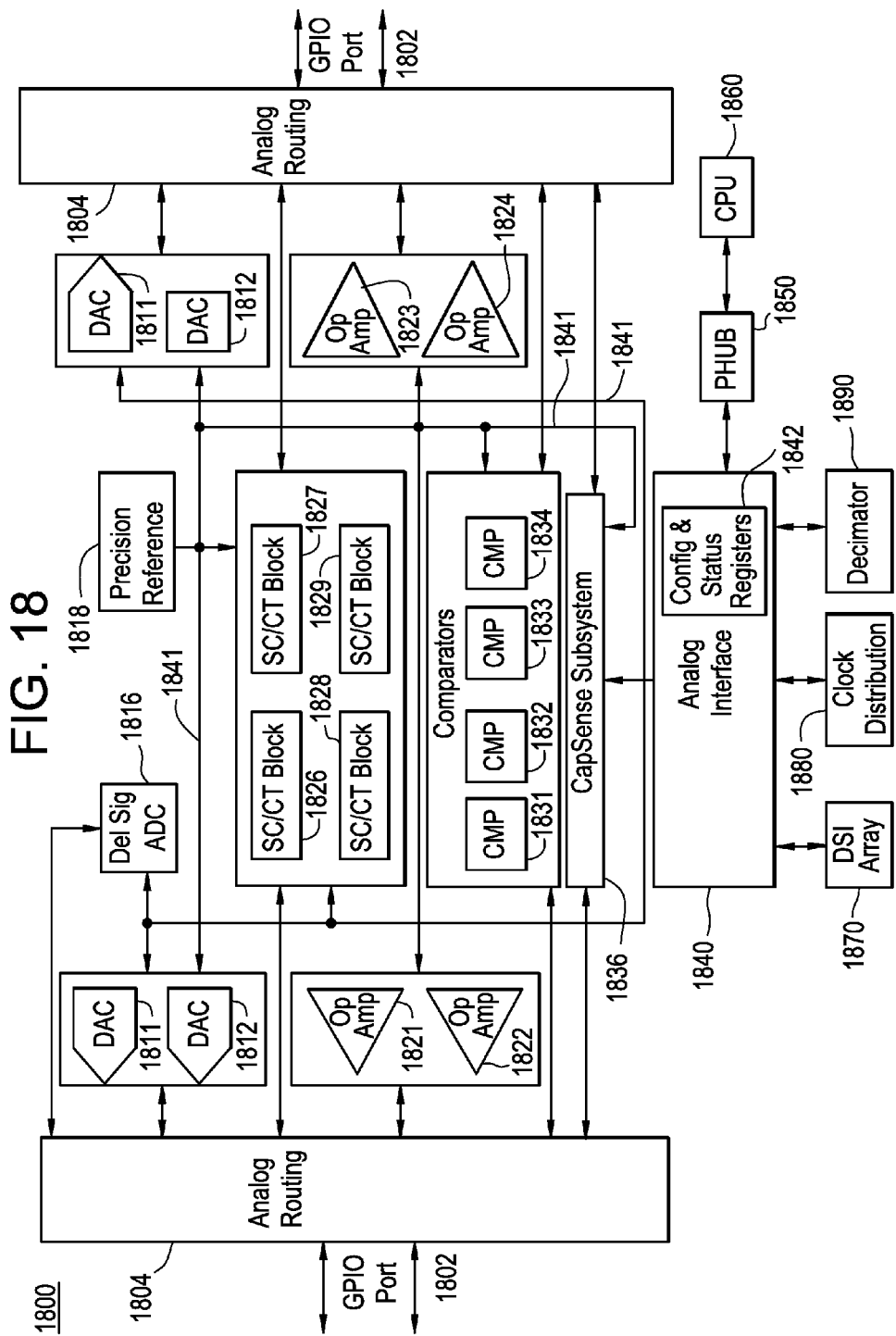
FIG. 18 illustrates a block diagram for an analog system of a core architecture according to an embodiment.

FIG. 18 illustrates a block diagram of one embodiment of an analog subsystem 1800 as may be seen in FIG. 1 (analog subsystem 120). The analog subsystem 1800 may include several banks of analog blocks such as DACs, opamps, comparators, switched-capacitor/continuous time functional blocks, delta-sigma analog-to-digital converters, precision references, and capacitive sensing channels signals to and from which may be routed to any part of the system (e.g., 100, FIG. 1) through a highly configurable analog interconnect. The analog interconnect may be controlled by several system elements including, but not limited to, an analog interface controller, a peripheral hub controller, a direct memory access controller a microprocessor, which may be part of a CPU subsystem (e.g., 140, FIG. 1), digital subsystem elements such as UDBs (e.g., 112, FIG. 1), or IOs. The configurable interconnect and the flexibility of its control (which may be achieved through any number of system components) allows for more flexible and faster signal processing while decreasing overall CPU overhead.

References and external signals may be routed to anywhere in the analog subsystem through a highly configurable analog interconnect which allows for a high number of possible references and connection of multiple references to different blocks, banks of blocks or channels.

GPIO Ports 1802 may be coupled to analog routing 1804. Analog routing 1804 may be coupled to DACs 1811-1814, DelSig ADC 1816, Opamps 1821-1824, SC/CT blocks 1826-1829, comparators (CMP) 1831-1834 and capacitive sensing (CapSense™) subsystem 1836. Precision reference 1818 may be coupled to DelSig ADC 1816. DACs 1811-1814, DelSig ADC 1816, precision reference 1818, opamps 1821-1824, SC/CT blocks 1826-1829, CMPs 1831-1834 and CapSense™ subsystem 1836 may be coupled to each other or to analog interface 1840 through internal analog routing 1841. Analog interface 1840 may include a configuration and status registers block 1842. Analog interface may be coupled to DSI array 1870, clock distribution block 1880, decimator 1890 and PHUB 1850. PHUB 1850 may be coupled to CPU 1860.

Figure 19:
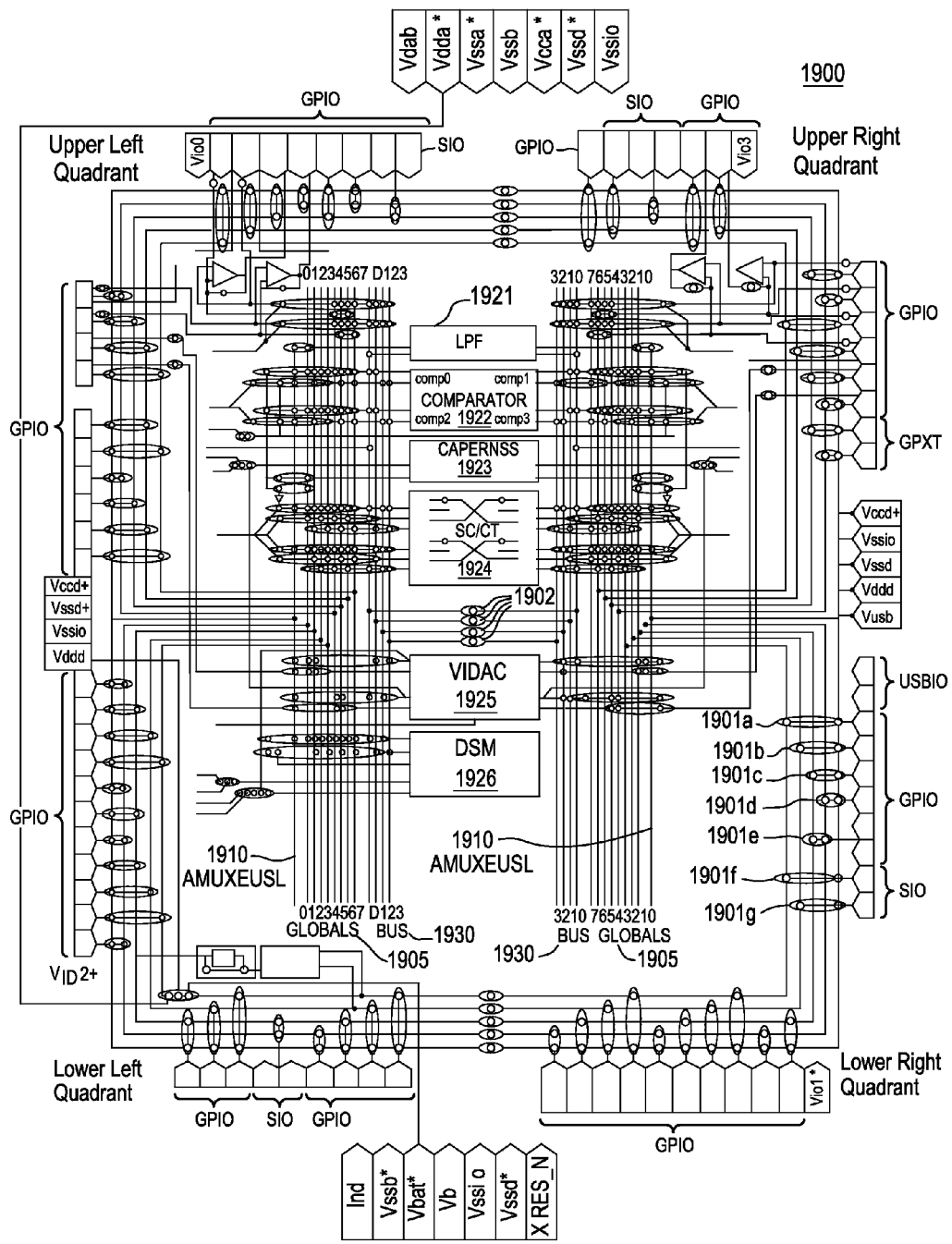
FIG. 19 illustrates an internal and external analog routing for an analog subsystem according to an embodiment.

FIG. 19 illustrates one embodiment of internal and external analog routing 1900, examples of which are shown in FIG. 1 (150) and FIG. 18 (1841). Analog routing 1900 exists as a series of buses, switches and MUXs that interwoven amongst the analog subsystem (e.g., 120, FIG. 1), which allows analog blocks, banks of blocks and channels to be connected to each other, to internal and external reference signals, to mixed-signal blocks (such as DACs) as well as to GPIO. Analog routing 1900 includes sixteen analog globals (AG) 1905 and two analog MUX buses (AMUXBUS) 1910. AGs and AMUXBUSes may connect GPIOs 1915 to analog functional blocks. Analog functional blocks may include a low-pass filter 1921, a comparator 1922, a capacitive sensing block 1923, SC/CT functional block 1924, a voltage/current digital-to-analog converter (VIDAC) 1925 and a DSM 1926. Each GPIO 1915 may be coupled to one AG 1905 and one AMUXBUS 1910. Each GPIO 1915 may be coupled to a corresponding AG 1905 through an analog switch 1901. Analog switches 1901 may be large or small. Large analog switches 1901 have lower Z. Small analog switches 1901 have higher Z. The AMUXBUS 1910 may be a shared routing resource connecting every GPIO 1905 through an analog switch 1901. Analog routing 1900 may also include eight analog local buses 1930 to route signals between different analog functional blocks 1921-1926. In one embodiment, there may be eight analog local buses 1930, four on the right side of the device and four on the left side of the device. Analog local buses 1930 from the right and left sides of the device may be coupled together through analog switches 1902. Analog routing 1900 may also include MUXes and switches for IO selection of the analog functional blocks. In one embodiment, analog routing 1900 may provide hierarchical routing to system components. In another embodiment, analog routing 1900 may allow for free, uncontrolled routing to system components.

Figure 20:
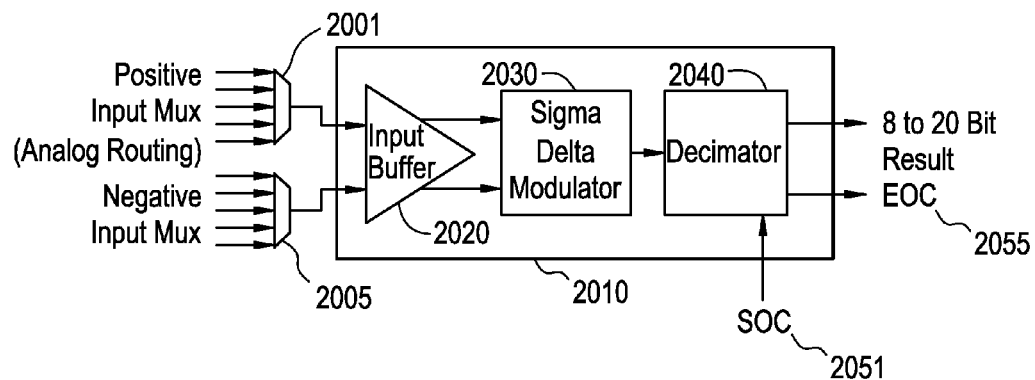
FIG. 20 illustrates a block diagram of a delta-sigma analog-to-digital converter according to an embodiment.

FIG. 20 illustrates a block diagram of one embodiment of a delta-sigma ADC 2000 shown in FIG. 18 (1816) and coupled to the analog interconnect 1841 (FIG. 18). Delta-sigma ADC 2000 is part of a the analog subsystem (e.g., 120, FIG. 1) and is capable of receiving signals from several sources including but not limited to GPIO, precision references, digital subsystem elements (e.g., 110, FIG. 1) and the DMA controller (e.g., 144, FIG. 1). Delta-sigma ADC 2010 includes an input buffer 2020, a delta-sigma modulator 2030 and a decimator 2040. Input buffer 2020 is coupled to internal and external buses input MUXes 2001 and 2005. The signals from input MUXes 2001 and 2005 may be coupled directly to delta-sigma modulator 2030 in one embodiment. In another embodiment, the signals from input MUXes 2001 and 2005 may be coupled to delta-sigma modulator 2030 through input buffer 2020, which eliminates load from the input of delta-sigma modulator 2030. In normal operations, delta-sigma modulator 2030 may oversample the input and generate a serial data stream output. The high-speed data stream may be passed through decimator 2040. Decimator 2040 may convert the high-speed serial data stream into parallel ADC results. Resolution and sample rate of delta-sigma ADC 2010 may be controlled through decimator 2040.

Delta-sigma ADC 2000 may be configured to operation in a plurality of modes. These modes may include: single sample, fast filter, continuous or fast FIR (average). Modes may be started by a write to a start bit in a control register or an assertion of the Start of Conversion (SOC) signal 2051. End of conversion (EOC) signal 2055 may assert high and remain high until the value is read by either the DMA controller or the CPU when the conversion is complete.

In single sample mode, delta-sigma ADC 2000 may perform one sample conversion on a trigger. In this mode, delta-sigma ADC 2000 remains in a standby state until SOC signal 2051 is asserted. When SOC signal 2051 is asserted, delta-sigma ADC 2000 may perform one sample conversion and capture the result. The system may poll a control register for status or configure the EOC signal to generate an interrupt or invoke a DMA request to detect the end of the conversion. When the conversion is complete, delta-sigma ADC 2000 may reenter the standby state where it says until another SOC event.

In continuous mode, delta-sigma ADC may be reset and then run continuously until stopped. This mode may be used when the input signal is not switched between sources and multiple samples are required.

In fast filter mode, back-to-back signals may be captured continuously and delta-sigma ADC 2000 reset between each sample. On completion of one sample, delta-sigma 2000 may be reset and another sample begun immediately. The results of the conversions may then be transferred using at least one of polling, interrupts or DMA request.

Fast FIR (average) mode may operate similar to fast filter mode, but without resetting the delta-sigma ADC 2000 between intermediate conversions. Fast FIR (average) mode may be used when decimation ratios greater than what is available from the standard ADC are required. For this mode, a post processor filter may be used to perform additional decimator to obtain resolutions greater than are natively available in the ADC.

Figure 21:
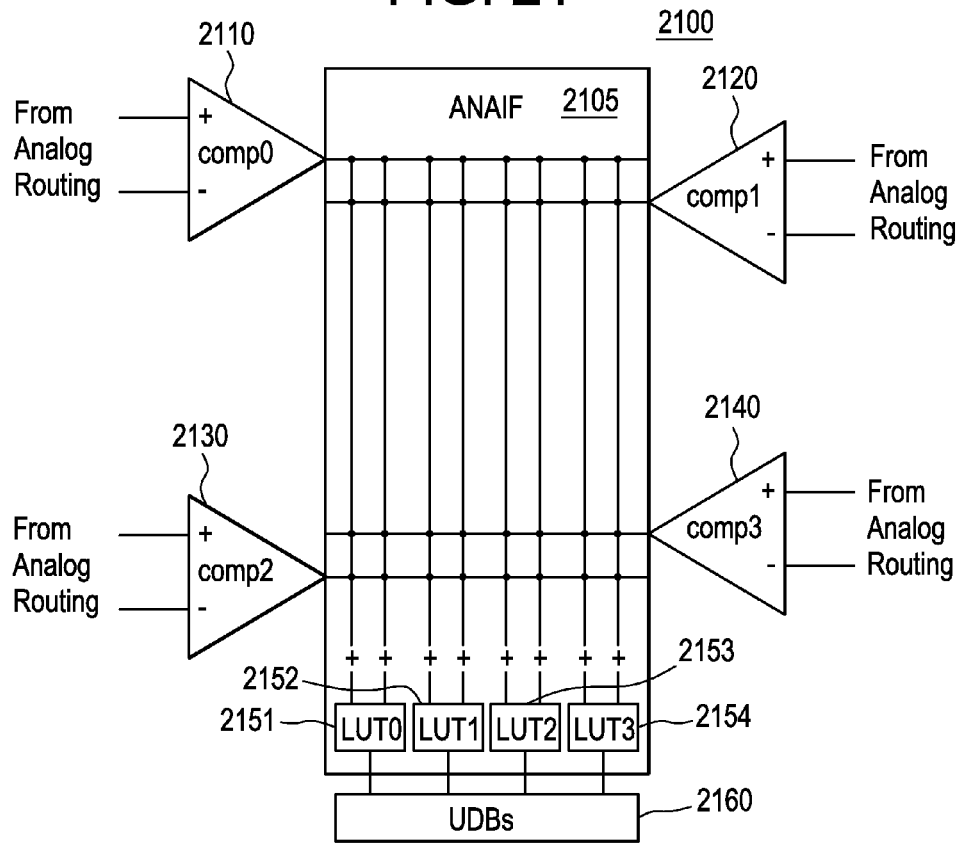
FIG. 21 illustrates four comparators of an analog subsystem to an embodiment.

FIG. 21 illustrates one embodiment of a comparator set 2100, or bank, of four analog comparators 2110, 2120, 2130 and 2140 coupled by their output to analog interface (ANAIF) 2105. Comparators 2110, 2120, 2130 and 2140 may be coupled to the reset of the analog subsystem shown in FIG. 18 or to the rest of the device through the analog interconnect shown in FIG. 19. The output of each comparator may also be routed anywhere on the device through the same programmable interconnect. In one embodiment, each comparator input and output is controlled by the DMA controller (144, FIG. 1) to offload the CPU (CPU 141). In an another embodiment, the comparator signals may be controlled by the analog interface controller 2105 and coupled to other analog subsystem elements such as low-pass filters (1921, FIG. 19) or to GPIO through the programmable interconnect shown in FIG. 19.

Each comparator (2110, 2120, 2130, 2140) has a positive and negative input that couples to the analog routing and an output that couples to analog interface (ANAIF) 2150, which includes LUTs 2151-2154. LUTs 2151-2154 may be two input, one output LUTs that are driven by any one or two of the comparators in the device. The output of LUTs 2151-2154 may be routed to UDBs 2160 through the DSI of the UDB array. From the DSI of the UDB array, signals from LUTs 2151-2154 may be coupled to UDBs, the DMA controller, IOs or the interrupt controller. In another embodiment, comparator outputs may be coupled to the UDBs without being routed through LUTs 2151-2154.

Figure 22:
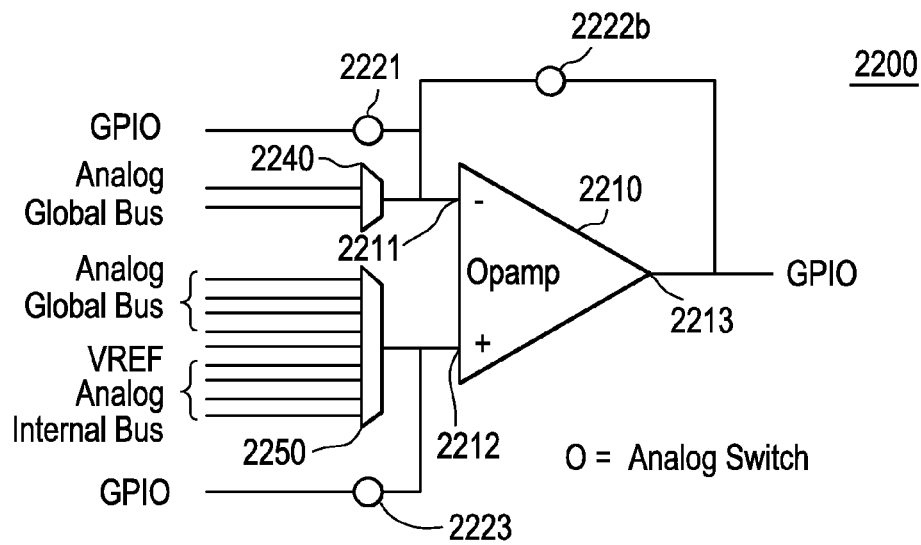
FIG. 22 illustrates an opamp of an analog subsystem according to an embodiment.

FIG. 22 illustrates one embodiment of an opamp circuit 2200. Opamp circuits are illustrated as part of the analog subsystem 1800 (FIG. 18) and may be coupled through their inputs or outputs to other analog subsystem components or to other system elements, shown in FIG. 1. Opamp circuit 2200 includes opamp 2210 having negative input 2211, positive input 2212 and output 2213. Negative input 2211 may be coupled to the output of MUX 2240 having inputs coupled to the analog global bus. Negative input 2211 may also be coupled to a GPIO through analog switch 2222. Positive input 2212 of opamp 2110 may be coupled to the analog global bus, a reference voltage (VREF), or the analog internal bus through multiplexor 2250. Positive input 2212 may also be coupled to a GPIO through analog switch 2223. The output 2213 of opamp 2210 may be coupled to a GPIO or to the negative input 2211 through analog switch 2221. Opamp 2200 may be an uncommitted analog resource and may be configured as a gain stage or voltage follower, or an output buffer on external or internal signals. Opamp speed modes may include, but not be limited to slow, low, medium and fast, which may set by writing to opamp control registers (not shown) by the CPU (e.g., 141, FIG. 1) or by the DMA controller (e.g., 144, FIG. 1). UDBs or other digital subsystem blocks may control and configure the opamp circuit 2200, but do so by invoking the DMA controller. Slow mode consumes the least amount of quiescent power and fast mode consumes the most power. The inputs may be able to swing rail-to-rail.

Figure 23A:
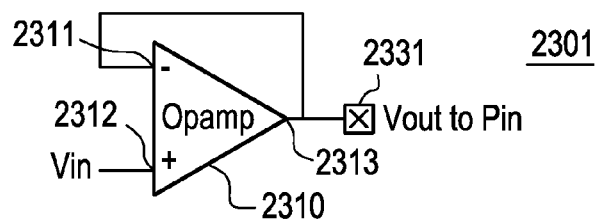
FIG. 23A illustrates an opamp configured as a voltage follower according to an embodiment.
Figure 23B:
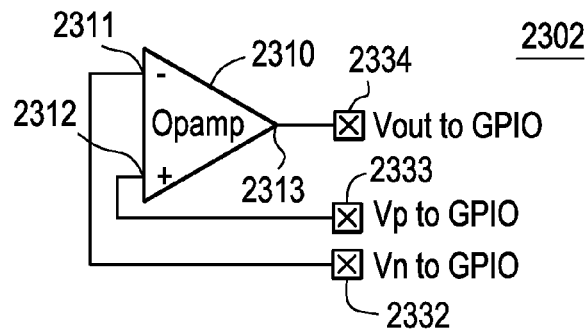
FIG. 23B illustrates an opamp configured as an external uncommitted opamp according to an embodiment.
Figure 23C:
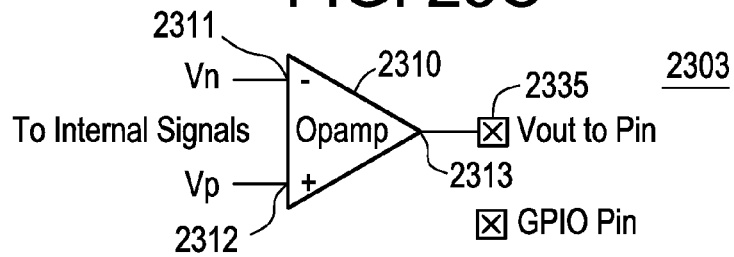
FIG. 23C illustrates an opamp configured as an internal uncommitted opamp according to an embodiment.

FIGS. 23A-C illustrate possible opamp configurations for opamp 2200 (FIG. 22). Opamps are configured to perform functions by setting registers that control switch operations and connections. These registers may be hard-coded during development or controlled by a number of system-level elements including, but not limited to the analog interface controller (FIG. 20), the CPU (e.g., 141, FIG. 1), UDBs (e.g., 945, FIG. 9), or the DMA controller (e.g., 144, FIG. 1). Opamp register settings and switches may be controlled through the analog interconnect shown in FIG. 19.

FIG. 23A illustrates an opamp configured as a voltage follower 2301 according to one embodiment. Opamp 2310 includes negative input 2311, positive input 2312 and output 2313. Positive input 2312 is coupled to a voltage input Vin. Output 2313 is coupled to a pin 2331 as an output voltage, Vout, and to negative input 2311.

FIG. 23B illustrates an opamp configured as an external uncommitted opamp 2302 according to one embodiment. Negative input 2311 is coupled to a negative voltage, Vn, through a GPIO 2332. Positive input 2312 is coupled to a positive voltage, Vp, through a GPIO 2333. Output 2313 is coupled to a pin 2334 as an output voltage, Vout.

FIG. 23C illustrates an opamp configured as an internal uncommitted opamp 2303 according to one embodiment. Negative input 2311 is coupled to an internal negative voltage, Vn. Positive input 2312 is coupled to an internal positive voltage, Vp. Output 2313 is coupled to a pin 2335 as an output voltage, Vout.

Figure 24:
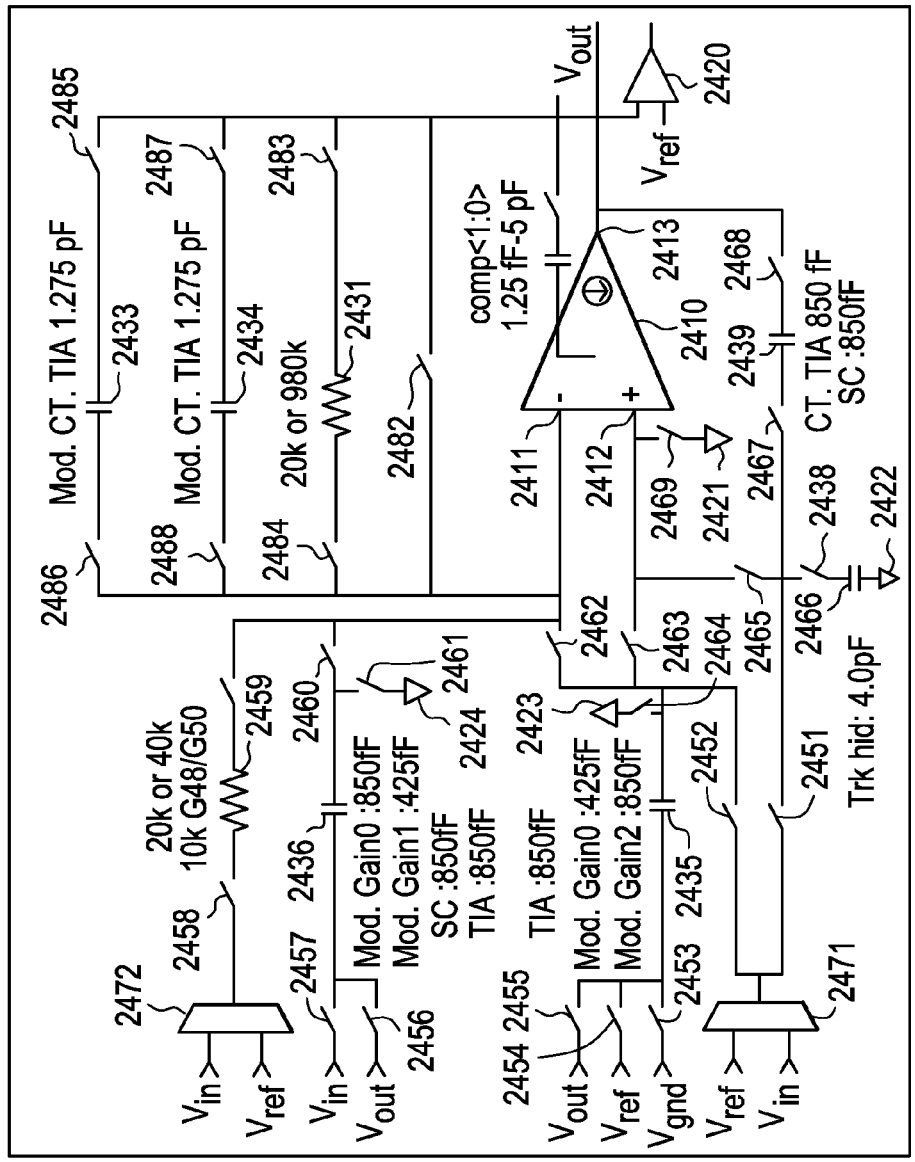
FIG. 24 illustrates a switched capacitor/continuous time (SC/CT) functional block according to an embodiment.

Internal and external opamps such as those illustrated by FIGS. 23B and 23C may be used to implement analog functions including inverting and non-inverting amplifiers, active filters, current and voltage sources, differential amplifiers, instrumentation amplifiers comparators and other analog functions with signals generated by the device itself or with signal generated by external components FIG. 24 illustrates one embodiment of the switched-capacitor/continuous time (SC/CT) functional block 2400, which is part of the analog subsystem 1800 (FIG. 18) and coupled to analog routing 1841 (FIG. 18), shown in FIG. 19. The SC/CT functional block is configurable to perform a number of analog functions which require either switched-capacitor operation, continuous time operation or both by controlling switches that route signals into and out of an opamp. These switches are controlled through register settings which may be written to by a number of sources including but not limited to the analog interface (FIG. 20), the DMA controller (e.g., 144, FIG. 1), the CPU (e.g., 141, FIG. 1) or the digital subsystem shown in FIG. 2.

The SC/CT functional block 2400 is built around a single rail-to-rail high bandwidth opamp 2410. Opamp 2410 includes a negative input 2411, a positive input 2412 and an output 2413. Capacitors 2433 and 2434 and variable resistor 2431 may be coupled to the negative input 2411 through switches 2486, 2488 and 2484 respectively. Capacitors 2433 and 2434 and variable resistor 2431 may be coupled to the output 2413 through switches 2485, 2487 and 2483 respectively. The output 2413 may be coupled to negative input 2411 through switch 2482. Output 2413 may be coupled to an output voltage, Vout, or to one input of comparator 2420. The other input of comparator 2420 may be coupled to a reference voltage, Vref. Output 2413 may be coupled to capacitor 2439 through switch 2468. Positive input 2412 may be coupled to ground through switch 2469. Positive input 2412 may be coupled to capacitor 2439 through switches 2465 and 2467, to capacitor 2438 through switches 2465 and 2466 or to the output of MUX 2471 through switch 2451. The input of MUX 2471 may be coupled to an input voltage, Vin, or a reference voltage, Vref. Capacitor 2438 may be coupled to ground. Positive input 2412 may be coupled to the output of MUX 2471 through switches 2463 and 2452, to ground through switches 2463 and 2464, or to capacitor 2435 through switch 2463. Capacitor 2435 may be coupled to an output voltage, Vout, a reference voltage, Vref, or a ground voltage, Vgnd, through switches 2455, 2454 or 2453, respectively. Negative input 2411 may be coupled to the output of MUX 2471 through switches 2462 and 2452, to ground through switches 2462 and 2464, or to capacitor 2435 through switch 2463. Negative output 2411 may be coupled to variable resistor 2432 through switch 2459 or to capacitor 2436 through switch 2460. Capacitor 2436 may be coupled to ground through switch 2461. Capacitor 2436 may be coupled to an input voltage, Vin, or an output voltage, Vout, through switches 2457 or 2456, respectively. Variable resistor 2432 may be coupled to the output of MUX 2472 though switch 2458. The input of MUX 2472 may be coupled to an input voltage, Vin, or a reference voltage, Vref.

The SC/CT functional block may use capacitors and switches to create switched-capacitor (SC) analog functions. These circuits operate by moving charge between capacitors by opening and closing switches. Non-overlapping clock signals control the switches so that not all switches are ON simultaneously. Opamp 2410 may also be connected to an array of resistors to allow constructions of a variety of continuous time (CT) functions. Opamp 2410, and associated capacitors, resistors and switches may be programmed to perform analog functions including but not limited to:

naked operational amplifier, continuous mode,
unity-gain buffer, continuous mode,
programmable gain amplifier (PGA), continuous mode,
transimpedance amplifier (TIA), continuous mode,
up/down mixer, continuous mode,
non-return-to-zero sample and hold mixer (NRZ S/H), switched capacitor mode, and
first order delta-sigma modulator for an analog-to-digital converter—switched capacitor mode.

To perform the naked opamp analog function, inputs 2411 and 2412 and output 2413 are configured for connection to internal or external signals. The opamp may have a unity gain bandwidth greater than 6 MHz and output drive current up to 650 uA, which is sufficient for buffering internal signals and driving external loads greater than 7.5 kohms.

The SC/CT functional block may be configured as a unity gain buffer using same configuration as may be used for the naked opamp analog function, with output 2413 coupled directly to an inverting input for a gain of 1.00. With this configuration, the SC/CT functional block will have −3 dB bandwidth greater than 6 MHz.

Figure 25A:
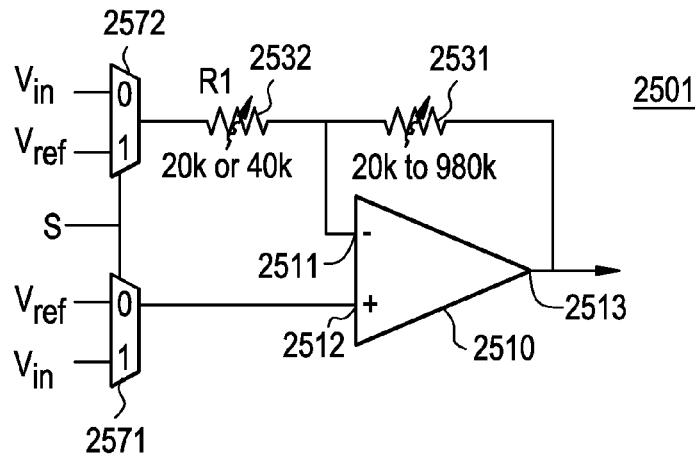
FIG. 25A illustrates a SC/CT functional block configured as a programmable gain amplifier (PGA) according to an embodiment.

FIG. 25A illustrates one embodiment of a PGA 2501 implemented by the SC/CT functional block shown in FIG. 24. Negative input 2511 of opamp 2510 is coupled between resistors R1 2532 and R2 2531, which are connected in series between the output of MUX 2572 and output 2513. Positive input 2512 is coupled to the output of MUX 2571. The gain of the PGA may switched from inverting and non-inverting by changing the shared select value, S, of both input MUXes 2571 and 2572. The gain may be adjusted by changing the values of R1 2532 and R2 2531.

Figure 25B:
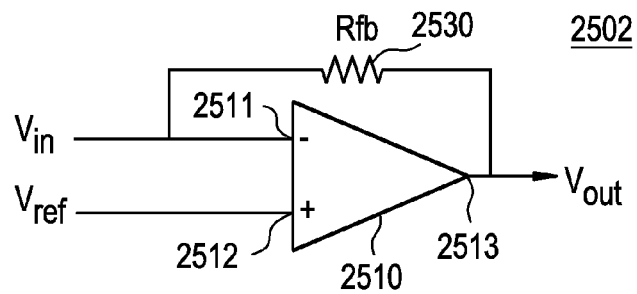
FIG. 25B illustrates a SC/CT functional block configured as a transimpedance amplifier (TIA) according to an embodiment.

FIG. 25B illustrates one embodiment of a TIA 2502 implemented by the SC/CT functional block shown in FIG. 24. Negative input 2511 of opamp 2510 is coupled to an input current, Iin, and output 2513 through resistor Rfb 2530. Positive input 2512 is coupled to a reference voltage, Vref.

Figure 25C:
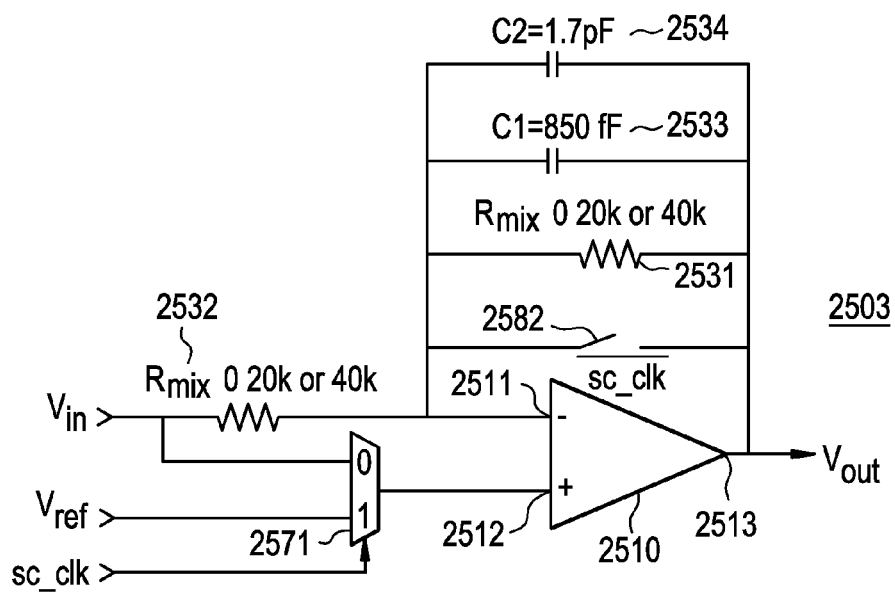
FIG. 25C illustrates a SC/CT functional block configured as a mixer according to an embodiment.

FIG. 25C illustrates one embodiment of a mixer 2503 implemented by the SC/CT functional block shown in FIG. 24. Negative input 2511 of opamp 2510 may be coupled to variable resistors 2532 and 2531 and capacitors C1 2533 and C2 2534. Negative input 2511 may also be coupled to output 2513 through switch 2582. Output 2513 may be coupled to the opposite side of variable resistors 2532 and 2531 and capacitors C1 2533 and C2 2534 and produce and output voltage, Vout. The side of resistor 2532 opposite negative input 2511 may be coupled to an input voltage, Vin, and to one input of MUX 2571. Another input of MUX 2571 may be coupled to a reference voltage, Vref. The output of MUX 2571 may be coupled to positive input 2512. MUX 2571 may be controlled buy a clock signal, sc_clk. Mixing applications contain an input signal frequency and a local oscillator frequency. The polarity of the clock alternates the amplifier between inverting or non-inverting gain. The output of the mixer is the product of the input and the switching function from the local oscillator, with frequency components at the local oscillator plus and minus the signal frequency and reduced-level frequency components at odd integer multiples of the local oscillator frequency.

Figure 26:
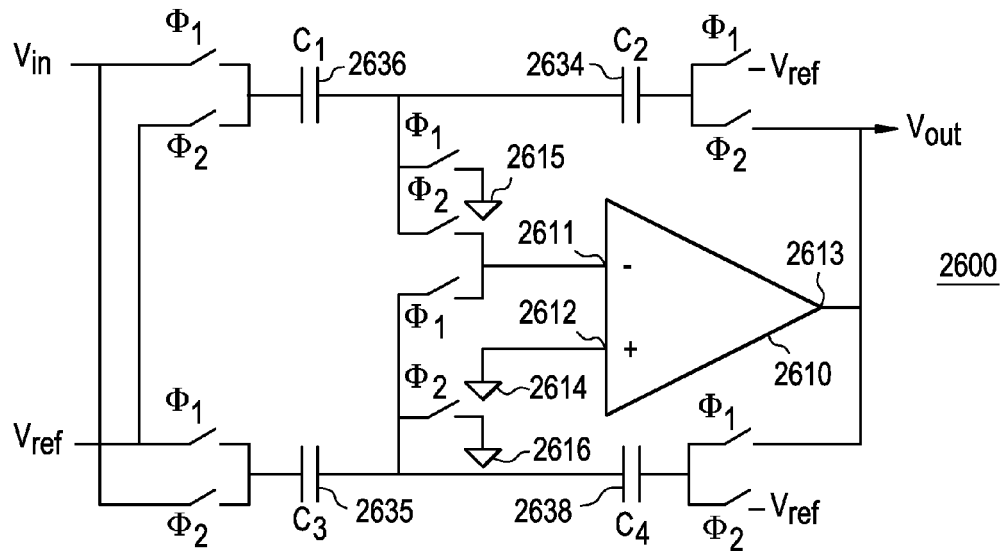
FIG. 26 illustrates a SC/CT functional block configured as a sample and hold according to an embodiment.

FIG. 26 illustrates one embodiment of a sample and hold 2600 implemented by the SC/CT functional block shown in FIG. 24. Positive input 2612 of opamp 2610 is coupled to ground. In a first phase, negative input 2611 is coupled between capacitors C3 2635 and C4 2638, which are in series. Also in a first phase, capacitor C1 2636 is coupled between an input voltage, Vin, and ground and capacitor C2 2634 is coupled between a reference voltage, Vref, and ground. Also in a first phase capacitor C3 2635 is couple between a reference voltage, Vref and negative input 2611 and capacitor C4 2638 is coupled between output 2613 and negative input 2611. In a second phase, capacitor C1 2636 is coupled between a reference voltage, Vref, and negative input 2611 and capacitor C2 is coupled between output 2613 and negative input 2611. Also in a second phase, capacitor C3 2635 is coupled between an input voltage, Vin, and ground and capacitor C4 2638 is coupled between a reference voltage, Vref, and ground. In some embodiments the first and second phases may be opposite phases of a clock.

In another embodiment, the SC/CT functional block may be configured as a mixer to down convert an input signal. This circuit may have a high bandwidth passive sample network that can sample input signals and hold those signals using the opamp 2600. The output frequency may be the difference between the input frequency and the highest integer multiple of the local oscillator that is less than the input.

In another embodiment, the SC/CT functional block may be configured as a first-order modulator by placing the SC/CT in an integrator mode and using a comparator to provide a feedback to the input. A reference voltage may then be either subtracted or added to the input signal. The output is then the output of the comparator and not the integrator in the modulator. The signal may then be downshifted and buffered and processed by a decimator to make a delta-sigma converter of a counter to make an incremental converter. The accuracy of the sampled data from the first-order modulator may be determined by several factors.

Figure 27:
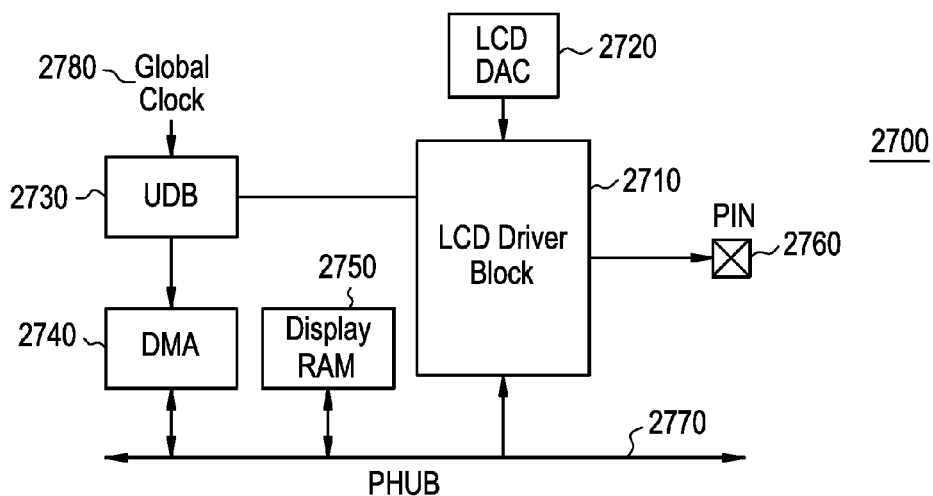
FIG. 27 illustrates a block diagram of an LCD subsystem according to an embodiment.

FIG. 27 illustrates a block diagram of an LCD system 2700 from FIG. 1 (121). The LCD system allows the system of FIG. 1 to perform analog, digital and mixed-signal processing and to display data on an LCD without a separate, external LCD controller, streamlining and simplifying design. LCD system may include an LCD driver block 2710 coupled to an LCD DAC 2720, a UDB 2730, PHUB 2770 and pin 2760. UDB 2730 may be coupled to global clock 2780, DMA 2740 and LCD driver block 2710. PHUB 2770 may be coupled to DMA 2740, display RAM 2750 and LCD driver block 2710. The LCD driver block may include at least one LCD segment pin driver, which is configured to buffer the appropriate output of the LCD DAC 2720 to drive the class of an LCD directly. A register setting may determine whether the pin is a common or a segment. The pin's LCD driver may then select a bias voltage to drive the IP pin, as appropriate for the display data. In some embodiments, there may be six bias voltages. In other embodiments, there may be more or less than six bias voltages. UDB 2730 may be configured to generate global LCD control signals and clocking. Signals may be routed to each LCD pin driver through a set of dedicated LCD global routing channels. In addition to generating the global LCD control signals, UDB 2730 may produce a DMA request to initiate transfer of the next frame of LCD data. LCD DAC 2720 may generate the contrast control and bias voltage for the LCD system 2700. LCD DAC 2720 may produce a variety of voltages, plus a ground voltage. In some embodiments, there may be five voltages from LCD DAC 2720. In other embodiments there may be more or less that five voltages. Bias voltages may be driven out to GPIO pins on dedicated LCD bias bus.

Figure 28:
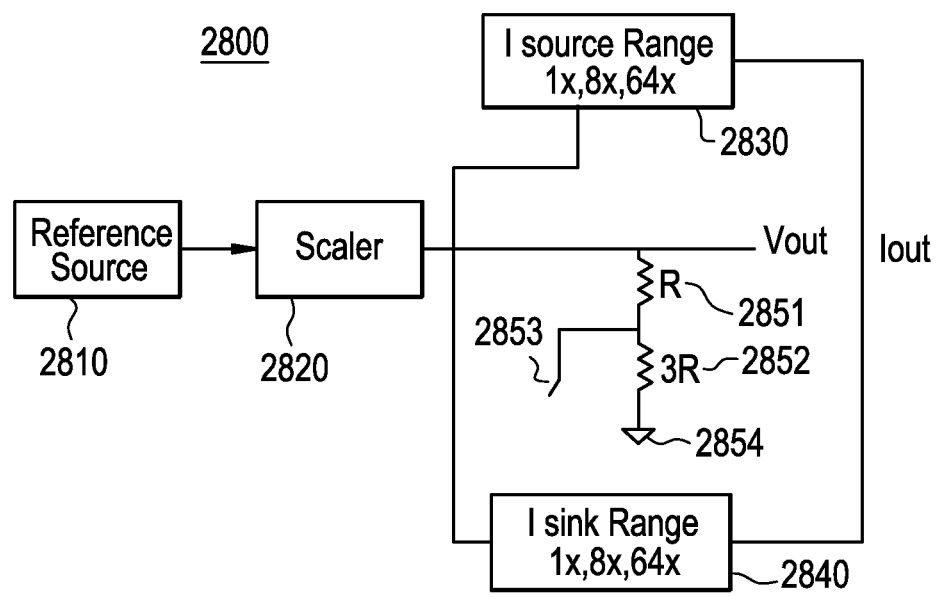
FIG. 28 illustrates a block diagram of a digital-to-analog converter (DAC) according to an embodiment.

FIG. 28 illustrates a block diagram of a DAC 2800. DAC 2800 may include a reference source block 2810 coupled to a scaler block 2820. The scaler block may be coupled to an Isource range block 2830, an Isink range block 2840 or an output voltage, Vout. A resistor network including resistors 2851 and 2852, switch 2853 and ground may be coupled in parallel to scaler block 2820 and Vout. DAC 2800 may be configured as either a current DAC (IDAC) or a voltage DAC (VDAC, not shown).

Figure 31:
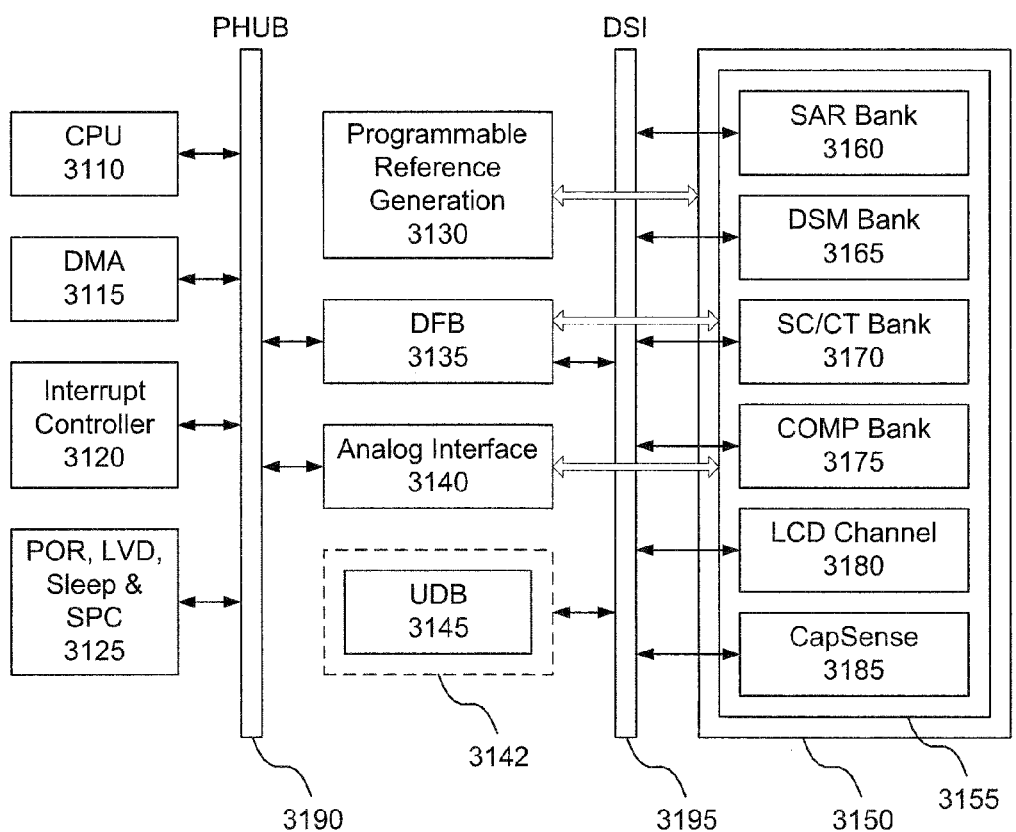
FIG. 31 illustrates a programmable analog subsystem according to an embodiment.

FIG. 31 illustrates another embodiment of a programmable analog subsystem 3100 (e.g., 120, FIGS. 1 and 1800, FIG. 18). CPU 3110, DMA 3115, Interrupt Controller 3120 and power block (POR, LVD, Sleep & SPC) 3125 are coupled to the PHUB, 3190. Also coupled to the PHUB 3190 are the DFB 3135 and analog interface controller 3140. DFB 3135 and a plurality of UDBs 3145, which are part of a USB array 3142, are coupled to the DSI 3195. DFB 3135 and analog interface 3140 are coupled to the analog subsystem 3155 which comprises a bank of SAR DACs 3160, a bank of DSMs 3165, a bank of SC/CT functional blocks 3170, a bank of comparators 3175, and LCD channel 3180 and a capacitive sensing (CapSense™) channel 3185. SAR DAC bank 3160, DSM bank 3165, SC/CT bank 3170, COMP bank 3175, LCD channel 3180 and CapSense channel 3185 may be coupled to DSI 3195. A programmable reference generation block 3130 may be coupled to the analog subsystem 1350.

Reconfigurable routing of the analog subsystem allows IOs to be routed to any analog resource as a bank of functions (DAC, comparators, SC/CT functional blocks, opamps, etc.). Additionally, reconfigurable routing of the analog subsystem may allow intra-block routing or intra-channel routing for specific functions (DAC, comparators, SC/CT functional blocks, opamps, etc.). The reconfigurable routing may be controlled by the microprocessor (CPU), the DMA, register interfaces or by programmable digital logic. In one embodiment, UDBs may be configured to provide the programmable digital logic that controls the analog reconfigurability.

Signal processing characteristics of analog and mixed-signal blocks, banks (of blocks) or channels may be controlled by programmable digital logic regardless of their type. For example, an ADC and a comparator, which are not part of the same analog block or bank or channel may be reconfigured to output or process signals by the same control element, such as a UDB or DMA controller.

Data and clock signals from analog and mixed-signal blocks, banks or channels may be routed on-chip to other analog and mixed signal blocks, banks or channels or to digital subsystem components to extend the signal processing capability of the device. For example a digital filtering of an ADC output, spread spectrum clocking and clocking with variable jitter may be accomplished by routing analog and mixed-signal outputs through the programmable interconnect to other on-chip elements.

Additionally, analog and mixed-signal blocks, banks and channels may be controlled synchronously or asynchronously by digital signals from the clocking or digital subsystems through the analog routing (shown in FIG. 19).

Memory Subsystem

Core architecture 100 (FIG. 1) may include a memory subsystem including static RAM (e.g., 137, FIG. 1), flash program memory (e.g., 139, FIG. 1), EEPROM (e.g., 136, FIG. 1), and an external memory interface (e.g., EMIF, 138, FIG. 1). Static RAM may be used for temporary data storage and may be accessed by the CPU (e.g., 141, FIG. 1) or the DMA controller (e.g., 144, FIG. 1). Access to static RAM may be accessed by the CPU or the DMA controller at different times or simultaneously.

Figure 29:
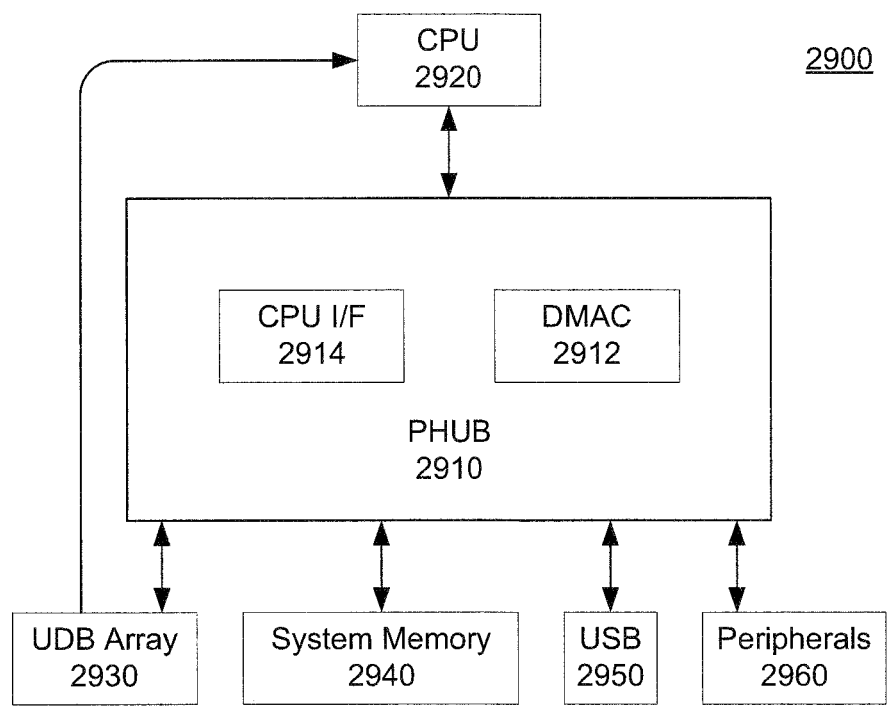
FIG. 29 illustrates a block diagram of a DMA in-system according to one embodiment.

FIG. 29 illustrates a block diagram of a DMA controller 2912 in a system 2900 according to one embodiment. The DMA controller (e.g. 144, FIG. 1) is part of the CPU subsystem (e.g., 140, FIG. 1) or be a separate, independent function, but access the memory subsystem to configure programmable analog and digital resources as well as to route signals from one system element to another without increasing CPU bandwidth overhead. The DMA may be invoked by the interrupt controller, by elements of the digital subsystem or by the CPU (e.g., 141, FIG. 1).

DMA controller 2912 and a CPU interface (CPU I/F) 2914 are part of a peripheral hub (PHUB) 2910. PHUB 2910 may be coupled to the UDB array 2930 shown in FIG. 2, the memory subsystem (e.g., 135, FIG. 1), the USB controller 2950 or other system peripherals 2960, which may include elements of the analog subsystem (FIG. 18), the digital subsystem (FIG. 2) or system-wide resources (e.g., 160, FIG. 1). The DMA controller 2912, through the PHUB 2910 may be coupled to the CPU 2920 (e.g., 141, FIG. 1), which may also receive signals from the UDB array 2930.

Flash memory provides nonvolatile storage for user firmware, user configuration data, bulk data storage and optional error correcting code (ECC). In some embodiments, flash space may be allocated to ECC specifically. In other embodiments, the flash space allocated to ECC may be reallocated to other flash memory functions when not used for ECC. ECC may correct and detect errors in firmware memory. In some embodiments an interrupt may be generated when an error is detected.

Programming of flash memory may be performed through a special interface and preempt code execution out of flash memory. The flash programming interface may perform flash erasing, programming and setting code protection levels. Flash in-system serial programming (ISSP), typically used for production programming, may be possible through both the SWD and JTAG interfaces. In-system programming, typically used for bootloaders, may be completed through interfaces such as I2C, USB, UART, SPI or other communication protocols. Flash memory may include a flexible flash protection model that prevents access and visibility to on-chip flash memory. The flash protection module may prevent duplication or reverse engineering of proprietary code.

EEPROM memory may be a byte addressable nonvolatile memory. Reads from EEPROM may be random access at the byte level. Reads may be completed directly; writes may be completed by sending write commands to an EEPROM programming interface. CPU code execution may continue using programs stored in flash memory during EEPROM writes. EEPROM may be erasable and writeable at the row level. In some embodiments, EEPROM may be divided into 128 rows of 16 bytes each. In other embodiments, EEPROM may be divided into more or fewer rows or more or fewer bytes.

Figure 30:
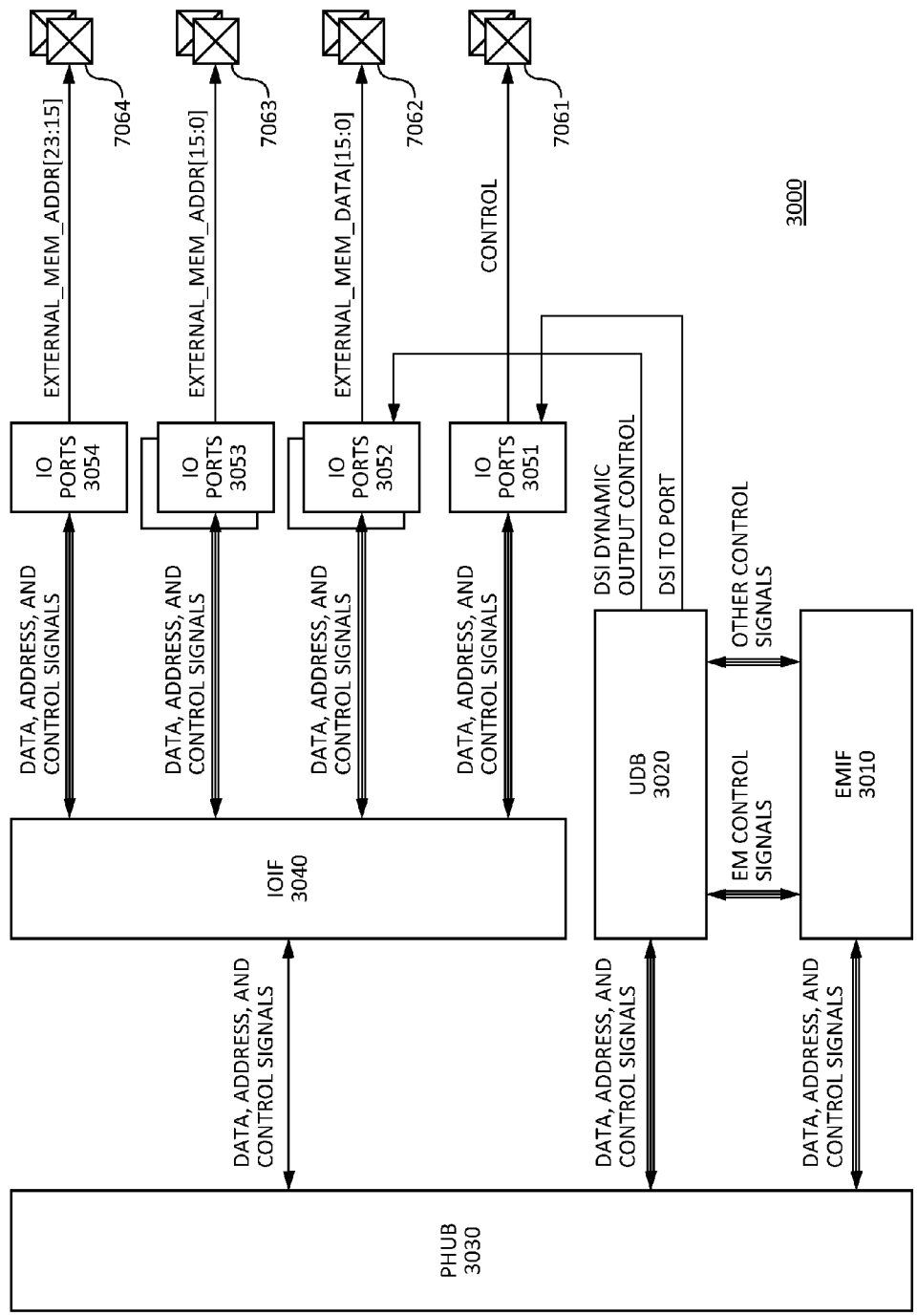
FIG. 30 illustrates an external memory interface (EMIF) according to an embodiment.

FIG. 30 illustrates one embodiment of an EMIF 3010 in a system 3000. EMIF 3010 is coupled to a UDB 3020 for sending and receiving of EM control signals and other control signals. EMIF 3010 is coupled to PHUB 3030 for sending and receiving data, address and control signals. PHUB 3030 is coupled UDB 3020 for sending and receiving data, address and control signals. PHUB 3030 is coupled to IO interface (IO IF) 3040 for sending and receiving data, address and control signals. IO IF 3040 and UDB 3030 (through the DSI) are coupled to IO ports 3051 for connection to pin 3061 for control. IO IF 3040 and UDB 3030 (through DSI dynamic output control) are coupled to IO port 3052 for connection to pin 3062 for control for external memory data. IO IF 3040 is coupled to IO port 3053 for connection to pin 3063 for control for external memory addressing. EMIF 3010 may allow read and write accesses to external memories. EMIF 3010 may support synchronous and asynchronous memories, and may support either one type of memory at a time or both simultaneously.

Clocking Subsystem

The clocking subsystem of the core architecture generates, divides and distributes clocks through the system. Internal and external clocks allow for optimized accuracy, power and cost. All or some system clock sources may be used to generate clock frequencies determined by the application requirements with clock dividers and UDBs. Clock generation may be automatically configured through a development environment, such as the PSoC Creator™ IDE graphical interface distributed by Cypress Semiconductor Corporation (San Jose, Calif.).

Figure 32:
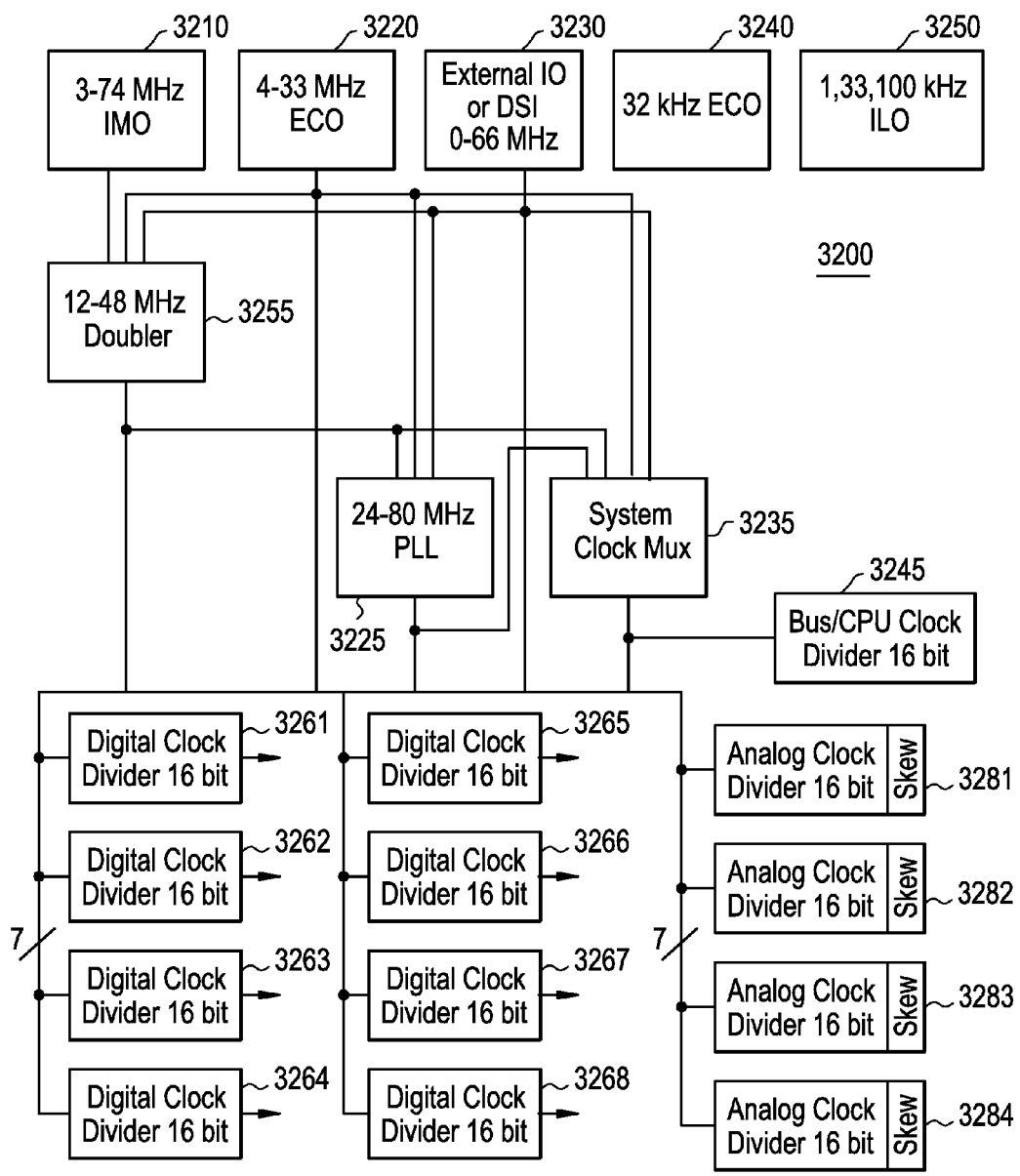
FIG. 32 illustrates a clocking subsystem of core architecture according to an embodiment.

FIG. 32 illustrates one embodiment of the clocking subsystem 3200, also shown in FIG. 1 (161). Clocking subsystem may include IMO 3210. IMO 3210 may output a stable clock and may operate with no external components. IMO 3210 may be locked to an external frequency, such as a USB signaling frequency, an RS232 bit period, and I2C clock or other externally provided signals of known frequency, period or duration. IMO 3210, in conjunction with PLL 3225 may allow generation of CPU and system clocks up to the device's maximum frequency. High-speed external crystal oscillator (ECO) 3230 provides a high-frequency, high-precision clock using an external crystal. Oscillator 3230 may support a number of crystal types within a specified range. When used in conjunction with PLL 3225, oscillator 3230 may generate CPU and system clocks up to the device's maximum frequency. DSI 3232 provides routing or clocks taken from external clocks connected to IO or generated within the device in the digital system or UDBs. In some embodiments, the primary DSI clock may provide access to all clocking resources and up to eight other DSI clocks, which may be generated internally or externally. Access to clocking resources may be used by system resources to achieve digital, analog or mixed-signal functions which require clocking to control switches, provide reference signals for timers and counters, and process signals from ADCs and DACs. In other embodiments, the primary DSI clock may be routed directly to digital clock dividers 3261-3268. While eight digital clock dividers are shown, it would be obvious to one of ordinary skill in the art to implement more or fewer clock dividers. Low-speed ECO 3240 provides precision timing with minimal power consumption using an external watch crystal for on-chip clocking resources are not low enough power or high enough precision for an application. The Low-speed ECO 3240 may also coupled to the sleep timer directly and provide the source for a Real Time Clock (RTC). Low-speed ECO may operate in two power modes, high or low, which allows for lower power consumption or greater noise immunity from neighboring circuits, depending on the application requirements. Low-speed ECO power modes are set by the CPU in run-time or during development by setting associated registers. Internal low-speed oscillator (ILO) 3250 provides clock frequencies for low power consumption, including a watchdog timer (WDT) and a sleep timer. In some embodiments, ILO 3250 may generate three different clocks. In other embodiments, ILO 3250 may generate more or less than three clocks. A central timewheel (CTW) of the device may be the free-running counter clocked by the ILO. The CTW may be enabled unless the device is in hibernate mode or when the CPU is stopped during debug on chip mode. The CTW may be used to generate periodic interrupts for timing purposes or to wake the system from a lower power mode. The CTW may be reset using firmware by writing to a reset register of the clocking subsystem. PLL 3225 allows low-frequency, high-accuracy clocks to be multiplied to higher frequencies for applications that require clock frequencies higher than what are native to the clocking subsystem 3220. PLL 3225 provides a mechanism for generating clock frequencies based upon a variety of input sources. PLL 3225 has input and feedback dividers that supply enough discrete ratios to create almost any desired system clock frequency and may be configured to use a clock from the IMO 3210, high-speed ECO 3220 or DSI 3230. Clock doubler 3225 may output a clock at twice the frequency of the input clock for easy doubling of clock signals for higher frequency applications. In one embodiment, clock doubler is configured to use a clock from IMO 3210, high-speed ECO 3220, or DSI 3230. System clock MUX 3235 selects and supplies the fasted clock in the system for general system clock requirements and clock synchronization of the device. This ensures that the device is running at its fastest for the selected power mode. If a higher clock source that what is active is available, the system clock MUX 3225 changes the clocking input for the system to the faster clock source. Bus clock divider 3245 uses the system clock MUX output to generate the system's bus clock used for data transfers and by the CPU. Fully programmable digital clock dividers 3261-3268 may generate digital subsystem clocks for general use in the digital system, as configured by design requirements. Digital subsystem clocks may generate custom clocks derived from any of the clock sources for any purpose. In some embodiments, purposes that may require clocks generated by the digital clock dividers 3261-3268 may include baud rate generators, accurate PWM periods, timer clocks or other digital functions. For applications that require more digital clock dividers than are available, UDBs and fixed function timers, counters or PWMs may generate clocks for use by the digital subsystem. Analog clock dividers 3281-3284 may generate clocks for analog system components that require clocking. Analog clock dividers 3281-3284 may include skew control to ensure that critical analog events do not occur simultaneously with digital switching events, which may reduce analog system noise.

Figure 33:
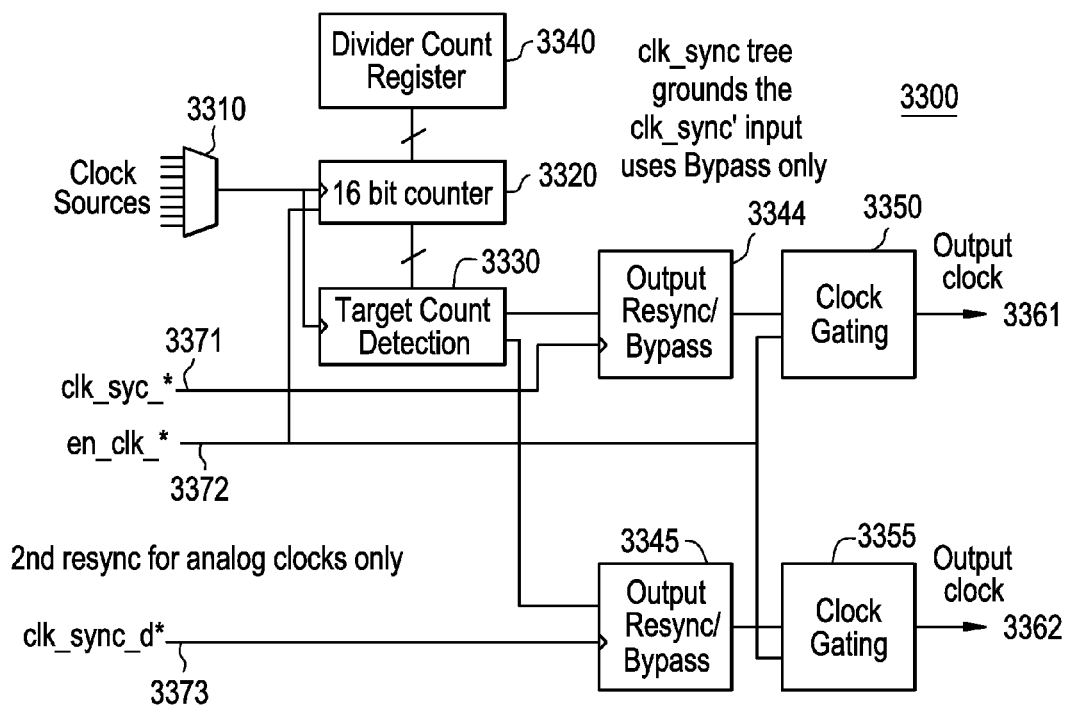
FIG. 33 illustrates a block diagram of a clock divider according to an embodiment.

FIG. 33 illustrates a block diagram of one embodiment of a clock divider 3300 (3261-3268, FIG. 32). Clock sources 3301 are coupled to the inputs of MUX 3310. The output of MUX 3310 is coupled to the counter block 3320 and target count detection block 3330. Divider count register block 3340 is coupled to counter block 3320. Target count detection block 3330 is coupled to output resync/bypass blocks 3340 and 3345. Clk_sync_* signal 3371 is coupled to output resync/bypass block 3340. Clk_sync_d* signal 3373 is coupled to output resync/bypass block 3345. Output resync/bypass block 3340 and en_clk_* signal 3372 is coupled to counter block 3320 and clock gating blocks 3350 and 3355. Clock gating blocks 3350 and 3355 have output clock signals clk_a*3361 and clk_ad* 3362. In one embodiment, digital clock divider 3300 may consist of a multiplexer, a clock divider (which may divide by 2 and higher) that generates clocks with a duty cycle, system clock resynchronization logic and deglitch logic. In one embodiment, the duty cycle may be approximately 50%. In other embodiments, the duty cycle may be substantially more or less than 50%. The outputs from each digital clock tree may be routed into the DSI and brought back into the clock system as an input, allowing clock chaining.

A USB clock domain shown in FIG. 15 (1540) may operate substantially asynchronously from the main clock network shown in FIGS. 32 and 33. This allows USB communication to run at the bus frequency without burdening the rest of the system generally or the CPU and clocking subsystem specifically. USB logic may contain a synchronous bus interface to the chip, while running on an asynchronous clock to process USB data. USB logic may require a specific clock frequency, which can be generated from several sources including the DSI clock though a multiple of the IMO (e.g., 3210 FIG. 32) a DSI signal or an external crystal oscillator.

Power Management Subsystem

The power management subsystem is used to power internal circuits in different power modes and to regulate the external supply. The power management system, with proper control from a power manager, keeps the appropriate domains powered in different power modes to achieve the lowest possible current for required device operation.

Figure 34:
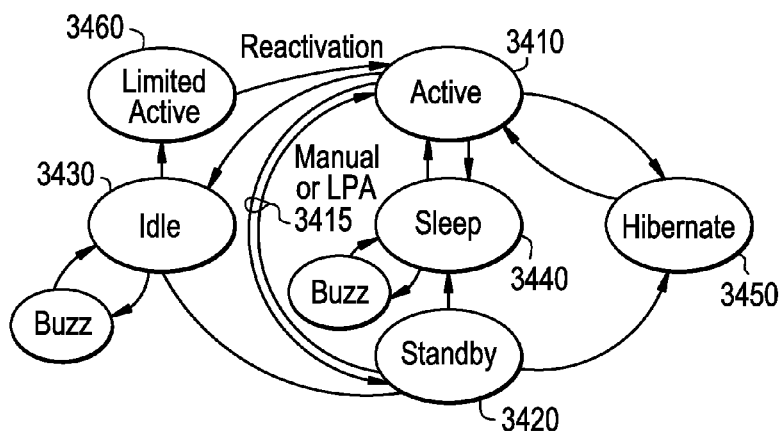
FIG. 34 illustrates a state diagram for power modes that may be implemented by a power management subsystem of a core architecture according to an embodiment.

FIG. 34 illustrates a state diagram for power modes that may be implemented and managed by the power management system. Power modes are entered and exited based on power and processing requirements of the application. Power modes may be controlled by the CPU based on program execution or may be controlled by an external controller through writing to registers within the power subsystem. Active 3410 and standby 3420 may be the main processing modes for standard device operation. A hybrid mode called low power active (LPA) 3415 may use the ILO and IMO to enable automatic, duty-cycled alternation between active and standby modes. Idle 3430, sleep 3440 and hibernate 3450 may be used when the system is expected to not require active mode for an extended period of time. Limited active 3460 may be a transitional mode that allows early access to a limited subset of device capabilities and resources, while certain areas are the chips are enabled in a startup sequence.

Each power controllable subsystem may be enabled or disabled using power configuration settings. Power configuration settings may indicate which subsystems are enabled during different modes. In one embodiment, the power configuration settings may include bits for active and standby mode, which configure different sets or subsets of subsystems to be enabled. Idle, sleep and hibernate modes may disable all subsystems regardless of the configuration settings in one embodiment. In another embodiment, idle, sleep and hibernate modes may have still different sets of subsystems enabled. Subsystems may be marked as unused to prevent them from resuming from idle, hibernate or sleep mode. This may reduce power overhead of device wake-up by not powering up unused subsystems. Available subsystems may be automatically and dynamically enabled and disabled whenever the configuration settings are updated or a global power mode changes. Global power mode changes are affected by a wake up event or register write. A wake up event may automatically return the device to active mode and enable the CPU, regardless of the configuration settings. Active mode may be the default global power mode on boot. In other embodiments, a wake up event may automatically return the device to a mode different from active mode. In such embodiments, the mode may be a transitional mode that is entered long enough to determine the correct power mode.

Hibernate mode may be used to maintain power to limited static RAM, retention registers and a bare minimum of logic during low-power domain. The same elements that are maintained in hibernate may be maintained in sleep mode with the addition of the ILO, low-speed crystal oscillator and the central timewheel. Standby and LPA modes may configure the device to have its LDOs ON, but at low frequency or clock-gated. This creates low current load on the LDOs, though the LDOs are capable of handling a high-current load instantaneously. In one embodiment, one LDO may be operational, while the other is not, but its operation gated by a wakeup event to the first LDO.

Wakeup events may be configurable and may come from an interrupt, and external wakeup source, an LPA scheduler or a reset. A wakeup event restores the system t active mode. Interrupt sources for wakeup events include: user interrupts, watchdog timer (WDT) and the central timewheel (CTW). User interrupt sources may be programmable in firmware and can be generated from a variety of device peripherals, such as analog comparators and UDBs. The CTW may provide periodic interrupts to produce wakeup events, poll peripherals or perform real-time functions. External wakeup sources may include PICUs, comparators and test controller wakeups. An LPA scheduler may issue automatic wakeup events.

Resets may be generated to reset the device to a desired power mode. Reset event sources may include: dedicated external resets, configurable external resets, precision resets and a watchdog reset (WDR). Imprecise resets (IRESs) may be disabled during boot, causing them to be unavailable as a valid wakeup source. Other reset sources include an external reset (XRES), software reset (SRES) and watchdog timer reset (WRES). XRES may be through a general purpose IO pin or a dedicated XRES pin. Such a pin, if configured holds the device in reset while in a pin state. In one embodiment the state that maintains the device in reset is active low. The response to an XRES is the same as a power-on reset (POR). SRES may be initiated by a bit of a software reset register. The bit of the software reset register may be set directly by the program during operation of indirectly through DMA access. The response to an SRES is the same as a POR. WRES detects when the device program is no longer being executed properly. In one embodiment the device program runs a function to indicate to the WDT that it is running correctly. Failure to do so within a specified amount of time may indicate faulty operation of the device program and instigates a SRES.

Table 1 illustrates possible interrupts, resets, clocks and wakeup sources for each power mode according to one embodiment.

TABLE 1

Interrupt and Clock Sources by Power Mode

| Mode | Wakeup Source | Reset | Clocks |
|---|---|---|---|
| Active | External, RTC, CTW, FTW, User, Reset | All | IMO, ILO/ECO, User |
| LPA | External, RTC, CTW, FTW, User, Reset | All | IMO (cycled), ILO/ECO, User |
| Standby | External, RTC, CTW, FTW, User, Reset | All | IMO (optional), ILO/ECO, User |
| Idle/Sleep | External, RTC, CTW, Reset | External, Hibernate, WDR | ILO/ECO |
| Hibernate | External, Reset | External, Hibernate | — |

Figure 35:
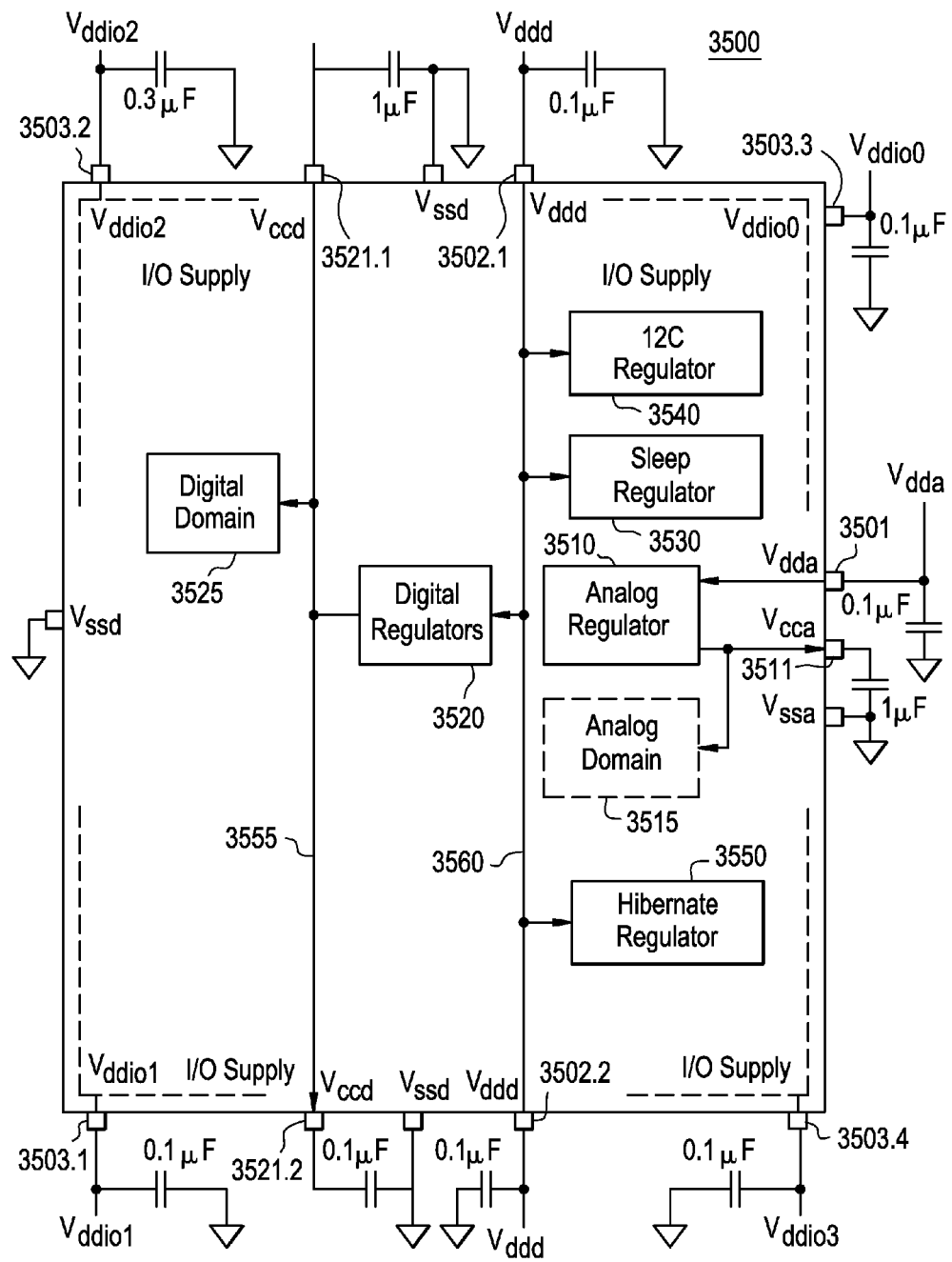
FIG. 35 illustrates a block diagram of a power subsystem of a core architecture according to an embodiment.

FIG. 35 illustrates a block diagram of power management subsystem 3500 from FIG. 1 (171). Power management subsystem 3500 includes analog, digital and IO supply pins 3401, 3402.1-3402.2 and 3403.1-3404.3, respectively. Analog regulator 3510 is coupled to analog supply pin 3501 and to analog power output pin 3511. Analog regulator 3510 supplies power to the analog domain 3515. Digital regulator 3520 is coupled to digital supply pins 3502.1-3502.2 and to digital power output pins 3521.1-3521.2. Digital regulator 3520 supplies power to digital domain 3525. Digital supply pins 3502.1-3502.2 supply power to sleep regulator 3530, I2C regulator 3540 and hibernate regulator 3550.

Figure 36:
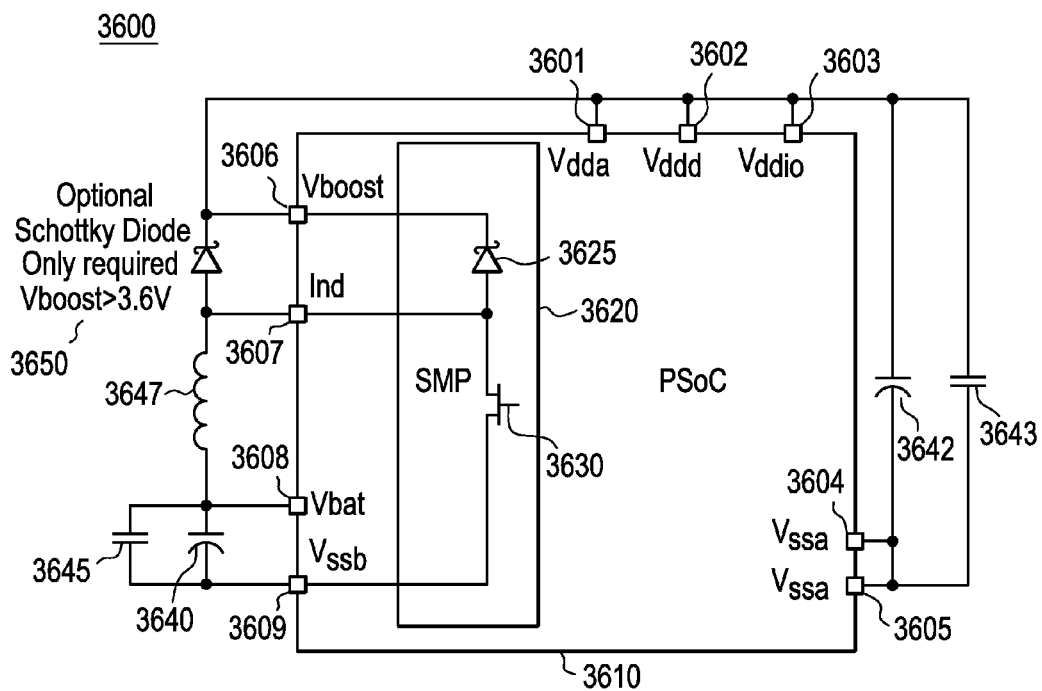
FIG. 36 illustrates a boost converter of a power subsystem according to an embodiment.

FIG. 36 illustrates a boost converter 3600 as part of the power management subsystem (e.g., SMP 175, FIG. 1) according to one embodiment. Though not shown, one of ordinary skill in the art would understand that a buck converter could also be implemented as part of the power management subsystem. Boost converter may be used to provide power to the system when the available voltage is below the systems operational voltage. Boost converter 3600 includes the device 3610. Device 3610 includes Vdda pin 3601, Vddd pin 3602 and Vddio pin 3603 which are all coupled to Vboost pin 3606. Capacitors 3642 and 3643 are coupled between includes Vdda pin 3601, Vddd pin 3602 and Vddio pin 3603 collectively and Vssa pin 3605 and Vssd pin 3604, respectively. Schottkey diode 3648 is coupled between Vboost pin 3606 and Ind pin 3607. Inductor 3647 is coupled between Ind pin 3607 and Vbat pin 3608. Battery 3645 and capacitor 3640 are coupled in parallel between Vbat pin 3608 and Vssb pin 3609. Schottkey diode 3625 is coupled between Vboost pin 3606 and Ind pin 3607 as part of SMP circuit 3620. Vssb pin 3609 is coupled to one electrode of SMP transistor 3630, which is part of SMP circuit 3620. The input of Schottkey diode 3625 is coupled to a second electrode of SMP 3630.

The boost converter of the core architecture may be used to boost the supply voltage from lower supply levels to the device operational voltage. The boost converter may accept a lower input voltage and produces a selectable output voltage using an external inductor, sourcing enough current to operate the device and other on-board components. In one embodiment, the boost converter may accept voltages between 0.5V and 5.5V and output a user configurable output voltage of 1.8V to 5.0V and deliver up to 50 mA.

The boost converter may be operated in two modes set by writing to registers by the CPU or DMA controller: active and standby, according to one embodiment. Active mode is the normal mode of operation where the boost regulator actively generates a resulted output voltage. In standby mode, most boost functions are disabled, which may reduce power consumption of the boost circuit. The booster converter may be configured to provide low power, low current regulation in standby mode. In another embodiment, an external 32 kHz crystal may be used to generate inductor boost pulses on the rising and falling edges of the clock when the output voltage is less than the programmed value.

Input/Output (IO)

Device IOs may possess both analog and digital capabilities and be capable of supporting a number of drive modes. IO may be in one of three categories: general purpose IO (GPIO), special IO (SIO) or USB IO (USBIO). GPIO and SIO may provide similar digital functionality, with the primary differences being analog capability, drive strength, input threshold and output signaling voltage. USBIO may be capable of support specific USB functionality and some limited GPIO functionality. All IO pins may be available for use as digital inputs and outputs for both the CPU and digital peripherals. In additional, some or all IO may be capable of generating an interrupt. GPIOs may be used for analog input, capacitive sensing and LCD segment drive. SIOs may be used for voltages in excess of the analog supply voltage.

GPIO may support the following features:
user programmable port reset state,
separate IP supplies and voltages for up to four groups of IO,
digital peripherals using DSI to connect to pins,
input of output or both the CPU and DMA
multiple drive modes,
an interrupt source configured as rising edge, falling edge or both edges; Level-sensitive interrupts may be supported through the DSI,
dedicated port interrupt vector for each port,
slew rate controlled digital output drive mode,
access port control and configuration registers on either port-basis or pin-basis,
separate port-read and -write data registers to avoid read-modify-write errors,
specialized functionality,
LCD segment drive,
capacitive sensing,
analog input and output capability,
continuous clamp current,
standard drive strength.

Figure 37:
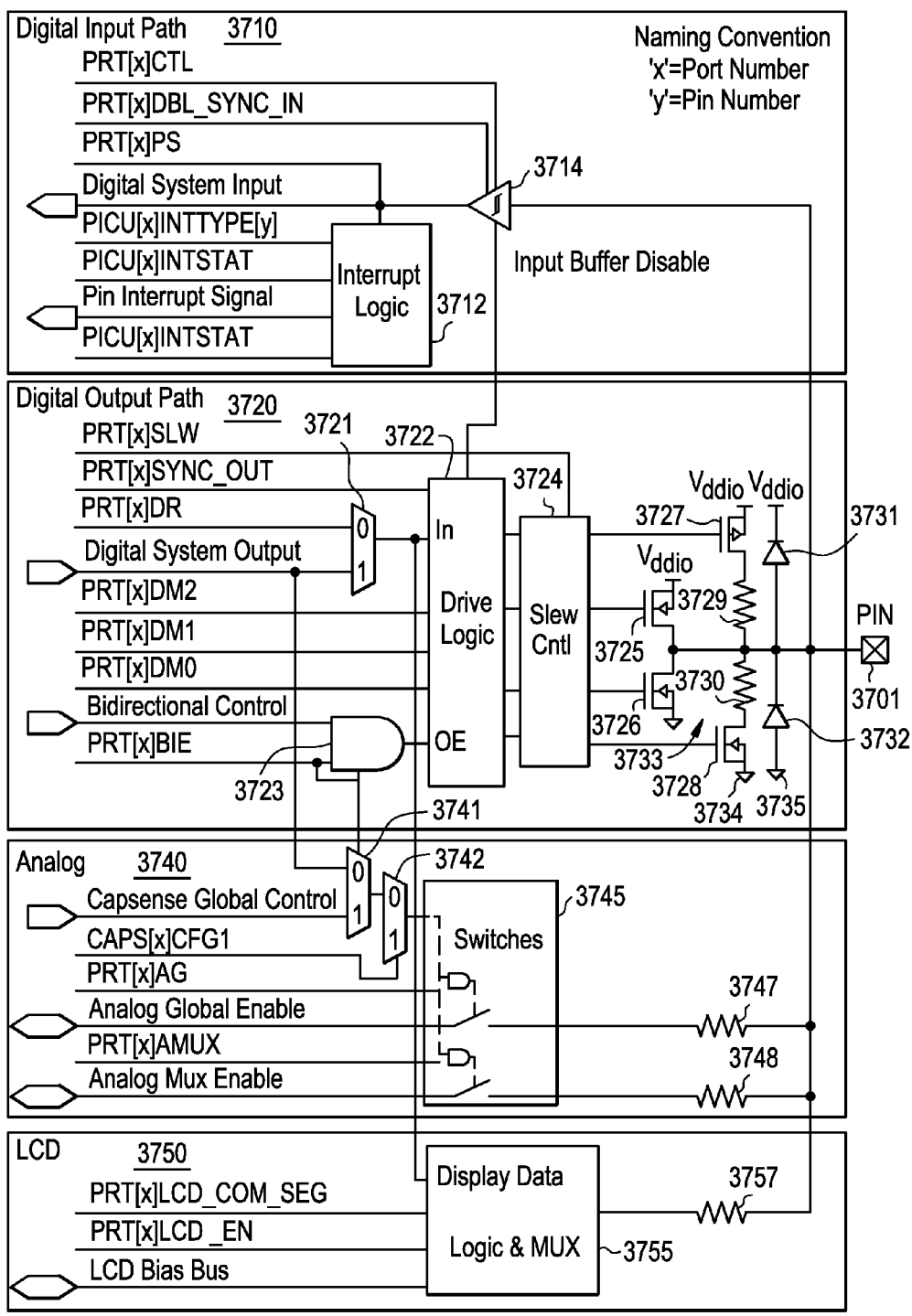
FIG. 37 illustrates a block diagram of a general purpose input/output (GPIO) of core architecture according to an embodiment.

FIG. 37 illustrates a block diagram of a GPIO 3700. GPIO 3700 includes four sections: digital input path 3710, digital output path 3720, analog 3740 and LCD 3750. Digital input path 3710 includes interrupt logic 3712 which has connections to PICU[x]INTTYPE[y], PICU[x]INTSTAT, PRT[x]PS and PICU[x]INTSTAT signals as well as and to the pin interrupt signal, digital system input and Schmitt trigger 3714. PRT[x]CTL and PRT and PRT[x]DBL_SYNC_IN are coupled to Schmitt trigger 3714. Schmitt trigger 3714 couples to pin 3701 and to drive logic 3722 of digital output path 3720. Digital output path 3720 includes signals PRT[x]SLW, PRT[x]SYNC_OUT, PRT[x]DR, PRT[x]BYP, PRT[x]DM2, PRT[x]DM1, PRT[x]DM0 and PRT[x]BIE as well as connections to the Digital System Output and Bidirectional Control. PRT[x]SLW is coupled to Slew Control 3724. PRT[x]SYNC_OUT is coupled to drive logic 3722. PRT[x]DR and the Digital System Output are coupled to inputs of MUX 3721. The output of MUX 3721 is coupled to the input of drive logic 3722 and to the display data input of logic and MUX block 3755 of LCD 3750. PRT[x]BYP is coupled to MUX 3721 as a MUX control signal. The Digital System Output is also coupled to an input of MUX 3741 of analog section 3740. PRT[x]DM2, PRT[x]DM1 and PRT[x]DM0 are coupled to drive logic 3722. Bidirectional Control and PRT[x]BIE are coupled to inputs of AND logic 3723. PRT[x]BIE is coupled to an output of AND logic 3723 and to MUX 3741 as a control signal. The output of AND logic 3723 is coupled to the OE input of drive logic 3722. Slew control 3724 is coupled to drive logic 3722 and PRT[x]SLW as well as to gates of transistors 3725-3728. A first side of transistor 3725 is coupled to an IO voltage, Vio, and a second side of transistor 3725 is coupled to pin 3701 and a first side of transistor 3726. The second side of transistor 3726 is coupled to ground. A first side of transistor 3727 is coupled to an IO voltage, Vio, and a second side of transistor 3727 is coupled to pin 3701 through resistor 3729 and a first side of transistor 3726 through resistors 3729 and 3730. The second side of transistor 3728 is coupled to ground. Pin 3701 is coupled to IO voltage, Vio, through diode 3731 and to ground through diode 3732. Analog section 3740 includes MUX 3741 coupled to the Digital system Output at its input and to an input of MUX 3742 at its output. CapSense Global Control also couples to an input of MUX 3742. CAPS[x]CFG1 is coupled to MUX 3742 as a control signal. Analog Global Enable and Analog Mux Enable are coupled to pin 3701 through switches 3745 and resistors 3747 and 3748, respectively. Switches 3745 are controlled by the output of MUX 3742 ANDed with either PRT[x]AG or PRT[x]AMUX for the Analog Global Enable and Analog Mux Enable, respectively. LCD section 3750 includes logic and MUX block 3755 with connections to the output of MUX 3621, PRT[x]LCD_COM_SEG, PRT[x]LCD_EN and five LCD Bias Bus lines. Logic and MUX block 3755 is coupled to pin 3701 through resistor 3757.

SIO may support the following features:
user programmable port reset state,
separate IP supplies and voltages for up to four groups of IO,
digital peripherals using DSI to connect to pins,
input of output or both the CPU and DMA,
multiple drive modes,
an interrupt source configured as rising edge, falling edge or both edges;
level-sensitive interrupts may be supported through the DSI,
dedicated port interrupt vector for each port,
slew rate controlled digital output drive mode,
access port control and configuration registers on either port-basis or pin-basis,
separate port-read and -write data registers to avoid read-modify-write errors,
specialized functionality,
high drive strength,
hot swap (input voltage tolerance at any operating voltage),
programmable and regulated high input and output drive,
higher over voltage tolerance,
general purpose comparator.

Figure 38:
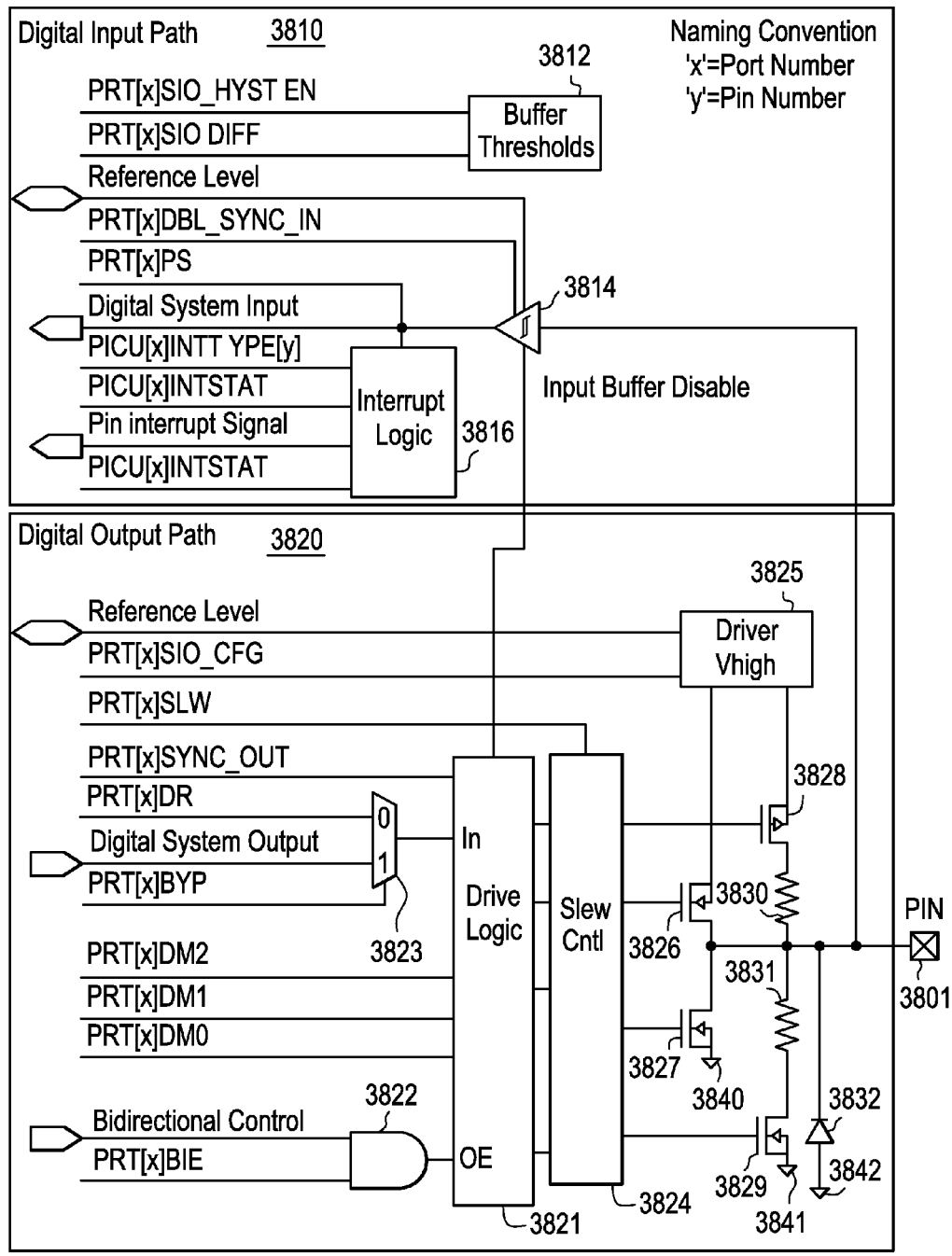
FIG. 38 illustrates a block diagram of a specialized input/output (SIO) of a core architecture according to an embodiment.

FIG. 38 illustrates a block diagram of SIO 3800. SIO 3800 includes digital input path 3810 and digital output path 3820. Digital output path 3810 includes buffer thresholds block 3812, Schmitt trigger 3814 and interrupt logic block 3816. Buffer thresholds block 3812 is coupled to PRT[x]SIO_HYST_EN, PRT[x]SIO_OFF and Reference Level signals. The output of buffer thresholds block 3814 and the PRT[x]DBL_SYNC_IN signal are coupled to Schmitt trigger 3814. PICU[x]INTTYPE[y], PICU[x]INTSTAT and Pin Interrupt signals are coupled to interrupt logic block 3816. Interrupt logic block 3816 is also coupled to Schmitt trigger 3814. PRT[x]PS and the Digital System Input is coupled to interrupt logic block 3816 and Schmitt trigger 3814. Schmitt trigger 3814 is coupled to pin 3801. Digital output path 3820 includes drive logic block 3821, AND logic 3822, MUX 3823, slew control block 3824 and high-voltage driver 3825. Reference Level and PRT[x]SIO_CFG are coupled to inputs of high-voltage driver 3825. PRT[x]SLW is coupled to slew control block 3824. PRT[x]DR and the Digital System Output are coupled to drive logic block 3821 through MUX 3823 which is controlled by the PRT[x]BYP signal. PRT[x]DM2, PRT[x]DM1 and PRT[x]DM0 are coupled to drive logic block 3821. Bidirectional Control and PRT[x]BIE are coupled to drive logic block 3821 through AND logic 3822. Drive logic block 3821 is coupled to slew control block 3821. Slew control block is coupled to gates of transistors 3826-3829. A first side of transistor 3825 is coupled to an output of high-voltage driver 3825 and a second side of transistor 3826 is coupled to pin 3801 and a first side of transistor 3827. The second side of transistor 3827 is coupled to ground. A first side of transistor 3828 is coupled to an output of high-voltage driver 3825 and a second side of transistor 3828 is coupled to pin 3801 through resistor 3830 and a first side of transistor 3829 through resistors 3830 and 3831. The second side of transistor 3829 is coupled to ground. Pin 3801 is coupled to ground through diode 3832.

USBIO may support the following features:
Low-, full-, high or super-speed USB 2.0 compliance,
high drive strength,
input, output or both for CPU and DMA,
input output or both for digital peripherals,
digital output drive mode,
pin configuration as rising edge, falling edge, or both edges.

Figure 39:
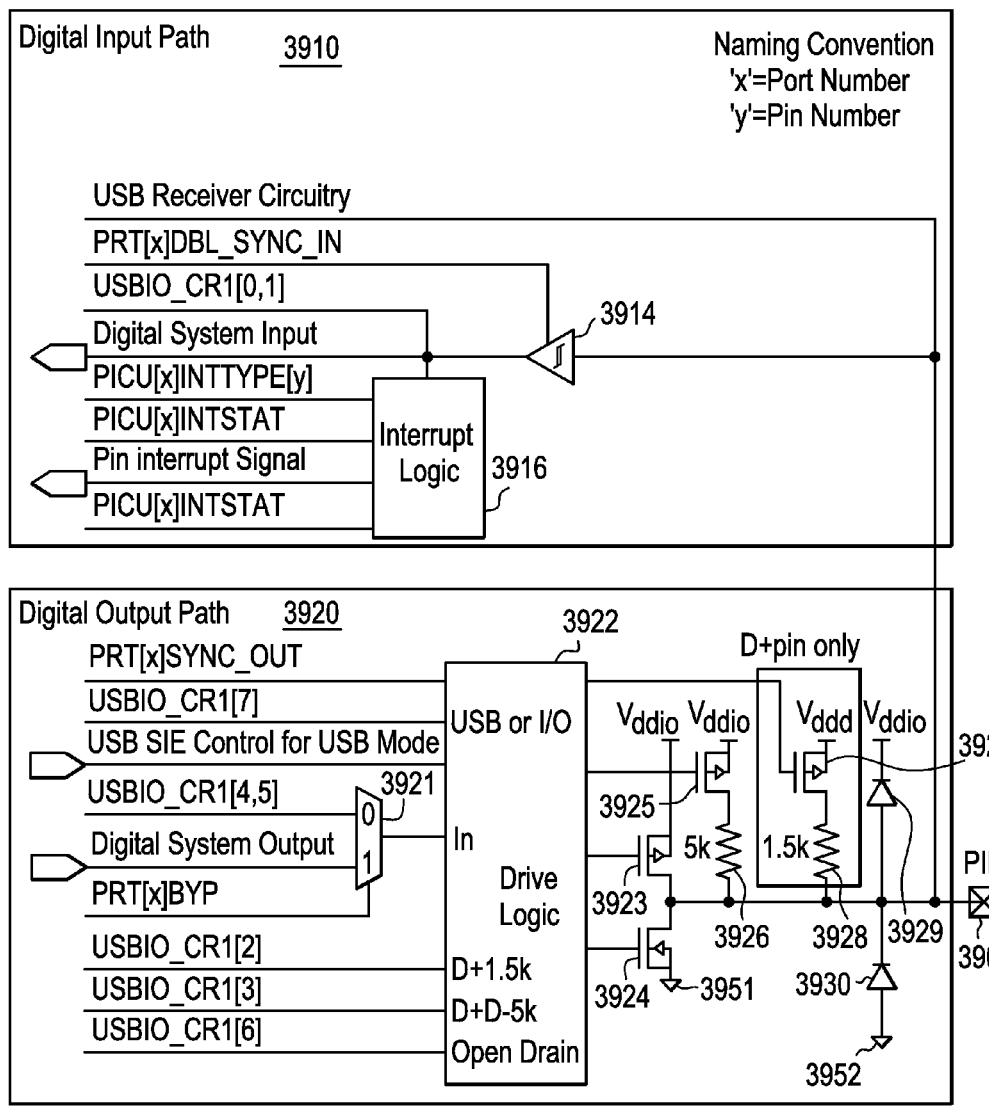
FIG. 39 illustrates a block diagram of a USB input/output (USBIO) of a core architecture according to an embodiment.

FIG. 39 illustrates a block diagram of USBO 3900. USBIO 3900 includes digital input path 3910 and digital output path 3920. Digital input path includes Schmitt trigger 2914 and interrupt logic block 3916. USB receiver circuitry is coupled to pin 3901. Schmitt trigger 3914 is controlled by the PRT[x] DBL_SYNC_IN signal. Schmitt trigger 3914 has an input coupled to pin 3901. The output of Schmitt trigger 3914 is coupled to the USBIO_CR1[0,1[ signal, the Digital System Input and interrupt logic block 3916. Interrupt logic block 3916 is also coupled to PICU[x]INTTYPE[y], PICU[x]IN-STAT and Pin Interrupt signals. Digital output path 3920 includes MUX 3921 and drive logic 3922. The USBIO_CR1[4,5] signal and Digital System Output are coupled to drive logic 3922 through MUX 3921, which is controlled by the PRT[x]BYP signal. PRT[x]SYNCH_OUT, USBIO_CR1[7], USBIO_CR1[2], USBIO_CR[3] and USBIO_CR[6] are coupled to drive logic block 3922. USB SIE control for USB mode is also coupled to drive logic block 3922. Drive logic block 3922 is coupled to gates of transistors 3923, 3924, 3925 and 3927. A first side of transistor 3923 is coupled to an IO voltage, Vio. The second side of transistor 3923 is coupled to pin 3901 and to a first side of transistor 3924. A second side of transistor 3924 is coupled to ground. A first side of transistor 3925 is coupled to an IO voltage, Vio. A second side of transistor 3925 is coupled to pin 3901 through resister 3926. Pin 3901 is coupled to an IO voltage, Vio, and ground through diodes 3929 and 3930, respectively. On the D+ pin of USB devices, transistor 3927 is coupled between an IO voltage, Vio and the pin through resistor 3928.

Each GPIO and SIO may be individually configurable into one of a number of drive modes. These drive modes may include: high-impedance analog, high-impedance digital, resistive pull up, resistive pull down, open drain drives low, open drain drives high, strong drive, and resistive pull up and down. Pin drive modes may be selected by configuring the pin drive mode register. FIGS. 40A-40H illustrates simplified pin views based on the drive mode settings.

Figure 40A:
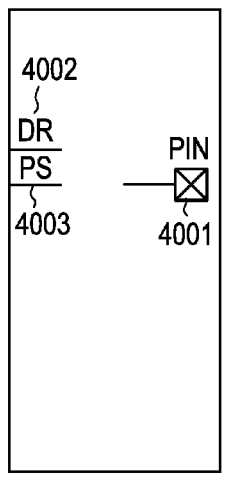
FIG. 40A illustrates a pin configured as high-impedance analog according to an embodiment.

FIG. 40A illustrates a pin configured as high-impedance analog. Pin 4001 is not coupled to DR 4002 or PS 4003. In this mode, the output driver and the digital input buffer are turned off, which prevents any current from flowing in the IOs digital input buffer due to a floating voltage.

Figure 40B:
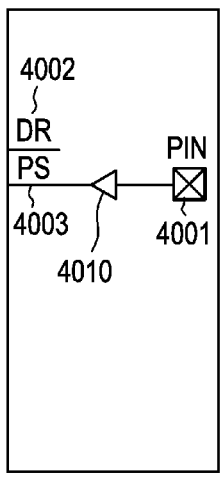
FIG. 40B illustrates a pin configured as high-impedance digital according to an embodiment.

FIG. 40B illustrates a pin 4001 configured as high-impedance digital. Input buffer 4010 is enabled between pin 4001 and PS 4002. DR 4002 is still unconnected.

Figure 40C:
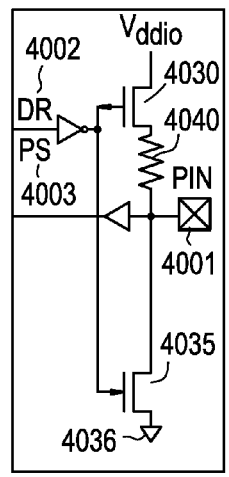
FIG. 40C illustrates a pin configured resistive pull up according to an embodiment.

FIG. 40C illustrates a pin 4001 configured as resistive pull up. Resistor 4040 provides series resistance to Vio through transistor 4030, while transistor 4035 provides strong drive to ground.

Figure 40D:
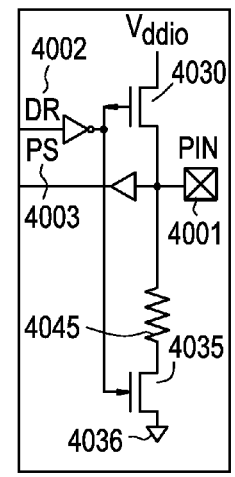
FIG. 40D illustrates a pin configured as resistive pull down according to an embodiment.

FIG. 40D illustrates a pin 4001 configured as resistive pull down. Resistor 4045 provides series resistance to ground through transistor 4035, while transistor 4030 provides strong drive to Vio.

Figure 40E:
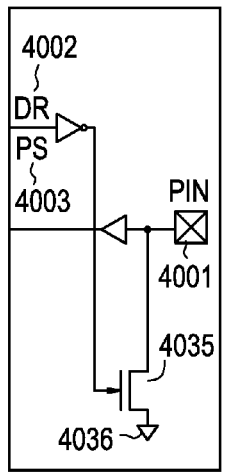
FIG. 40E illustrates a pin configured as open drain drive low according to an embodiment.

FIG. 40E illustrates a pin 4001 configured as open drain drives low. Transistor 4035 provides strong drive to ground, while the lack of a connection to Vio provides high impedance to Vio.

Figure 40F:
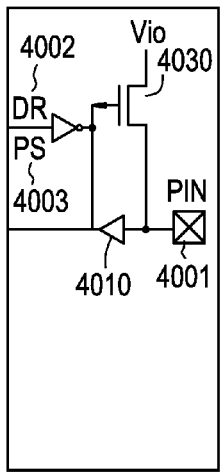
FIG. 40F illustrates a pin configured as open drain drive high according to an embodiment.

FIG. 40F illustrates a pin 4001 configured as open drain drives high. Transistor 4030 provides strong drive to Vio, while the lack of a connection to ground provides high impedance to ground.

Figure 40G:
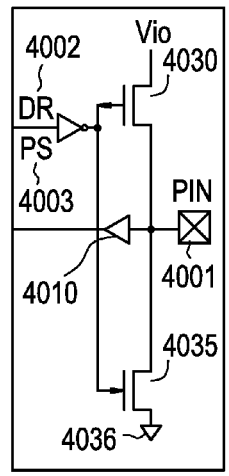
FIG. 40G illustrates a pin configured as strong drive according to an embodiment.

FIG. 40G illustrates a pin 4001 configured as strong drive. Transistor 4030 provides strong drive to Vio and transistor 4035 provides strong drive to ground. This configuration provides strong CMOS output drive in either high or low state. This configuration may not be used for input pins under normal circumstances.

Figure 40H:
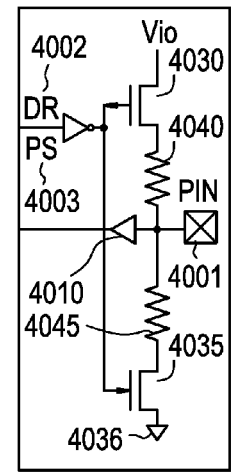
FIG. 40H illustrates a pin configured as resistive pull up and down according to an embodiment.

FIG. 40H illustrates a pin 4001 configured as resistive pull up and down. Resistor 4040 provides series resistance to Vio through transistor 4030, while resistor 4045 provides series resistance to ground through transistor 4035. This state is similar to the resistive pull up and resistive pull down states, except that the pin is always in series with a resistor. The high data state is pull up, while the low data state is pull down.

Pins may be configured through register settings. Registers may also interact with pins. IO registers may be available by port, where each bit of the register corresponds to one port pin. This register form is efficient for quickly reconfiguring multiple port pins simultaneously. IP registers may be available by pin, which combines the eight most commonly used port register bits into a single register for each pin. This enables fast configuration changes to individual pins with a single register write.

Pins may be high-speed bidirectional capable to provide high impedance digital drive mode for input signals and a second user selected drive mode such as strong drive for output signals on the same pin, based on the state of an auxiliary control bus signal. The bidirectional capability may be useful for processor busses and communications interfaces such as a SPI slave MISO pin that requires dynamic hardware control of the output buffer. The auxiliary control bus may route a number of UDB or digital peripherals generated output enable signals to one or more pins.

GPIO and SIO pins may have fast and slow output slew rate options for strong and open drain drive modes, not resistive drive modes. The slow edge rate option may be used for signals that are not speed critical and provides a signal with reduced EMI. Slew rate may be individually configurable for each pin.

GPIO and SIO pins may be capable of generating interrupt to the system. Pins in each port interface to their own port interrupt control unit (PICU) and associated interrupt event. Each pin of a port may be independently configurable to detect rising edge, falling edge, both edge interrupts or to not generate and interrupt at all. Each time an interrupt event occurs on a pin, its corresponding status bit of an interrupt status register may be set to "1" and an interrupt request sent to the interrupt controller, depending on the configured mode for the pin. Each PICU may have its own interrupt vector in the interrupt controller and the pin status register providing determination of the interrupt source down to the pin level. Port pin interrupts may remain active in all sleep modes, allowing the system to wake from an externally generated interrupt. UDBs may provide level-sensitive interrupt capability to the system when required.

GPIO and SIO input buffers may be configurable at the port level for the default CMOS input thresholds or optional LVTTL input thresholds. Input buffers may incorporate Schmitt triggers for input hysteresis or input buffers may be disabled for each drive mode.

Analog connections to GPIO pins may configure GPIO as analog inputs, analog outputs or both. Each GPIO ma connect t one of the analog global busses or to some of the analog MUX busses to connect any pin to any internal analog resource such as an ADC or comparators. Some or all pins may provide direct connections to specific analog features such as the high current DACs or uncommitted opamps. Additionally, all GPIO may be used to create capacitive sensing (CapSense™) channels.

GPIO may be used to generate segment and common drive signals for direct glass drive of LCD glass.

SIO pins may provide regulated high output levels for interface to external signals that are lower in voltage than the SIO's respective Vddio. SIO pins may be individually configurable to output either the standard Vddio or the regulated output, which is based on an internally generated reference. A voltage DAC (VDAC) may be used to generate an internally regulated reference.

SIO pins may support standard CMOS and LVTTL input levels as well as differential mode with programmable levels. SIO pins may be grouped into pairs, each pair sharing a reference generator block which ma be used to set the digital input buffer reference level for interface to external signals that differ in voltage from Vddio. The reference may set pins' voltage threshold for a high logic level. In some embodiments, available input thresholds may be 0.5×Vddio, 0.4× Vddio and 0.3×Vddio. A VDAC may generate the reference voltage.

The adjustable input level of SIOs may be used to construct a comparator. Thresholds for the comparator constructed from the adjustable input level of an SIO may be provided by the SIOs reference generator. The reference generator may have the option to set the analog signal routed through the analog global line as the threshold for the comparator. Hysteresis may be enabled for the input buffer to increase the immunity of the comparator.

"Hot Swap" capability may be supported by SIO pins to enable them to plug into applications without loading the signals that are connected to the SIO pins even when no power is applied to the system. This allows the system to maintain a high impedance load to an external drive device while also preventing the system from being powered through a GPIO pin's protection diode when the system is unpowered.

IO pins may provide over voltage tolerance at any operating Vdd. This may allow a connection to a bus such as I2C where different devices are running from different supply voltages. The system may be configured to be open drain, drives low mode for an SIO pin. This allows an external pull up to pull the I2C bus voltage above the system pin supply.

IOs may be default reset to high impedance analog drive mode and may be reprogrammable on a port-by-port or pin-by-pin basis. IOs may be reset as high impedance analog, pull down or pull up based on the application requirements. Port reset configuration data may be stored in special nonvolatile registers to ensure correct operation. The stored reset data may be automatically transferred to the port reset configuration registers at PPOR release IO pins may retain their state in low power mode until the system is awakened and changed or reset. The system may be awaked through an interrupt due to the pins ability to run normally at low power modes.

Pins may have additional functionality beyond that of GPIO, SIO and USBIO pins. Additional digital functionality may include:
  Support for a 4-33 MHz crystal oscillator,
  Support for a 32.768 kHz crystal oscillator,
  Wake from sleep on I2C address match,
  JTAG interface,
  SWD interface,
  SWV interface,
  External reset (XRES).

Additional analog functionality may include:
  Opamp inputs and outputs,
  High current DAC (IDAC) outputs,
  External reference inputs.

CPU Subsystem

Core architecture 100 (FIG. 1) may include a CPU subsystem (140, FIG. 1). The CPU subsystem is the system controller. It controls digital, analog, mixed-signal and communication functions of the system by writing to registers, generating interrupts, configuring interconnects and executing device programs stored in memory. In one embodiment, the CPU subsystem have the following features:
  a single-cycle 8051 CPU,
  flash memory, EEPROM and SRAM (discussed in the Memory Subsystem section),
  a direct memory access (DMA) controller,
  a peripheral HUB (PHUB), and
  an external memory interface (EMIF, discussed in the Memory Subsystem section).

The CPU subsystem may support a plurality of addressing modes including: direct addressing, indirect addressing, register addressing, register specific instructions, immediate constants, indexed addressing and bit addressing. For direct addressing, the operand may be specified by a direct address field and only internal RAM and SFRs may be accessed. For indirect addressing, the instruction may specify the register which contains the address of the operand. Two registers may then be used to specify the address while the data pointer register (DPTR) may be used to specify a new address. For register addressing, certain instructions may access one of a plurality of registers in a specified register bank. In these applications, these instructions may be more efficient due to the lack of an address field requirement. For register specific instructions, some instructions may be specific to certain registers. For immediate constants, some instructions may carry the value of the constants directly instead of an address. For indeed addressing, the DPTR may be used as the base and an accumulator as an offset to read a program memory. For bit addressing, the operand may be one of a number of bits. In one embodiment, the number of bits for bit addressing may be 256. In another embodiment the number of bits may be more or less than 256.

The CPU subsystem may be optimized for bit handling and Boolean operations. The types of instructions supported may including: arithmetic instructions, logical instructions, data transfer instructions, Boolean instructions, and program branching instructions. Arithmetic instructions may support the direct, indirect, register, immediate constant and register specific instructions. Arithmetic modes may be used for addition, subtraction, multiplication, division, increment and decrement operations. Logical instructions may perform Boolean operations such as AND, OR, XOR on bytes, rotate of accumulator content and sap of nibbles in an accumulator. The Boolean operations on the bytes may be performed on a bit-by-bit basis. Data transfer instructions may be one of plurality of types including core RAM, xdata RAM and lookup tables (LUTs). Core RAM transfer functions may include transfer between any two core RAM locations or SFRs and may use direct, indirect, register and immediate addressing. Xdata RAM transfer functions may include only the transfer between the accumulator and the xdata RAM location and my only use indirect addressing. The LUT transfer function may involve nothing by the read of program memory using indexed addressing mode. Boolean instructions may include a plurality of bit operations such as move, set clear, toggle, OR and AND instructions and the conditional jump instructions. Program branching instructions may include conditional and unconditional jump instructions to help modify the program execution flow.

Figure 41:
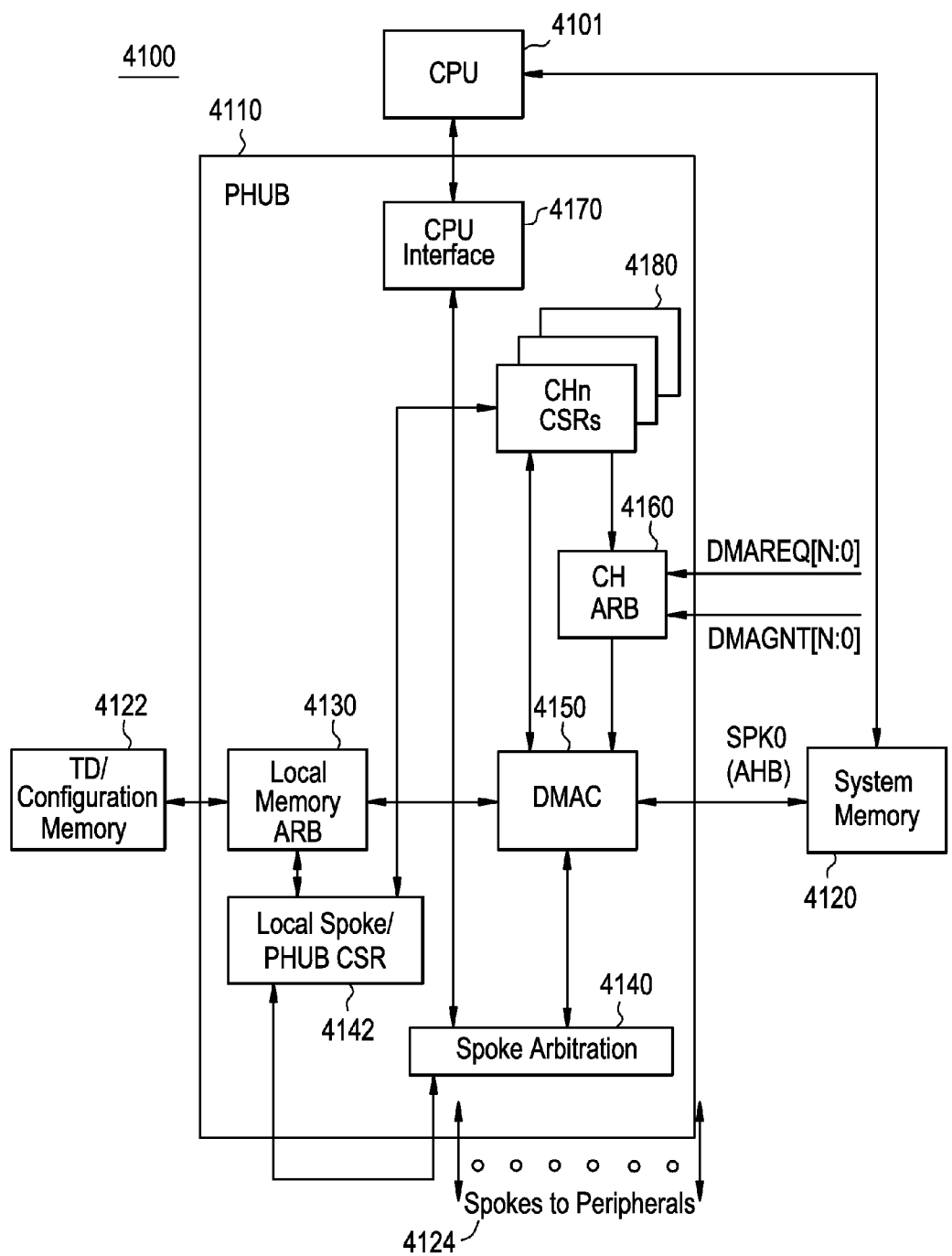
FIG. 41 illustrates a block diagram of a peripheral HUB (PHUB) according to an embodiment.

FIG. 41 illustrates a block diagram 4100 of a peripheral HUB (PHUB) 4110 (143, FIG. 1). The PHUB provides connections to the system for the CPU (141, FIG. 1) and the DMA controller (144, FIG. 1) for configuration of system and subsystem elements, routing of signals throughout the system (from analog to digital subsystems, vice versa and to GPIO). PHUB 4110 is coupled to a TD/Configuration block 4122, system memory 4120, CPU 4101 and a plurality of spokes to peripherals 4124. PHUB 4110 includes a CPU interface block 4170 coupled to CPU 4101 and a spoke arbitration block 4140 coupled to the plurality of spokes to peripherals 4124, DMA controller (DMAC) block 4150 and a local spoke/PHUB CSR block 4142 through an PHUB-external connection. Local spoke/PHUB CSR block 4142 is also coupled to CHn CSR blocks 4180 and local memory ARB block 4130, which is coupled to TD/configuration memory block 4122 and DMAC block 4150. DMAC block 4150 is coupled to spike arbitration block 4140, local memory ARB block 4130, CHn CSR blocks 4180, CH ARB block 4160 and system memory 4120. CHn CSRs blocks 4180 are coupled to CH ARB block 4160.

The PHUB may be a programmable and configurable central hub within the core architecture that ties the various on-chip system elements together using standard AMBA AHB. The PHUb may use a multilayer AHB architecture to allow for simultaneous AMBA-Lite style mastering. The PHUB may be configured in a number of ways by writing to PHUB configuration registers to suit the needs of particular core architecture in an application. The PHUB may contain a direct memory access controller (DMAC, 144, FIG. 1) may can be programmed to transfer data between system elements without burdening the CPU. The PHUB may contain logic that performs arbitration between DMAC and the CPU for access to the PHUB's peripheral spokes.

CPU subsystem may include an interrupt controller (142, FIG. 1) to implement interrupt priorities and associated interrupt address vectors (IAVs). The interrupt controller may provide a mechanism for any hardware resource to change program execution to a new address, independent of the current task being executed by the CPU. Interrupts may have programmable priority, which may be level-based. In one embodiment, there may be 8 levels assignable to any interrupt, wherein level 0 is the highest priority and level 8 is the lowest. In other embodiments there may be more or less than eight levels. Interrupts may be maskable. In one embodiment, if two interrupts have the same priority level, the interrupt with a smaller index value will be the winner. An example of this would be if two interrupts (int_in[5] and int_in[6]) each have a priority level of 3, the smaller-indexed interrupt (int_in [5]) will be the serviced interrupt.

Programming and Debug Subsystem

The core architecture may include extensive support for programming, testing, debugging and tracing hardware and firmware. The programming and debug subsystem main include a variety of interfaces including JTAG, serial wire debug (SWD), and serial wire viewer (SWV). In one embodiment, JTAG and SWD may support all available programming and debug features of the device, while SWV may support and subset of available features. JTAG may also support standard JTAG scan chains for board-level test and chaining multiple JTAG devices to a single JTAG connection. Debug on chip may support full device debugging in the final system using the standard production device and may not require special interfaces, debugging pods, simulators or emulators. A software development and programming environment such as the PSOC Creator IDE offered by Cypress Semiconductor Corporation (San Jose, Calif.) may be used to provide integrated programming and debug support.

The JTAG interface may be used for programming the flash memory, debugging, IO scan chains and JTAG device chaining. The SWD interface may provide an alternative to the JTAG interface. The SWD interface may require only two pins rather than the four or five needed for JTAG. SWD may provide all the programming and debugging features of JTAG at the same speed.

JTAG and SWD interfaces may be used to support the following debug features:
  halt and single-step the CPU,
  view and change CPU and peripheral registers and RAM addresses,
  multiple program address breakpoints,
  memory access breakpoints (break on reading or writing any memory address and data value),
  break on a sequence of breakpoints,
  debugging at full CPU speed,
  debug operations while device is in reset or in low-power modes.

JTAG and SWD interfaces may be used to support the following trace features:
  trace of program counter (PC), accumulator register (ACC) and one SFR/core RAM register,
  trace depth up to 1000 instructions if all registers are traced or 2000 instructions if only the PC is traced,
  program address trigger to start tracing
  trace windowing (only trace when PC is within a given range)
  multiple modes for handing trace buffer full, continuous (overwriting the oldest trace data) or break when trace buffer is full.

The SWV interface may be closely associated with the SWD interface but may also be used independently. SWV may be used for application debug when it is helpful for the firmware to output data similar to 'printf' debugging on personal computers. The SWV interface may be used for data monitoring and can be implemented using only one pin. The SWV interface may output data in standard UART format or Manchester encoded format.

In one embodiment, debugging for the core architecture may be completed when the device is in power-down mode or in other low-power modes. In this embodiment, some logic remains on at all times (functional or debug) which includes the debug interface and a small portion of the Power Manage (PM Always-On) which monitors the power down status and has the ability to wake-up the chip. The debug interface allows a debugging software interface to communicate to the logic that is always on and issue commands to read the device's power mode status, wake-up the device or reset the device. In another embodiment, a Watchdog reset blocker may be used rather than forcing a reset. In such cases the designer has the option to halt the CPU first in any power mode.

Figure 42:
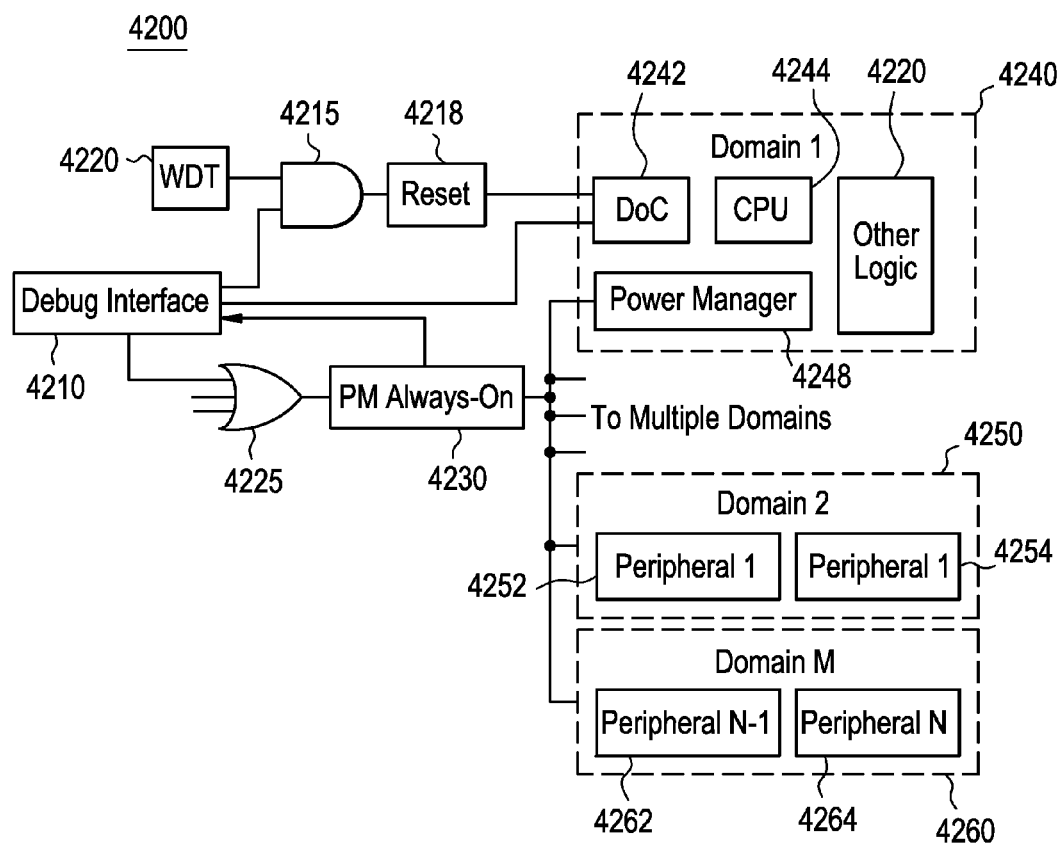
FIG. 42 illustrates one embodiment of low-power and power-down debugging according to an embodiment.

FIG. 42 illustrates one embodiment of a debug subsystem 4200. Debug interface 4210 is coupled to an input of AND logic block 4215. Watchdog Timer (WDT) 4220 is also coupled to an input of AND logic block 4215. The output of AND logic block 4215 may be a reset signal 4218 for the device. This allows the debug system to stop a reset event from the WDT until after debugging is complete. Debug interface 4210 is coupled to an input of OR logic block 4225 along with the device signals. The output of OR logic block 4225 is coupled to power manager (PM) always-on block 4230. PW always-on block is coupled back to debug interface 4210 and to the debug-on-chip (DOC) block 4242. Debug subsystem 4200 may also include at least one domain. Domain 1 4240 includes the DOC block 4242, the CPU 4244, a power manager 4246 as well as other logic elements 4248. The power manager may be used to power specific parts of the device for the purposes of debugging those parts without powering up the entire device. Debug subsystem 4200 may include more domains 4250 and 4260. Each domain may have multiple peripherals, 4252, 4254, 4262 and 4264 included therein. While two domains beyond domain 1 4240 are shown, it would be obvious to one of ordinary skill in the art to have more of less than two domains or even no additional domains. Furthermore, while two peripherals per domain are shown, it would be obvious to one of ordinary skill in the art to have more or less than two peripherals in a single domain.

While debugging the device in normal mode, the selected debug interface connects to a set of pins and the core logic. One of these pins serves as a clock while the additional pins are used for data input, data output and control signals. An external device connects to these pins, requiring only signal generation capabilities, is used to send read or write commands to the selected debug interface. In most cases these commands are then passed on to the Debug On-Chip (DoC), which is used to override the CPU and gain access to the rest of the device. In some cases the command stops at the debug interface when accessing its local registers. The debug interface contains the local register required to interact with the Power Manager (PM). These bit fields may include:

RESET—Used to reset the chip to a known state,
WAKE_UP—Used to wake up the all domains from a low power mode,
CPU_CLK_IND—CPU clock indication, indicates if the CPU clock is running,
PM_STATUS [N:0]—Power Manager status, indicates which power domains are on or off.

These register listed above can be accessed in any low power mode, even when the CPU is powered down. When the CPU is powered up so is the DoC. In this mode, breakpoints and trace may be utilized and internal CPU registers, such as the PC and the accumulator, may be accessed. An example of other logic that could exist in other domains is a USB block, an I2C block, programmable digital blocks, and programmable analog blocks. This capability allows a firmware designer to debug power saving implementations of the device in-system and to monitor the power saving implementations.

In another embodiment, more and different chip status bits or options may be added to the debug interface, which is always on relaying more or different information when all of the core logic is asleep.

The ability to debug in low-power modes and even in power-down mode provides the ability to observe which power domains are turned off and measure current consumption in the multiple low powers modes when debugging, and use the collected data as measurement for how the part will perform in these low power modes when in functional mode. Additionally, it may be possible to wake-up or reset the part from the debug interface when the part is in a low power mode prior methods require the part to be power cycled or the use of an external reset pin.

FIG. 43 illustrates one embodiment for a method 4300 of debugging a system. A debug through power mode or reset event command is received in block 4305. A break point is then enabled in block 4310. The break point may be enabled on the desired power mode or on a reset event. The event is masked by the enable break point of block 4310. The break point is monitored and its triggered status detected in decision block 4315. If the break point is not triggered, decision block 4315 is repeated. If the break point is determined to be triggered by decision block 4315, the device's debug readiness is monitored in decision block 4325. If the device is determined to be ready to enter a debug mode in decision block 4325, a standard debug is enabled in block 4330. If the device is determined not to be ready to enter a debug mode in decision block 4325, a non-standard debug mode is enabled in block 4340. A non-standard debug mode may query the device's power mode and wake up the device if an appropriate power mode is not running. The non-standard debug mode may then wake up the device and halt the CPU to suspend device operation during debugging. The non-standard debug mode may then ready a debug-on-chip section to execute the debug. After a non-standard debug is enabled in block 4340, the debug event is monitored in decision block 4345. If a debug event is not completed in decision block 4345, the debug event continues to be monitored. If the debug event is completed, the device is then monitored to suppress an event in decision block 4355. If an event is to be suppressed in decision block 4355, the event is cleared in block 4360. If the event is not to be suppressed in decision block 4355, the mask from block 4310 is removed and the normal result from the event is executed in block 4370. The device is then monitored to determine if the break point may be removed on execution or clearing of the event in decision block 4375. If the break point is determined not to be removed in decision block 4375, the break point is monitored again in decision block 4315. If the break point is to be removed in decision block 4375, debugging is ended in block 4385.

In some embodiments, the reset that triggers the debug operation in block 4305 may be passed to the device through the debug interface after completion of the debug event. This allows the device to be debugged in its current state and then be reset after debug is completed. The reset may cause the device to enter a different power mode or to execute commands that may mask the state of the device before the reset event was triggered and debug mode was enabled.

Although the present invention has been described with reference to specific example embodiments, it will be evident that various modifications and changes may be made to these embodiments without departing from the broader spirit and scope of the invention as set forth in the claims. Accordingly, the specification and drawings are to be regarded in an illustrative rather than a restrictive sense.

In the foregoing specification, the invention has been described with reference to specific example embodiments thereof. The specification and drawings are, accordingly, to be regarded in an illustrative sense rather than a restrictive sense.

What is claimed is:
1. A programmable device comprising:
a CPU;
a DMA (Direct Memory Access) controller;
a memory;
a processor bus,
a plurality of programmable function blocks;
a configurable routing system; and
programmable control logic configured to control the programmable function blocks and the configurable routing system,
wherein the DMA controller is configured to transfer configuration information from the memory to the configuration control logic over the processor bus, and wherein the transferred configuration information controls a change in the configuration of the device from a first configuration to a second configuration without CPU intervention.

2. The programmable device of claim 1, wherein at least one of the programmable function blocks comprises a programmable analog block.

3. The programmable device of claim 1, wherein at least one of the programmable function blocks comprises a programmable digital block.

4. The programmable device of claim 1, wherein one or more programmable blocks are configurable to perform at least two functions from a group consisting of: a comparator, an operational amplifier, a unity gain buffer, a programmable gain amplifier, a transimpedance amplifier, a mixer, a delta-sigma modulator, a sample-and-hold, an LCD controller, a digital-to-analog converter and an analog-to-digital converter.

5. The programmable device of claim 1, wherein one or more programmable blocks are configurable to perform at least two functions from a group consisting of: a timer, a quadrature decoder, a sequencer, a pulse-width modulator, a UART, an SPI interface, and I2C interface, and a pseudo-random sequence generator.

6. The programmable device of claim 1 wherein the CPU is configured to be in operable communication with the programmable function blocks.

7. The programmable device of claim 1 wherein the programmable control logic comprises a plurality of configuration registers.

8. The programmable device of claim 1 wherein the configurable routing system is programmable to couple the at least one of the programmable blocks to at least one other programmable block.

9. The programmable device of claim 1 wherein the configurable routing system is configured to couple the at least one of the programmable blocks to at least one IO pin of the programmable device.

10. The programmable device of claim 1 wherein one or more of the programmable blocks is configurable to control at least part of the configurable routing system.

11. A method of configuring a programmable device comprising:
operating a CPU in accordance with at least one of a plurality of instructions from a memory coupled to the CPU by a processor bus;
configuring a DMA (Direct Memory Access) controller to transfer configuration information over the processor bus from the memory to configuration control logic; and
controlling the function of a plurality of programmable blocks and a configurable routing system in accordance with the state of configuration control logic,
wherein the transfer of configuration information by the DMA controller takes place without CPU intervention.

12. The method of claim 11, wherein the configuration information comprises information controlling at least one analog function of the programmable blocks.

13. The method of claim 11, wherein the configuration information comprises information controlling at least one digital function of the programmable blocks.

14. The method of claim 11, wherein the controlling of the function of the plurality of programmable blocks comprises selecting one of at least two functions from a group consisting of: a comparator, an operational amplifier, a unity gain buffer, a programmable gain amplifier, a transimpedance amplifier, a mixer, a delta-sigma modulator, a sample-and-hold, and an analog to digital converter.

15. The method of claim 11, wherein the controlling of the function of the plurality of programmable blocks comprises selecting one of at least two functions from a group consisting of a timer, a quadrature decoder, a sequencer, a pulse-width modulator, a UART, an SPI interface, and I2C interface, and a pseudo-random sequence generator.

16. The method of claim 11 further comprising communicating between the CPU and one or more of the programmable blocks.

17. The method of claim 11 wherein the transferring configuration information to the configuration control logic comprises transferring configuration information to a plurality of configuration registers.

18. The method of claim 11 further comprising configuring the routing system to couple the at least one of the programmable blocks to at least one other programmable block.

19. The method of claim 11 further comprising configuring the routing system to couple the at least one of the programmable blocks to at least one IO pin of the programmable device.

20. The method of claim 11 further comprising configuring one or more of the programmable blocks to control at least one function of the configurable routing system.

* * * * *